(12) United States Patent
Mitsui et al.

(10) Patent No.: US 8,847,208 B2
(45) Date of Patent: Sep. 30, 2014

(54) PHOTOELECTRIC CONVERSION DEVICE AND IMAGING DEVICE HAVING DECREASED DARK CURRENT

(75) Inventors: Tetsuro Mitsui, Kanagawa (JP); Kimiatsu Nomura, Kanagawa (JP); Katsuyuki Yofu, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 315 days.

(21) Appl. No.: 12/793,195

(22) Filed: Jun. 3, 2010

(65) Prior Publication Data

US 2010/0308311 A1 Dec. 9, 2010

(30) Foreign Application Priority Data

Jun. 3, 2009 (JP) ................. 2009-134017
Jan. 28, 2010 (JP) ................. 2010-017477
Jun. 3, 2010 (JP) ................. 2010-127391

(51) Int. Cl.
*H01L 51/46* (2006.01)
*H01L 51/00* (2006.01)
*B82Y 10/00* (2011.01)
*H01L 51/42* (2006.01)

(52) U.S. Cl.
CPC ......... *H01L 51/0072* (2013.01); *H01L 51/0058* (2013.01); *H01L 51/0046* (2013.01); *H01L 51/4253* (2013.01); *Y02E 10/549* (2013.01); *H01L 51/0059* (2013.01); *H01L 51/4246* (2013.01); *B82Y 10/00* (2013.01)
USPC ............... 257/40; 257/E51.041; 257/E51.039

(58) Field of Classification Search
None
See application file for complete search history.

(56) References Cited

U.S. PATENT DOCUMENTS

| | | | |
|---|---|---|---|
| 6,649,772 B2 | 11/2003 | Lin et al. | |
| 7,863,605 B2 | 1/2011 | Hayashi | |
| 8,288,939 B2 | 10/2012 | Hayashi | |
| 2005/0221124 A1 | 10/2005 | Hwang et al. | |
| 2007/0063156 A1 | 3/2007 | Hayashi | |
| 2007/0085051 A1 | 4/2007 | Sohn et al. | |
| 2008/0035965 A1 | 2/2008 | Hayashi et al. | |
| 2008/0220285 A1 | 9/2008 | Vestweber et al. | |
| 2009/0050881 A1* | 2/2009 | Hayashi | ............ 257/40 |
| 2010/0066241 A1 | 3/2010 | Cho et al. | |
| 2011/0068254 A1 | 3/2011 | Hayashi | |

FOREIGN PATENT DOCUMENTS

| | | | | |
|---|---|---|---|---|
| JP | 62283341 A | * | 12/1987 | ............ G03G 5/06 |
| JP | H11-035532 A | | 2/1999 | |
| JP | 3508984 B2 | | 1/2004 | |
| JP | 2005-290000 A | | 10/2005 | |
| JP | 2006-131783 A | | 5/2006 | |
| JP | 2007-081203 A | | 3/2007 | |
| JP | 2007-115665 A | | 5/2007 | |
| JP | 2007-123707 A | | 5/2007 | |
| JP | 2007-137795 A | | 6/2007 | |
| JP | 2007-169268 A | | 7/2007 | |
| JP | 2007-180147 A | | 7/2007 | |
| JP | 2007-308474 A | | 11/2007 | |
| JP | 2007-314509 A | | 12/2007 | |
| JP | 2008-072090 A | | 3/2008 | |
| JP | 2008-112984 A | | 5/2008 | |
| JP | 2008-545630 A | | 12/2008 | |
| JP | 2009-049278 A | | 3/2009 | |
| JP | 2010-13444 A | | 1/2010 | |
| JP | 2010-037312 A | | 2/2010 | |
| WO | 2004/066685 A1 | | 8/2004 | |
| WO | 2007/077810 A1 | | 7/2007 | |
| WO | 2008/035571 A1 | | 3/2008 | |
| WO | 2008/090912 A1 | | 7/2008 | |

OTHER PUBLICATIONS

CAS registry abstract for JP62-283341. Date of publication: Dec. 1987.*
Full English translation of JP62-283341. Year of publication: 1987.*
The Extended European Search Report dated Feb. 22, 2011; European Patent Application No. / Patent No. 10164930.9-1235 / 2259358.
Jianping Lu et al., "Synthesis and Properties of Multi-Triarylamine-Substituted Carbazole-based Dendrimers with an Oligothiophene Core for Potential Application in Organic Solar Cells and Light-Emitting Diodes"; Chem. Mater., vol. 18, No. 26, pp. 6194-6203; published on web Dec. 19, 2006.

(Continued)

*Primary Examiner* — Andrew K Bohaty
(74) *Attorney, Agent, or Firm* — Studebaker & Brackett PC

(57) ABSTRACT

Provided is a photoelectric conversion device comprising a transparent electrically conductive film, a photoelectric conversion film, and an electrically conductive film, wherein the photoelectric conversion film contains a compound represented by the following formula (i):

Formula (i)

wherein each of $R_2$ to $R_9$ independently represents a hydrogen atom or a substituent, provided that each of at least two out of $R_3$, $R_4$, $R_7$ and $R_8$ independently represents an aryl group, a heterocyclic group or —N(Ra)(Rb), each of Ra and Rb independently represents a hydrogen atom or a substituent, and at least either Ra or Rb represents an aryl group or a heterocyclic group; and $R_1$ represents an alkyl group, an aryl group or a heterocyclic group.

16 Claims, 4 Drawing Sheets

(56) References Cited

OTHER PUBLICATIONS

Kaulach I et al., "Magnetic field influence on photovoltaic effect of PMMA doped with Dimethylaminobenzylidene 1,3-Indandione and Fullerene C60 Derivative"; Latvian Journal of Physics and Technical Sciences vol. 5., pp. 3-11; Jan. 1, 2005.

Japanese Office Action "Notification of Reasons for Refusal" with mailing dated of Feb. 1, 2011; Japanese Patent Application No. 2010-201487 with translation.

Japanese Office Action "Notification of Reasons for Refusal" with mailing date of Feb. 1, 2011; Japanese Patent Application No. 2010-200509 with translation.

T. Mitsui et al.; U.S. Appl. No. 12/794,220, filed Jun. 4, 2010.

T. Mitsui; U.S. Appl. No. 12/794,248, filed Jun. 4, 2010.

An Office Action issued by the State Intellectual Property Office of People's Republic of China on Jul. 31, 2013, which corresponds to Chinese Patent Application No. 201010196428.X and is related to U.S. Appl. No. 12/793,195; with translation.

The Japanese Office Action "Notice of Reasons for Rejection" issued on Feb. 26, 2013, which corresponds to Japanese Patent Application No. 2011-068257 and is related to U.S. Appl. No. 12/793,195 with translation.

The Japanese Office Action "Notice of Reasons for Rejection" issued on Feb. 26, 2013, which corresponds to Japanese Patent Application No. 2011-068258 and is related to U.S. Appl. No. 12/793,195 with translation.

Kenji Noine et al. "Bifluorene compounds containing carbazole and/or diphenylamine groups and their bipolar charge transport properties in organic light emitting devices"; Organic Electronics vol. 11(2010), pp. 717-723 ; available online Jan. 14, 2010; www.elsevier.com/locate/orgel; Japan.

An Office Action; "Notice of Reasons for Rejection," issued by the Japanese Patent Office on Feb. 18, 2014, which corresponds to Japanese Patent Application No. 2010-127391 and is related to U.S. Appl. No. 12/793,195; with English language translation.

Jiun-Yi S. et al.; "Ambipolar Conductive 2,7-Carbazole Derivatives for Electroluminescent Devices"; Advanced Functional Materials; 2007; pp. 983-995; vol. 17, Issue 6.

An Office Action issued by the European Patent Office on Feb. 6, 2014, which corresponds to European Patent Application No. 11 183 485.9-1555 and is related to U.S. Appl. No. 12/793,195.

Chen B. et al.; "Improved Time-of-Flight Technique for Measuring Carrier Mobility in Thin Films of Organic Electroluminescent Materials"; Japanese Journal of Applied Physics; Mar. 2000; pp. 1190-1192; vol. 39 (2000); Part 1, No. 3A.

An Office Action; "Notice of Reason for Rejection," issued by the Japanese Patent Office on May 13, 2014, which corresponds to Japanese Patent Application No. 2010-127391 and is related to U.S. Appl. No. 12/793,195; with English language translation.

The Preliminary Notice of First Office Action issued by the Taiwan Intellectual Property Office on Jun. 6, 2014, which corresponds to Taiwanese Patent Application No. 099117953 and is related to U.S. Appl. No. 12/793,195; with English language translation.

* cited by examiner

PHOTOELECTRIC CONVERSION DEVICE AND IMAGING DEVICE HAVING DECREASED DARK CURRENT

BACKGROUND OF THE INVENTION

1. Field of the Invention

The present invention relates to a photoelectric conversion device and an imaging device.

2. Description of the Related Art

As for the solid-state imaging device, there is widely used a flat light-receiving device where photoelectric conversion sites are two-dimensionally arrayed in a semiconductor to form pixels and a signal generated by photoelectric conversion in each pixel is charge-transferred and read out according to a CCD or CMOS format. The conventional photoelectric conversion site is generally formed, for example, by forming PN junction in a semiconductor such as Si.

In recent years, with the progress of a multi-pixel system, the pixel size and in turn, the area of a photodiode part becomes small, and this brings about problems of reduction in the aperture ratio and reduction in the light gathering efficiency. As for the measure to enhance the aperture ratio and the like, studies are being made on a solid-state imaging device having an organic photoelectric conversion film using an organic material.

A technique of introducing a bulk heterostructure using a fullerene or a fullerene derivative into the organic photoelectric conversion film so as to bring out high photoelectric conversion efficiency (high exciton dissociation efficiency) is known.

For example, Patent Document 1 discloses a photoelectric conversion film containing a fullerene or a fullerene derivative.

The organic photoelectric conversion device used in a solar cell is designed to collect electric power and therefore, an external electric field is not applied, but the photoelectric conversion device used as a visible light sensor of a solid-state imaging device needs to maximize the photoelectric conversion efficiency and a voltage is sometimes externally applied so as to enhance the photoelectric conversion efficiency or increase the response speed.

When a voltage is externally applied so as to enhance the photoelectric conversion efficiency or increase the response speed, injection of a hole or injection of an electron from an electrode is generated due to an external electric field, and this disadvantageously increases the dark current.

Many of materials usually used as an electrode in a photoelectric conversion device have a work function (WF) of around 4.5 eV (for example, ITO) and, for example, in the case of using a fullerene as the material of the photoelectric conversion film, an energy gap between the WF of electrode and the LUMO of fullerene ($C_{60}$) becomes small, as a result, particularly an electron is liable to be injected from the electrode into the photoelectric conversion film and a significant increase of the dark current is caused.

As regards the prevention of an increase in the dark current due to an injected current, a technique of providing a charge blocking layer to suppress the injection of an electric charge into the photoelectric conversion layer, thereby efficiently preventing an injected carrier and reducing the dark current, is disclosed (Patent Document 2).

Also, in Patent Documents 3 and 4, an organic material having a carbazole structure is disclosed, but its use as a charge blocking layer or the like of a photoelectric conversion device is not described at all.

[Patent Document 1] JP-A-2007-123707 (the term "JP-A" as used herein means an "unexamined published Japanese patent application")
[Patent Document 2] JP-A-2008-72090
[Patent Document 3] JP-A-2005-290000
[Patent Document 4] U.S. Pat. No. 6,649,772

SUMMARY OF THE INVENTION

In the case of providing a charge blocking layer as in Patent Document 2, the charge blocking layer is required to have not only a blocking ability but also high charge transportability so as to realize high photoelectric conversion efficiency and high-speed response.

Also, considering application to a production process or enhancement of storability, the charge blocking layer needs to have high heat resistance and, as a matter of importance, must withstand the heating conditions that are a process temperature of color filter mounting or solder reflow.

That is, in the case of forming a charge blocking layer, for example, forming an electron blocking layer, the material needs to be designed to satisfy low Ea (electron affinity), high hole transportability, high heat resistance and the like, and the structure is severely restricted so as to satisfy these requirements.

In addition, molecular design for allowing the position of energy level to take a preferred value must be considered so that the electron blocking layer can be appropriately used in the device configuration.

When a material with shallow Ip (ionization potential) and a material with deep Ea (for example, fullerene $C_{60}$) are contacted, an electric charge (electron, hole) is generated in LUMO of the deep Ea material layer from HOMO of the shallow Ip material layer within a bulk due to thermal excitation (source charge), as a result, carriers (electric charge) in the film during dark time and in turn, dark current causing noise are increased. The Ip of the electron blocking layer coming into contact with fullerene $C_{60}$ must be sufficiently large and at the same time, needs to be small enough to receive a hole without barriers from HOMO of a material (p-type material) that transports a hole in the bulk heterolayer of fullerene $C_{60}$. That is, the Ip of the electron blocking layer should be designed to a fairly limited value, and a large restriction has to be further added to the material design whose freedom is originally small.

Neither Patent Document 1 nor Patent Document 2 refers to a source carrier from the interface between a charge blocking layer and a photoelectric conversion layer. There has been heretofore not known any material design technique enabling desirable suppression of the source charge.

The present invention has been made to solve these problems, and an object of the present invention is to provide a photoelectric conversion device capable of suppressing a source charge (electron, hole) produced at the interface between different materials in a photoelectric conversion film and effectively decreasing the dark current, and an imaging device equipped with such a photoelectric conversion device.

As a result of intensive studies, the present inventors have found that in a photoelectric conversion device having a photoelectric conversion film containing a material with large Ea, when a compound represented by the following formula is used for the material (layer) coming into contact with the material having large Ea, a source charge (electron, hole) produced at the interface between the material having large Ea and a material (layer) in contact therewith can be suppressed to an extent of effectively reducing the dark current and causing no problem in practice by heating. The compound represented by the following formula has a high effect of reducing the dark current as compared with conventional materials having the same Ip and therefore, the allowable Ip can be smaller, increasing the alternative of substituents usable in the molecular structure, so that the freedom of molecular design can be enhanced.

That is, the above-described object can be attained by the following measures.

(1) A photoelectric conversion device comprising a transparent electrically conductive film, a photoelectric conversion film, and an electrically conductive film, wherein said photoelectric conversion film contains a compound represented by the following formula (i):

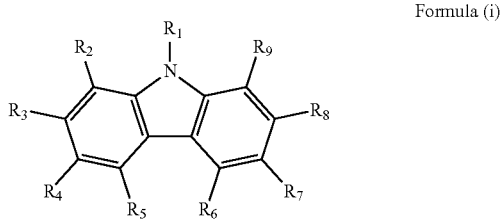

Formula (i)

wherein $R_1$ represents an alkyl group, an aryl group or a heterocyclic group; each of $R_2$ to $R_9$ independently represents a hydrogen atom or a substituent, provided that each of at least two out of $R_3$, $R_4$, $R_7$ and $R_8$ independently represents an aryl group, a heterocyclic group or —N(Ra)(Rb), each of Ra and Rb independently represents a hydrogen atom or a substituent, and at least either Ra or Rb represents an aryl group or a heterocyclic group.

(2) The photoelectric conversion device as described in (1) above, wherein said photoelectric conversion film further contains a material having an electron affinity (Ea) of 4.0 eV or more and in said photoelectric conversion film, said compound represented by formula (i) is put into contact with said material having an electron affinity (Ea) of 4.0 eV or more.

(3) The photoelectric conversion device as described in (1) or (2) above, wherein said compound represented by formula (i) does not contain a condensed ring structure composed of 5 or more rings.

(4) The photoelectric conversion device as described in any one of (1) to (3) above, wherein in formula (i), $R_1$ is an aryl group.

(5) The photoelectric conversion device as described in any one of (1) to (4) above, wherein in formula (i), each of at least two out of $R_3$, $R_4$, $R_7$ and $R_8$ is independently —N(Ra)(Rb), an azepinyl group or a carbazolyl group and at least either Ra or Rb is a fluorenyl group.

(6) The photoelectric conversion device as described in any one of (1) to (4) above, wherein in formula (i), each of at least two out of $R_3$, $R_4$, $R_7$ and $R_8$ is independently —N(Ra)(Rb) and at least either Ra or Rb is a fluorenyl group.

(7) The photoelectric conversion device as described in any one of (1) to (4) above, wherein in formula (i), each of $R_3$ and $R_8$ is independently —N(Ra)(Rb), an azepinyl group or a carbazolyl group.

(8) The photoelectric conversion device as described in any one of (1) to (4), wherein in formula (i), each of $R_3$ and $R_8$ is independently a carbazolyl group substituted with an alkyl group having a carbon number of 1 to 12 and said alkyl group may be bonded through a heterocyclic group as the linking group.

(9) The photoelectric conversion device as described in any one of (1) to (8) above, wherein in formula (i), each of $R_2$, $R_5$, $R_6$ and $R_9$ is a hydrogen atom.

(10) The photoelectric conversion device as described in any one of (1) to (9) above, wherein in formula (i), each of $R_4$ and $R_7$ is a hydrogen atom.

(11) The photoelectric conversion device as described in any one of (1) to (10) above, wherein the ionization potential (Ip) of said compound represented by formula (i) is less than 5.7 eV.

(12) The photoelectric conversion device as described in any one of (1) to (11) above, wherein the ionization potential (Ip) of said compound represented by formula (i) is 4.9 eV or more.

(13) The photoelectric conversion device as described in any one of (1) to (12) above, wherein the molecular weight of said compound represented by formula (i) is from 500 to 2,000.

(14) The photoelectric conversion device as described in any one of (1) to (13) above, wherein the mobility of said compound represented by formula (i) as measured by a Time of Flight (TOF) method is $1 \times 10^{-5}$ cm$^2$/Vs or more.

(15) The photoelectric conversion device as described in any one of (1) to (14) above, wherein said photoelectric conversion film contains a photoelectric conversion layer and an electron blocking layer and said electron blocking layer contains said compound represented by formula (i).

(16) The photoelectric conversion device as described in any one of (2) to (15) above, wherein said material having an electron affinity (Ea) of 4.0 eV or more is a fullerene or a fullerene derivative.

(17) The photoelectric conversion device as described in any one of (1) to (16) above, wherein said electrically conductive film, said photoelectric conversion film and said transparent electrically conductive film are stacked in this order.

(18) An imaging device comprising the photoelectric conversion device claimed in any one of (1) to (17) above.

According to the present invention, a photoelectric conversion device and an imaging device, which are capable of suppressing a source charge (electron, hole) produced at the interface between different materials in a photoelectric conversion film and effectively decreasing the dark current, can be provided.

Figure 1A:
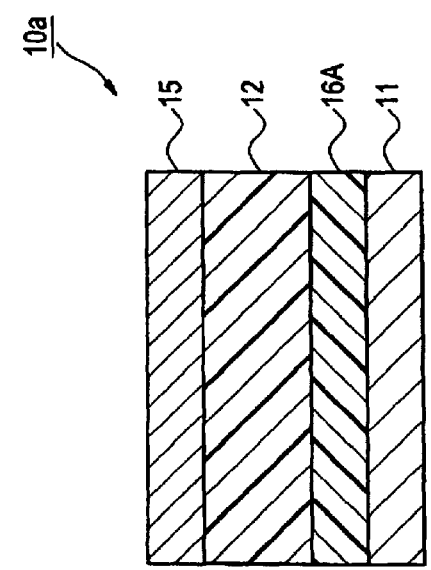
FIGS. 1A and 1B are schematic cross-sectional views showing one example of the configuration example of the photoelectric conversion device.

In the formulae above, 11 denotes Lower electrode, 12 denotes Photoelectric conversion layer (photoelectric conversion film), 15 denotes Upper electrode (transparent electrically conductive film), 16A denotes Electron blocking layer (electrically conductive film), 16B denotes Hole blocking layer (electrically conductive film), 100, 200 and 300 denote Imaging device.

DETAILED DESCRIPTION OF THE INVENTION

[Photoelectric Conversion Device]

The photoelectric conversion device of the present invention comprises a transparent electrically conductive film, a photoelectric conversion film, and an electrically conductive film. In a preferred embodiment, the electrically conductive film, the photoelectric conversion film and the transparent electrically conductive film are stacked in this order.

Furthermore, in the photoelectric conversion device of the present invention, the photoelectric conversion film contains a compound represented by the following formula (i):

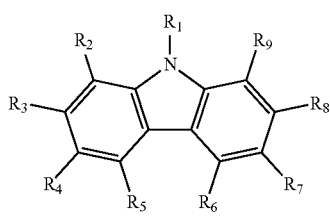

Formula (i)

wherein $R_1$ represents an alkyl group, an aryl group or a heterocyclic group, each of $R_2$ to $R_9$ independently represents a hydrogen atom or a substituent, provided that each of at least two out of $R_3$, $R_4$, $R_7$ and $R_8$ independently represents an aryl group, a heterocyclic group or —N(Ra)(Rb), each of Ra and Rb independently represents a hydrogen atom or a substituent, and at least either Ra or Rb represents an aryl group or a heterocyclic group.

The embodiment of containing the compound represented by formula (i) in the photoelectric conversion film is not particularly limited, but the photoelectric conversion film may further contain an organic material other than the compound of formula (i). For example, at least either one of a p-type organic semiconductor and an n-type organic semiconductor can be contained as the organic material. Also, as for the organic material, the photoelectric conversion film preferably contains a material having a large electron affinity (Ea) and in the case of further containing a material having a large electron affinity (Ea) (preferably a material having Ea of 4.0 eV or more) in the photoelectric conversion film, the material having a large electron affinity (Ea) is preferably put into contact with the compound of formula (i). By virtue of containing the compound of formula (i) in a state of being put into contact with the material having a large electron affinity (Ea), generation of a source charge (electron, hole) at the interface between these two materials can be effectively suppressed. The material having an electron affinity (Ea) of 4.0 eV or more is preferably a fullerene or a fullerene derivative, which are described later.

More specifically, a photoelectric conversion device in the following embodiments is preferred.

(1) An embodiment where the photoelectric conversion film contains a photoelectric conversion layer and a charge blocking layer (either one or both of an electron blocking layer and a hole blocking layer), the material having a large electron affinity (Ea) is contained in the photoelectric conversion layer, and at least either one of the charge blocking layer is composed of the compound of formula (i).

(2) An embodiment where the photoelectric conversion film contains a photoelectric conversion layer and a charge blocking layer and further contains an organic layer disposed between the photoelectric conversion layer and the charge blocking layer, the material having a large electron affinity (Ea) is contained in the photoelectric conversion layer, and the organic layer is composed of the compound of formula (i).

In the embodiment (1) above, thanks to the charge blocking layer composed of the compound of formula (i), generation of a source charge between the charge blocking layer and the photoelectric conversion layer is suppressed and at the same time, injection of a charge from an electrode can be prevented. In the embodiment (2) above, a source charge can be prevented from generation between the charge blocking layer and the photoelectric conversion layer due to direct contact of these layers.

One example of the preferred embodiment of the photoelectric conversion device according to the present invention is described below.

Figure 1B:
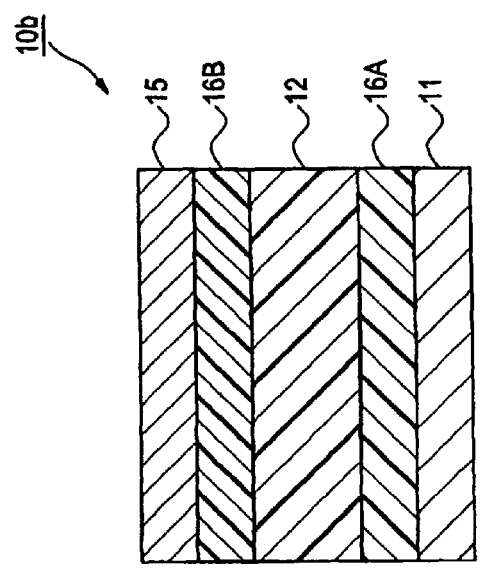

FIGS. 1A and 1B show configuration examples of the photoelectric conversion device according to this embodiment.

In the photoelectric conversion device 10a shown in FIG. 1A, an electron blocking layer 16A, a photoelectric conversion layer 12 and an upper electrode 15 are stacked in this order on a lower electrode 11.

In the photoelectric conversion device 10b shown in FIG. 1B, an electron blocking layer 16A, a photoelectric conversion layer 12, a hole blocking layer 16B and an upper electrode 15 are stacked in this order on a lower electrode 11. The order of stacking an electron blocking layer, a photoelectric conversion layer and a hole blocking layer in FIGS. 1A and 1B may be reversed according to usage or properties.

The elements constituting the photoelectric conversion device according to this embodiment are described below.

(Electrode)

Each of the electrodes (upper electrode (transparent electrically conductive film) 15 and lower electrode (electrically conductive film) 11) is composed of an electrically conductive material. Examples of the electrically conductive material which can be used include a metal, an alloy, a metal oxide, an electroconductive compound, and a mixture thereof.

Light is incident from the upper electrode 15 and therefore, the upper electrode 15 needs to be sufficiently transparent to light that is to be detected. Specific examples thereof include an electrically conductive metal oxide such as tin oxide doped with antimony or fluorine (ATO, FM), tin oxide, zinc oxide, indium oxide, indium tin oxide (ITO) and indium zinc oxide (IZO); a metal thin film such as gold, silver, chromium and nickel; a mixture or laminate of such a metal and such an electrically conductive metal oxide; an inorganic electrically conductive substance such as copper iodide and copper sulfide; an organic electrically conductive material such as polyaniline, polythiophene and polypyrrole; and a laminate of such a material and ITO. Among these, an electrically conductive metal oxide is preferred in view of high electrical conductivity, transparency and the like. The upper electrode 15 is deposited on the photoelectric conversion layer 12 and therefore, is preferably deposited by a method causing no deterioration of the properties of the photoelectric conversion layer 12.

The lower electrode 11 includes, according to usage, a case where transparency is imparted, a case where, conversely, a material capable of reflecting light is used without imparting transparency, and the like. Specific examples thereof include an electrically conductive metal oxide such as tin oxide doped with antimony or fluorine (ATO, FTO), tin oxide, zinc oxide, indium oxide, indium tin oxide (ITO) and indium zinc oxide (IZO); a metal such as gold, silver, chromium, nickel, titanium, tungsten and aluminum; an electrically conductive compound such as oxide and nitride of the metal; a mixture or laminate of such a metal and such an electrically conductive metal oxide; an inorganic electrically conductive substance such as copper iodide and copper sulfide; an organic electrically conductive material such as polyaniline, polythiophene and polypyrrole; and a laminate of such a material and ITO.

The method for forming the electrode is not particularly limited and may be appropriately selected by taking into consideration the aptitude for the electrode material. Specifically, the electrode can be formed, for example, by a wet system such as printing and coating, a physical system such as vacuum deposition. sputtering and ion plating, or a chemical system such as CVD and plasma CVD.

In the case where the material of the electrode is ITO, the electrode can be formed by a method such as electron beam method, sputtering method, resistance heating deposition method, chemical reaction method (e.g., sol-gel method) and coating of a dispersion of indium tin oxide. The film produced using ITO may be further subjected to, for example, a UV-ozone treatment or a plasma treatment.

The upper electrode 15 is preferably produced in a plasma-free state. When the upper electrode 15 is produced in a plasma-free state, the effect of plasma on the substrate can be reduced and good photoelectric conversion properties can be obtained. Here, the plasma-free state means a state where plasma is not generated during deposition of the upper electrode 15, or a state where the distance from a plasma source to the substrate is 2 cm or more, preferably 10 cm or more, more preferably 20 cm or more, and the amount of plasma reaching the substrate is reduced.

Examples of the apparatus generating no plasma during deposition of the upper electrode 15 include an electron beam deposition apparatus (EB deposition apparatus) and a pulsed laser deposition apparatus. As for the EB deposition apparatus or pulsed laser deposition apparatus, apparatuses described, for example, in Yutaka Sawada (supervisor), *Tomei Doden Maku no Shin Tenkai* (*New Development of Transparent Conductive Film*), CMC (1999), Yutaka Sawada (supervisor), *Tomei Doden Maku no Shin Tenkai II* (*New Development of Transparent Conductive Film II*), CMC (2002), *Tomei Doden Maku no Gijutsu* (*Technology of Transparent Conductive Film*), JSPS, Ohmsha (1999), and references cited therein may be used. In the following, the method of depositing the transparent electrode film by using an EB deposition apparatus is referred to as an EB deposition method, and the method of depositing the transparent electrode film by using a pulsed laser deposition apparatus is referred to as a pulsed laser deposition method.

As for the apparatus capable of realizing a state where the distance from a plasma source to the substrate is 2 cm or more and the amount of plasma reaching the substrate is reduced (hereinafter referred to as a "plasma-free film depositing apparatus"), an opposed-target sputtering apparatus, an arc plasma deposition method and the like are considered, and examples of such an apparatuses which can be used include those described in Yutaka Sawada (supervisor), *Tomei Doden Maku no Shin Tenkai* (*New Development of Transparent Conductive Film*), CMC (1999), Yutaka Sawada (supervisor), *Tomei Doden Makuno Shin Tenkai II* (*New Development of Transparent Conductive Film II*), CMC (2002), *Tomei Doden Maku no Gijutsu* (*Technology of Transparent Conductive Film*), JSPS, Ohmsha (1999), and references cited therein.

In the case where the upper electrode 15 is a transparent electrically conductive film such as TCO, a DC short or an increase of leak current sometimes occurs. One of causes thereof is considered because fine cracks introduced into the photoelectric conversion layer 12 are coveraged by a dense film such as TCO to increase the conduction with the lower electrode film 11 on the opposite side. Therefore, in the case of an electrode having relatively poor film quality such as A1, the leak current hardly increases. The increase of leak current can be greatly suppressed by controlling the film thickness of the upper electrode 15 with respect to the film thickness (that is, the crack depth) of the photoelectric conversion layer 12. The thickness of the upper electrode 15 is preferably ⅕ or less, more preferably ¹⁄₁₀ or less, of the thickness of the photoelectric conversion layer 12.

Usually, when the thickness of the electrically conductive film is made smaller than a certain range, an abrupt increase of the resistance value is incurred, but in the solid-state imaging device where the photoelectric conversion device according to this embodiment is incorporated, the sheet resistance may be, preferably, from 100 to 10,000 Ω/sq. and the latitude as to in which range the film thickness can be reduced is large. Also, as the thickness of the upper electrode (transparent electrically conductive film) 15 is smaller, the quantity of light absorbed is reduced and the light transmittance is generally increased. The increase of light transmittance brings about an increase of light absorption in the photoelectric conversion layer 12 and an increase of photoelectric conversion performance, and this is very preferred. Considering the suppression of leak current and the increase of resistance value of thin film as well as the increase of transmittance, which are associated with reduction in the film thickness, the thickness of the upper electrode 15 is preferably from 5 to 100 nm, more preferably from 5 to 20 nm.

(Charge Blocking Layer)

The charge blocking layer according to this embodiment preferably contains a compound having a carbazole structure represented by the following formula (i) (hereinafter referred to as a "compound of formula (i)"). It is one preferred embodiment of the present invention to use the compound of formula (i) as the material of the blocking layer in contact with the photoelectric conversion layer containing a material having a large Ea.

Formula (i)

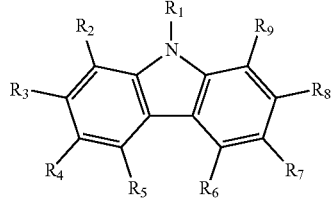

In the formula, $R_1$ represents an alkyl group, an aryl group or a heterocyclic group, each of $R_2$ to $R_9$ independently represents a hydrogen atom or a substituent, provided that each of at least two members out of $R_3$, $R_4$, $R_7$ and $R_8$ independently represents an aryl group, a heterocyclic group or —N(Ra)(Rb), each of Ra and Rb independently represents a hydrogen atom or a substituent, and at least either Ra or Rb represents an aryl group or a heterocyclic group.

Out of $R_1$ to $R_9$, adjacent members may combine with each other to form a ring. The ring includes the later-described ring R.

By using the compound represented by formula (i) for the charge blocking layer, even when the charge blocking layer is contacted with the photoelectric conversion layer containing a material with deep Ea (large Ea), an interface that is hardly capable of generating a source charge can be formed. As regards the electron blocking layer, the contact interface differs in the formed state according to the molecular structure of the electron blocking material. For example, when a star burst-type structure such as mMTDATA is used for a molecule having a triphenyldiamine structure generally used as a hole transport material or having a structure where a part of the triphenyldiamine structure is ring-fused, even with the same Ip, the source charge is increased and in turn, the dark current is increased. By specifying the molecular structure to that of formula (i), even with the same Ip, the source charge amount can be conversely kept small as compared with a hole transport material generally used, such as triphenyldiamine structure. Accordingly, when the basic structure is the carbazole mother nucleus structure of formula (i), the dark current can be suppressed even with a material having a smaller Ip and the molecular design for high heat resistance and high hole transportability is more facilitated.

$R_1$ represents an alkyl group, an aryl group or a heterocyclic group. $R_1$ may have a substituent. The substituent includes the late-described substituent W. The substituent is preferably an alkyl group, an aryl group or a heterocyclic group. In the case where $R_1$ is an aryl group or a heterocyclic group, the substituent thereof is preferably an alkyl group (more preferably an alkyl group having a carbon number of 1 to 20, still more preferably an alkyl group having a carbon number of 1 to 10).

In the case where $R_1$ is an alkyl group, the alkyl may be a linear or branched alkyl group or a cyclic alkyl group (cycloalkyl group) but is preferably a cycloalkyl group.

The carbon number is, when the carbazole structure is not contained in $R_1$, preferably from 4 to 20, more preferably from 5 to 16, and when the carbazole structure is contained in $R_1$, preferably from 19 to 35, more preferably from 20 to 31.

Specific examples of the cycloalkyl group include a cycloalkyl group (e.g., cyclopropyl, cyclopentyl, cyclohexyl), and a cycloalkenyl group (e.g., 2-cyclohexen-1-yl).

In the case where $R_1$ is an aryl group, the aryl group is, when the carbazole structure is not contained in $R_1$, preferably a substituted or unsubstituted aryl group having a carbon number of 6 to 20, more preferably a substituted or unsubstituted aryl group having a carbon number of 6 to 16, and when the carbazole structure is contained in $R_1$, preferably a substituted or unsubstituted aryl group having a carbon number of 21 to 35, more preferably a substituted or unsubstituted aryl group having a carbon number of 21 to 31. Specific examples thereof include a phenyl group, a naphthyl group and an anthryl group.

In the case where $R_1$ is a heterocyclic group, the heterocyclic group includes a 5- or 6-membered heterocyclic group, and specific examples thereof include a furyl group, a thienyl group, a pyridyl group, a quinolyl group, a thiazolyl group, an oxazolyl group, an azepinyl group and a carbazolyl group.

The aryl group or heterocyclic group may contain a condensed ring composed of 2 to 4 monocycles.

$R_1$ is preferably a substituted or unsubstituted aryl group or a substituted or unsubstituted heterocyclic group, more preferably a substituted or unsubstituted aryl group, and most preferably a phenyl group, a p-methylphenyl group or an m-methylphenyl group.

Each of $R_2$ to $R_9$ independently represents a hydrogen atom or a substituent, provided that each of at least two out of $R_3$, $R_4$, $R_7$ and $R_8$ independently represents an aryl group, a heterocyclic group or —N(Ra)(Rb), wherein each of Ra and Rb independently represents a hydrogen atom or a substituent and at least either Ra or Rb represents an aryl group or a heterocyclic group.

In the case where each of $R_2$ to $R_9$ represents a substituent, the substituent includes the later-described substituent W. In this case, the substituent may further have a substituent, and the further substituent includes the later-described substituent W.

Each of $R_3$, $R_4$, $R_7$ and $R_8$ is independently, preferably a hydrogen atom, an alkyl or alkoxy group, having a carbon number of 1 to 30, a cyano group, a halogen atom, an acyl group, an arylthio group, an alkylthio group, an aryloxy group, an alkylamino group, a nitro group, a sulfonyl group, an aryl group, a heterocyclic group, or a substituted amino group —N(Ra)(Rb). In particular, it is preferred that each of $R_3$ and $R_8$ is an aryl group, a heterocyclic group or a substituted amino group —N(Ra)(Rb) and each of $R_4$ and $R_7$ is a hydrogen atom, an alkyl or alkoxy group, having a carbon number of 1 to 30, a cyano group, a halogen atom, an acyl group, an arylthio group, an alkylthio group, an aryloxy group, an alkylamino group, a nitro group or a sulfonyl group. More preferably, each of $R_4$ and $R_7$ is a hydrogen atom, an alkyl group, an aryl group or a heterocyclic group, and still more preferably, each of $R_4$ and $R_7$ is a hydrogen atom.

Each of Ra and Rb independently represents a hydrogen atom or a substituent, and at least either Ra or Rb represents an aryl group or a heterocyclic group. The aryl group or heterocyclic group may contain a condensed ring composed of 2 to 4 monocycles.

The aryl group represented by $R_3$, $R_4$, $R_7$, $R_8$, Ra and Rb is preferably an aryl group having a carbon number of 6 to 30, more preferably from 6 to 12. Specific examples thereof include a phenyl group, a naphthyl group, an anthryl group, a fluorenyl group, a phenanthryl group, a pyrenyl group and a tetracenyl group.

The heterocyclic group represented by $R_3$, $R_4$, $R_7$, $R_8$, Ra and Rb is preferably a furyl group, a thienyl group, a pyridyl group, a quinolyl group, a thiazolyl group, an oxazolyl group, an azepinyl group or a carbazolyl group, more preferably an azepinyl group or a carbazolyl group.

The aryl group or heterocyclic group may further have a substituent. Specific examples of the substituent of these groups include the later-described substituent W. Above all, a fluorine atom, a chlorine atom, a cyano group, a hydroxyl group, a nitro group, an alkyl group, an alkoxy group, an amino group, a substituted amino group (—NRR), a trifluoromethyl group, an aryl group and a heterocyclic group are preferred, an alkyl group having a carbon number of 1 to 12, an aryl group, a heterocyclic group and a substituted amino group are more preferred. An alkyl group having a carbon number of 1 to 6, an aryl group (which may be substituted with an alkyl group having a carbon number of 1 to 6) and a heterocyclic group (which may be substituted with an alkyl group having a carbon number of 1 to 6) are still more preferred, a methyl group, an ethyl group, a tert-butyl group are yet still more preferred, and a tert-butyl group is most preferred. This substituent may be bonded through a linking group, and the linking group includes the above-described aryl group and heterocyclic group and is preferably a heterocyclic group, more preferably a carbazolyl group.

In the substituted amino group, each R independently represents a hydrogen atom, an alkyl group, a cycloalkyl group, an aryl group or a heterocyclic group (excluding the case where both R's are a hydrogen atom) and is preferably an aryl group or a heterocyclic group.

In the case where $R_3$, $R_4$, $R_7$ and $R_8$ are —N(Ra)(Rb), at least either Ra or Rb of —N(Ra)(Rb) is preferably an aryl group or a heterocyclic group. Also, both Ra and Rb are preferably an aryl group or a heterocyclic group. At least two members out of $R_3$, $R_4$, $R_7$ and $R_8$ each is independently —N(Ra)(Rb), and at least either Ra or Rb is a fluorenyl group.

Preferred examples of the aryl group and the heterocyclic group include those described above. The aryl group or heterocyclic group may further have a substituent. Examples of the further substituent are the substituent W, and preferred examples are also the same.

Each of Ra and Rb is more preferably an aryl group, still more preferably a fluorenyl group, and most preferably a 9,9-dialkylfluorenyl group.

$R_3$, $R_4$, $R_7$ and $R_8$ are preferably such that each of at least two out of $R_3$, $R_4$, $R_7$ and $R_8$ is independently an aryl group, a heterocyclic group or —N(Ra)(Rb), more preferably —N(Ra)(Rb), an azepinyl group or a carbazole group, and most preferably —N(Ra)(Rb) where each of Ra and Rb is fluorenyl.

Also, each of $R_3$ and $R_8$ or $R_4$ and $R_7$ out of $R_3$, $R_4$, $R_7$ and $R_8$ is independently, preferably an aryl group, a heterocyclic group or —N(Ra)(Rb), more preferably —N(Ra)(Rb), an azepinyl group or a carbazolyl group, and most preferably a carbazolyl group.

Each of $R_2$, $R_5$, $R_6$ and $R_9$ is preferably a hydrogen atom, an alkyl or alkoxy group, having a carbon number of 1 to 30, a cyano group, a halogen atom, an acyl group, an arylthio group, an alkylthio group, an aryloxy group, an alkylamino group, a nitro group or a sulfonyl group, more preferably a hydrogen atom, an alkyl group, an aryl group or a heterocyclic group, still more preferably a hydrogen atom.

Examples of the aryl group and heterocyclic group represented by $R_2$, $R_5$, $R_6$ and $R_9$ include those described above.

The compound of formula (i) is preferably a compound represented by any one of the following formulae (a) to (h) and (j) to (m), more preferably a compound represented by formula (a), (b), (h), (j), (k) or (l).

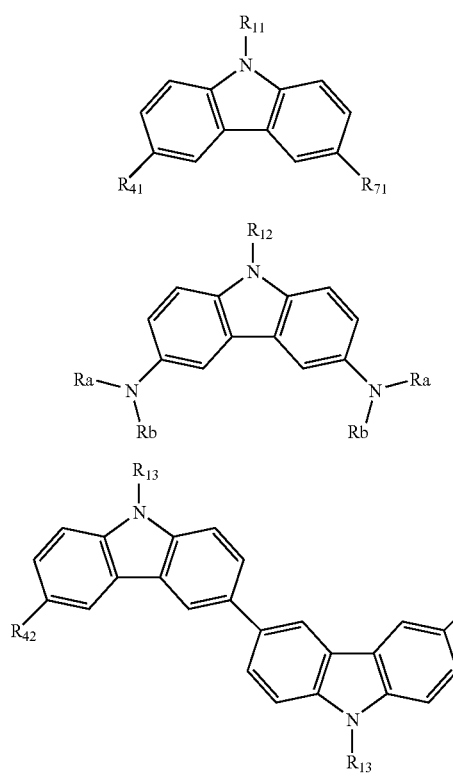
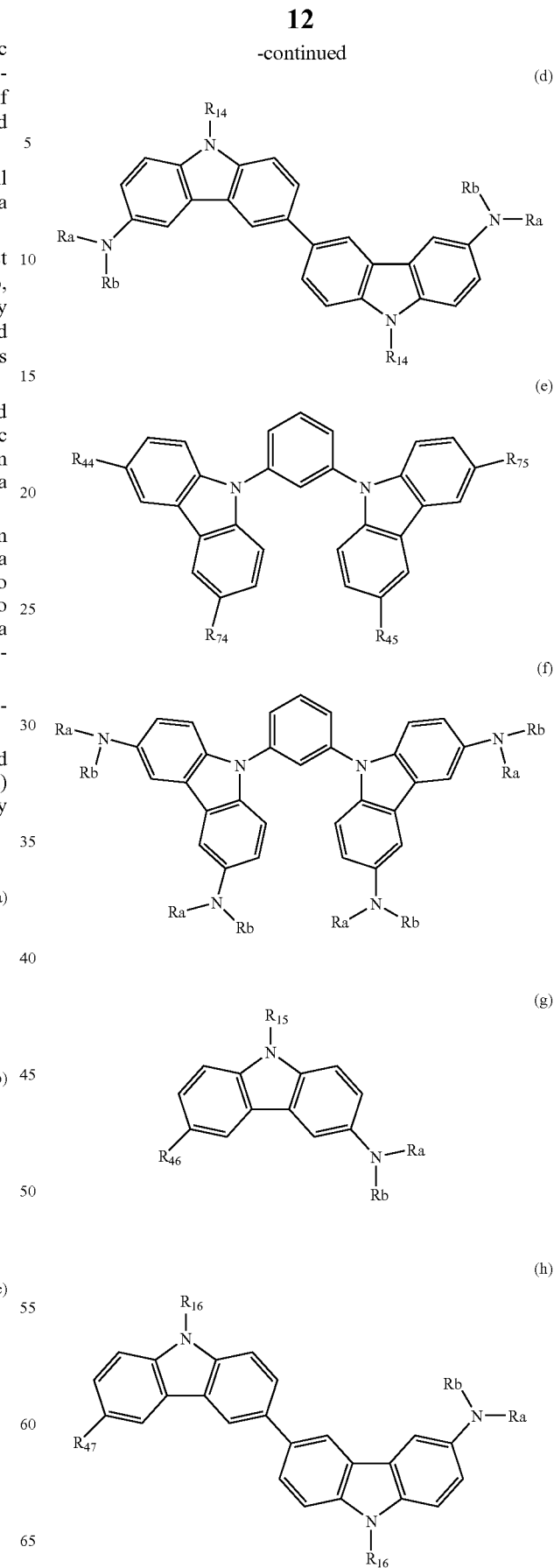

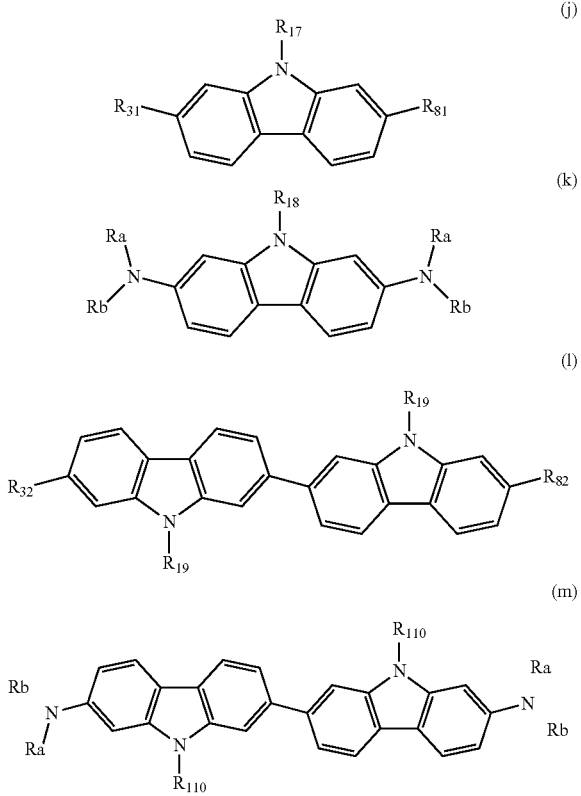

(In formulae (a) to (h) and (j) to (m), each of $R_{11}$ to $R_{19}$, $R_{110}$, $R_{31}$, $R_{32}$, $R_{41}$ to $R_{47}$, $R_{71}$, $R_{74}$, $R_{75}$, $R_{81}$ and $R_{82}$ independently represents an alkyl group, an aryl group or a heterocyclic group, and each of Ra and Rb represents a hydrogen atom or a substituent.)

In formulae (a) to (h) and (j) to (m), each of $R_{11}$ to $R_{19}$, $R_{110}$, Ra and Rb independently represents preferably any one of the later-described partial structures A1 to A15.

Each of $R_{31}$, $R_{32}$, $R_{41}$ to $R_{47}$, $R_{71}$, $R_{74}$, $R_{75}$, $R_{81}$ and $R_{82}$ independently represents preferably any one of the later-described partial structures A1 to A 15 and partial structures N1 to N13.

In the case of using the compound of formula (i) as the electron blocking layer, its ionization potential (Ip) must be smaller than Ip of the material assuming hole transport in the photoelectric conversion layer, because a hole needs to be received without barriers from the material assuming hole transport in the photoelectric conversion layer. In particular, when a material having absorption sensitivity in the visible region is selected, for conforming with a larger number of materials, the ionization potential of the compound of formula (i) is preferably less than 5.7 eV, more preferably less than 5.5 eV. When Ip is less than 5.7 eV, this produces an effect that no barrier to charge transport is generated and high charge collection efficiency and high responsivity are brought out.

Also, Ip is preferably 4.9 eV or more, more preferably 5.0 eV or more. Thanks to Ip of 4.9 eV or more, a higher dark current reducing effect can be obtained.

In this connection, Ip of each compound can be measured by ultraviolet photoelectron spectroscopy (UPS) or photo-emission yield spectroscopy in air (for example, AC-2 manufactured by Riken Keiki Co., Ltd.).

Ip of the compound of formula (i) can be adjusted to the range above, for example, by changing the substituent bonded to the carbazole structure.

Incidentally, Ea of each compound can be measured by ultraviolet photoelectron spectroscopy (UPS) or an atmospheric photoelectron spectrometer (for example, AC-2 manufactured by Riken Keiki Co., Ltd.).

Ip of the compound of formula (i) can be adjusted to the range above, for example, by changing the substituent bonded to the carbazole structure.

Incidentally, when a material having a structure that strongly interacts with the photoelectric conversion layer containing a material with deep Ea is used, a source charge is readily formed at the interface. For example, as regards the molecule coming into contact with the material having deep Ea, when a material of high planarity is used, π electrons formed in a planar fashion tend to readily interact with the molecular orbital of the material having deep Ea, and an interface allowing for an increase in the source charge is liable to be formed. Accordingly, the compound of formula (i) preferably contains no condensed ring structure composed of 5 or more rings. Furthermore, for suppressing the intermolecular interaction, a steric hindrance may be imparted, but an excessively bulky steric hindrance inhibits signal charge transport at the interface. Also from this reason, it is preferred not to contain a condensed ring structure composed of 5 or more rings.

Specific examples of the compound represented by formula (i) are set forth below, but the present invention is not limited to the following specific examples. Also, in formulae (a) to (h) and (j) to (m), with respect to the case where members in each pair of "$R_{41}$ and $R_{71}$", "Ra and Rb", "$R_{44}/R_{45}$ and $R_{74}/R_{75}$", "$R_{31}$ and $R_{81}$", "$R_{32}$ and $R_{82}$" or the like are not the same, "$R_{41}$ and $R_{71}$", "Ra and Rb", "$R_{44}/R_{45}$ and $R_{74}/R_{75}$", "$R_{31}$ and $R_{81}$", "$R_{32}$ and $R_{82}$" or the like can form a combination other than the structures illustrated.

Incidentally, the partial structures of N1 to N13 and A1 to A 15 in examples of the compound indicate the followings.

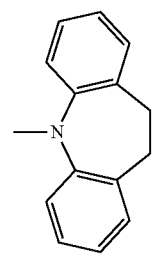

N1

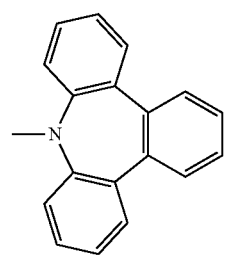

N2

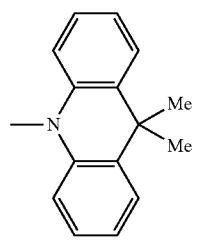 N3
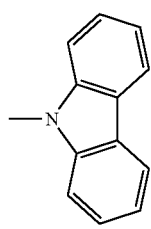 N4
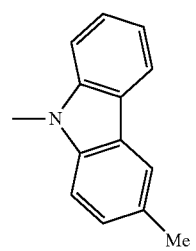 N5
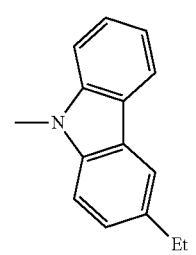 N6
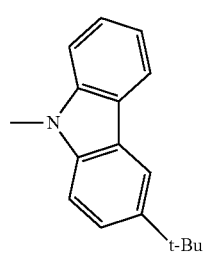 N7
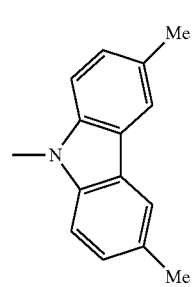 N8
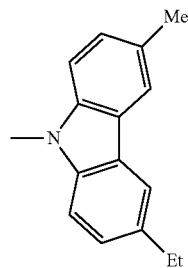 N9
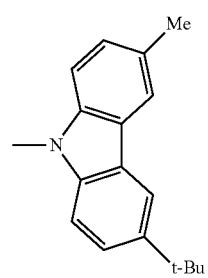 N10
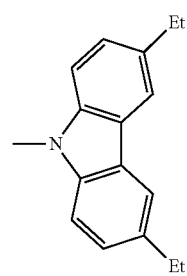 N11
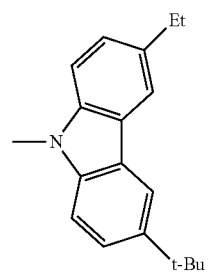 N12
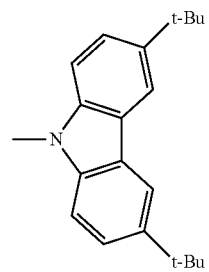 N13
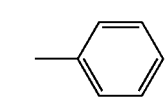 A1
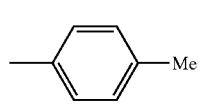 A2

-continued
| | |
|---|---|
| A3 | 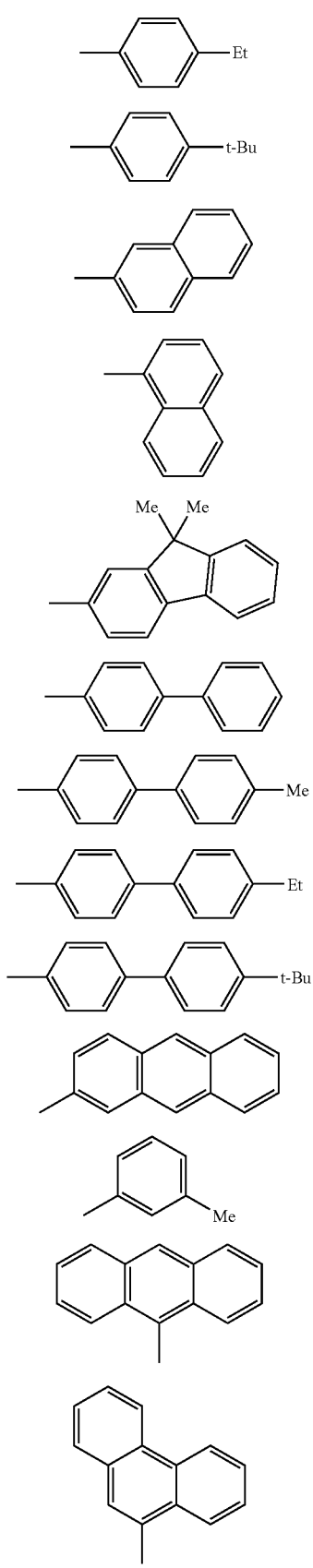 |
| A4 | |
| A5 | |
| A6 | |
| A7 | |
| A8 | |
| A9 | |
| A10 | |
| A11 | |
| A12 | |
| A13 | |
| A14 | |
| A15 | |
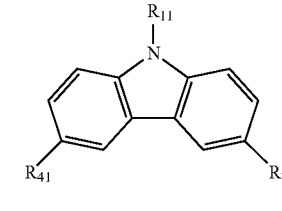
(a)
| Compound No. | $R_{11}$ | $R_{41}$ | $R_{71}$ |
|---|---|---|---|
| a-1 | A1 | N1 | N1 |
| a-2 | A1 | N2 | N2 |
| a-3 | A1 | N3 | N3 |
| a-4 | A1 | N4 | N4 |
| a-5 | A1 | N5 | N5 |
| a-6 | A1 | N6 | N6 |
| a-7 | A1 | N7 | N7 |
| a-8 | A1 | N8 | N8 |
| a-9 | A1 | N9 | N9 |
| a-10 | A1 | N10 | N10 |
| a-11 | A1 | N11 | N11 |
| a-12 | A1 | N12 | N12 |
| a-13 | A1 | N13 | N13 |
| a-14 | A1 | A1 | A1 |
| a-15 | A1 | A2 | A2 |
| a-16 | A1 | A3 | A3 |
| a-17 | A1 | A4 | A4 |
| a-18 | A1 | A5 | A5 |
| a-19 | A1 | A6 | A6 |
| a-20 | A1 | A7 | A7 |
| a-21 | A1 | A8 | A8 |
| a-22 | A1 | A9 | A9 |
| a-23 | A1 | A10 | A10 |
| a-24 | A1 | A11 | A11 |
| a-25 | A1 | N2 | N1 |
| a-26 | A1 | N2 | N3 |
| a-27 | A1 | N2 | N4 |
| a-28 | A1 | N2 | N5 |
| a-29 | A1 | N2 | N11 |
| a-30 | A1 | N2 | N13 |
| a-31 | A1 | N13 | N1 |
| a-32 | A1 | N13 | N2 |
| a-33 | A1 | N13 | N3 |
| a-34 | A1 | N13 | N4 |
| a-35 | A1 | N13 | N5 |
| a-36 | A1 | N13 | N11 |
| a-37 | A2 | N1 | N1 |
| a-38 | A2 | N2 | N2 |
| a-39 | A2 | N3 | N3 |
| a-40 | A2 | N4 | N4 |
| a-41 | A2 | N5 | N5 |
| a-42 | A2 | N6 | N6 |
| a-43 | A2 | N7 | N7 |
| a-44 | A2 | N8 | N8 |
| a-45 | A2 | N9 | N9 |
| a-46 | A2 | N10 | N10 |
| a-47 | A2 | N11 | N11 |
| a-48 | A2 | N12 | N12 |
| a-49 | A2 | N13 | N13 |
| a-50 | A5 | N13 | N13 |
| a-51 | A12 | N13 | N13 |

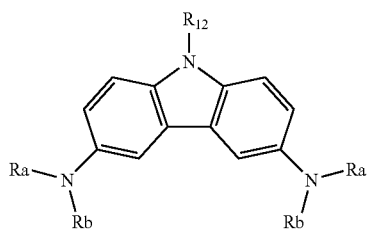

(b)

| Compound No. | $R_{12}$ | Ra | Rb |
|---|---|---|---|
| b-1 | A1 | A1 | A1 |
| b-2 | A1 | A2 | A2 |
| b-3 | A1 | A3 | A3 |
| b-4 | A1 | A4 | A4 |
| b-5 | A1 | A5 | A5 |
| b-6 | A1 | A6 | A6 |
| b-7 | A1 | A7 | A7 |
| b-8 | A1 | A8 | A8 |
| b-9 | A1 | A9 | A9 |
| b-10 | A1 | A10 | A10 |
| b-11 | A1 | A11 | A11 |
| b-12 | A1 | A7 | A1 |
| b-13 | A1 | A7 | A2 |
| b-14 | A1 | A7 | A3 |
| b-15 | A1 | A7 | A4 |
| b-16 | A1 | A7 | A5 |
| b-17 | A1 | A7 | A6 |
| b-18 | A1 | A7 | A8 |
| b-19 | A1 | A7 | A9 |
| b-20 | A1 | A7 | A10 |
| b-21 | A1 | A7 | A11 |
| b-22 | A1 | A8 | A1 |
| b-23 | A1 | A8 | A2 |
| b-24 | A1 | A8 | A3 |
| b-25 | A1 | A8 | A4 |
| b-26 | A1 | A8 | A5 |
| b-27 | A1 | A8 | A6 |
| b-28 | A1 | A8 | A7 |
| b-29 | A1 | A8 | A9 |
| b-30 | A1 | A8 | A10 |
| b-31 | A1 | A8 | A11 |
| b-32 | A2 | A1 | A1 |
| b-33 | A2 | A2 | A2 |
| b-34 | A2 | A3 | A3 |
| b-35 | A2 | A4 | A4 |
| b-36 | A2 | A5 | A5 |
| b-37 | A2 | A6 | A6 |
| b-38 | A2 | A7 | A7 |
| b-39 | A2 | A8 | A8 |
| b-40 | A2 | A9 | A9 |
| b-41 | A2 | A10 | A10 |
| b-42 | A2 | A11 | A11 |
| b-43 | A5 | A7 | A7 |
| b-44 | A7 | A5 | A5 |

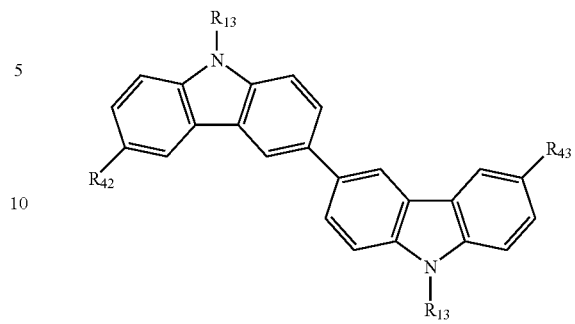

(c)

| Compound No. | $R_{13}$ | $R_{42}$ | $R_{43}$ |
|---|---|---|---|
| c-1 | A1 | N1 | N1 |
| c-2 | A1 | N2 | N2 |
| c-3 | A1 | N3 | N3 |
| c-4 | A1 | N4 | N4 |
| c-5 | A1 | N5 | N5 |
| c-6 | A1 | N6 | N6 |
| c-7 | A1 | N7 | N7 |
| c-8 | A1 | N8 | N8 |
| c-9 | A1 | N9 | N9 |
| c-10 | A1 | N10 | N10 |
| c-11 | A1 | N11 | N11 |
| c-12 | A1 | N12 | N12 |
| c-13 | A1 | N13 | N13 |
| c-14 | A1 | A1 | A1 |
| c-15 | A1 | A2 | A2 |
| c-16 | A1 | A3 | A3 |
| c-17 | A1 | A4 | A4 |
| c-18 | A1 | A5 | A5 |
| c-19 | A1 | A6 | A6 |
| c-20 | A1 | A7 | A7 |
| c-21 | A1 | A8 | A8 |
| c-22 | A1 | A9 | A9 |
| c-23 | A1 | A10 | A10 |
| c-24 | A1 | A11 | A11 |
| c-25 | A1 | N2 | N1 |
| c-26 | A1 | N2 | N3 |
| c-27 | A1 | N2 | N4 |
| c-28 | A1 | N2 | N5 |
| c-29 | A1 | N2 | N11 |
| c-30 | A1 | N2 | N13 |
| c-31 | A1 | N13 | N1 |
| c-32 | A1 | N13 | N2 |
| c-33 | A1 | N13 | N3 |
| c-34 | A1 | N13 | N4 |
| c-35 | A1 | N13 | N5 |
| c-36 | A1 | N13 | N11 |
| c-37 | A2 | N1 | N1 |
| c-38 | A2 | N2 | N2 |
| c-39 | A2 | N3 | N3 |
| c-40 | A2 | N4 | N4 |
| c-41 | A2 | N5 | N5 |
| c-42 | A2 | N6 | N6 |
| c-43 | A2 | N7 | N7 |
| c-44 | A2 | N8 | N8 |
| c-45 | A2 | N9 | N9 |
| c-46 | A2 | N10 | N10 |
| c-47 | A2 | N11 | N11 |
| c-48 | A2 | N12 | N12 |
| c-49 | A2 | N13 | N13 |

(d)

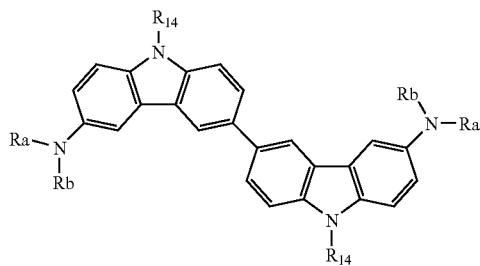

| Compound No. | R14 | Ra | Rb |
|---|---|---|---|
| d-1 | A1 | A1 | A1 |
| d-2 | A1 | A2 | A2 |
| d-3 | A1 | A3 | A3 |
| d-4 | A1 | A4 | A4 |
| d-5 | A1 | A5 | A5 |
| d-6 | A1 | A6 | A6 |
| d-7 | A1 | A7 | A7 |
| d-8 | A1 | A8 | A8 |
| d-9 | A1 | A9 | A9 |
| d-10 | A1 | A10 | A10 |
| d-11 | A1 | A11 | A11 |
| d-12 | A1 | A7 | A1 |
| d-13 | A1 | A7 | A2 |
| d-14 | A1 | A7 | A3 |
| d-15 | A1 | A7 | A4 |
| d-16 | A1 | A7 | A5 |
| d-17 | A1 | A7 | A6 |
| d-18 | A1 | A7 | A8 |
| d-19 | A1 | A7 | A9 |
| d-20 | A1 | A7 | A10 |
| d-21 | A1 | A7 | A11 |
| d-22 | A1 | A8 | A1 |
| d-23 | A1 | A8 | A2 |
| d-24 | A1 | A8 | A3 |
| d-25 | A1 | A8 | A4 |
| d-26 | A1 | A8 | A5 |
| d-27 | A1 | A8 | A6 |
| d-28 | A1 | A8 | A7 |
| d-29 | A1 | A8 | A9 |
| d-30 | A1 | A8 | A10 |
| d-31 | A1 | A8 | A11 |
| d-32 | A2 | A1 | A1 |
| d-33 | A2 | A2 | A2 |
| d-34 | A2 | A3 | A3 |
| d-35 | A2 | A4 | A4 |
| d-36 | A2 | A5 | A5 |
| d-37 | A2 | A6 | A6 |
| d-38 | A2 | A7 | A7 |
| d-39 | A2 | A8 | A8 |
| d-40 | A2 | A9 | A9 |
| d-41 | A2 | A10 | A10 |
| d-42 | A2 | A11 | A11 |

(e)

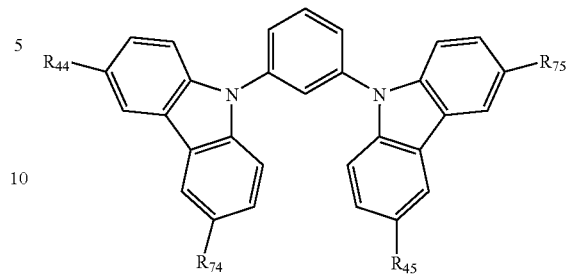

| Compound No. | R44 | R45 | R74 | R75 |
|---|---|---|---|---|
| e-1 | N1 | N1 | N1 | N1 |
| e-2 | N2 | N2 | N2 | N2 |
| e-3 | N3 | N3 | N3 | N3 |
| e-4 | N4 | N4 | N4 | N4 |
| e-5 | N5 | N5 | N5 | N5 |
| e-6 | N6 | N6 | N6 | N6 |
| e-7 | N7 | N7 | N7 | N7 |
| e-8 | N8 | N8 | N8 | N8 |
| e-9 | N9 | N9 | N9 | N9 |
| e-10 | N10 | N10 | N10 | N10 |
| e-11 | N11 | N11 | N11 | N11 |
| e-12 | N12 | N12 | N12 | N12 |
| e-13 | N13 | N13 | N13 | N13 |
| e-14 | N2 | N2 | N1 | N1 |
| e-15 | N2 | N2 | N3 | N3 |
| e-16 | N2 | N2 | N4 | N4 |
| e-17 | N2 | N2 | N5 | N5 |
| e-18 | N2 | N2 | N11 | N11 |
| e-19 | N2 | N2 | N13 | N13 |
| e-20 | N13 | N13 | N1 | N1 |
| e-21 | N13 | N13 | N2 | N2 |
| e-22 | N13 | N13 | N3 | N3 |
| e-23 | N13 | N13 | N4 | N4 |
| e-24 | N13 | N13 | N5 | N5 |
| e-25 | N13 | N13 | N11 | N11 |

(f)

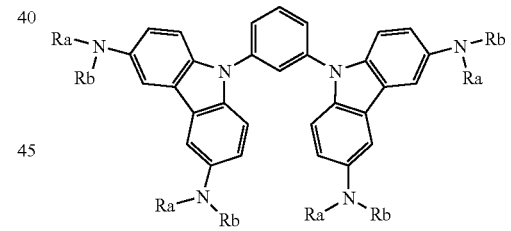

| Compound No. | Ra | Rb |
|---|---|---|
| f-1 | A1 | A1 |
| f-2 | A2 | A2 |
| f-3 | A3 | A3 |
| f-4 | A4 | A4 |
| f-5 | A5 | A5 |
| f-6 | A6 | A6 |
| f-7 | A7 | A7 |
| f-8 | A8 | A8 |
| f-9 | A9 | A9 |
| f-10 | A10 | A10 |
| f-11 | A11 | A11 |
| f-12 | A7 | A1 |
| f-13 | A7 | A2 |
| f-14 | A7 | A3 |
| f-15 | A7 | A4 |
| f-16 | A7 | A5 |
| f-17 | A7 | A6 |
| f-18 | A7 | A8 |
| f-19 | A7 | A9 |
| f-20 | A7 | A10 |

(e)

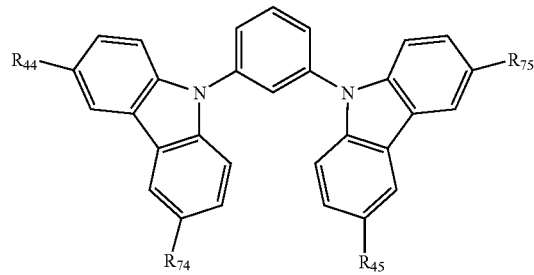

-continued

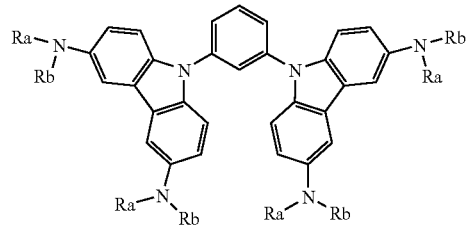
(f)

| Compound No. | Ra | Rb |
|---|---|---|
| f-21 | A7 | A11 |
| f-22 | A8 | A1 |
| f-23 | A8 | A2 |
| f-24 | A8 | A3 |
| f-25 | A8 | A4 |
| f-26 | A8 | A5 |
| f-27 | A8 | A6 |
| f-28 | A8 | A7 |
| f-29 | A8 | A9 |
| f-30 | A8 | A10 |
| f-31 | A8 | A11 |

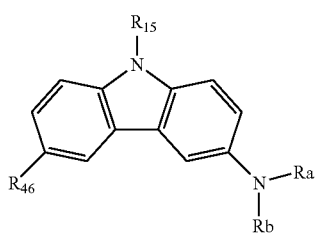
(g)

| Compound No. | $R_{15}$ | $R_{46}$ | Ra | Rb |
|---|---|---|---|---|
| g-1 | A1 | N1 | A5 | A5 |
| g-2 | A1 | N2 | A5 | A5 |
| g-3 | A1 | N3 | A5 | A5 |
| g-4 | A1 | N4 | A5 | A5 |
| g-5 | A1 | N8 | A5 | A5 |
| g-6 | A1 | N11 | A5 | A5 |
| g-7 | A1 | N13 | A5 | A5 |
| g-8 | A1 | N1 | A6 | A6 |
| g-9 | A1 | N2 | A6 | A6 |
| g-10 | A1 | N3 | A6 | A6 |
| g-11 | A1 | N4 | A6 | A6 |
| g-12 | A1 | N8 | A6 | A6 |
| g-13 | A1 | N11 | A6 | A6 |
| g-14 | A1 | N13 | A6 | A6 |
| g-15 | A1 | N1 | A5 | A6 |
| g-16 | A1 | N2 | A5 | A6 |
| g-17 | A1 | N3 | A5 | A6 |
| g-18 | A1 | N4 | A5 | A6 |
| g-19 | A1 | N8 | A5 | A6 |
| g-20 | A1 | N11 | A5 | A6 |
| g-21 | A1 | N13 | A5 | A6 |

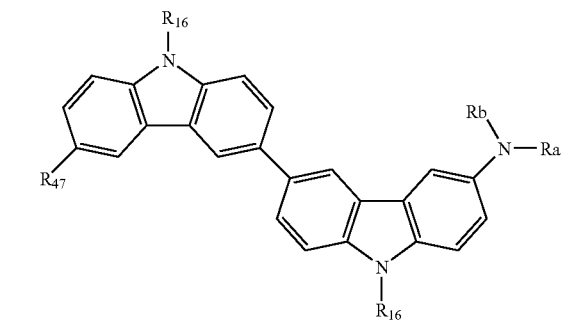
(h)

| Compound No. | $R_{16}$ | $R_{47}$ | Ra | Rb |
|---|---|---|---|---|
| h-1 | A1 | N1 | A5 | A5 |
| h-2 | A1 | N2 | A5 | A5 |
| h-3 | A1 | N3 | A5 | A5 |
| h-4 | A1 | N4 | A5 | A5 |
| h-5 | A1 | N8 | A5 | A5 |
| h-6 | A1 | N11 | A5 | A5 |
| h-7 | A1 | N13 | A5 | A5 |
| h-8 | A1 | N1 | A6 | A6 |
| h-9 | A1 | N2 | A6 | A6 |
| h-10 | A1 | N3 | A6 | A6 |
| h-11 | A1 | N4 | A6 | A6 |
| h-12 | A1 | N8 | A6 | A6 |
| h-13 | A1 | N11 | A6 | A6 |
| h-14 | A1 | N13 | A6 | A6 |
| h-15 | A1 | N1 | A5 | A6 |
| h-16 | A1 | N2 | A5 | A6 |
| h-17 | A1 | N3 | A5 | A6 |
| h-18 | A1 | N4 | A5 | A6 |
| h-19 | A1 | N8 | A5 | A6 |
| h-20 | A1 | N11 | A5 | A6 |
| h-21 | A1 | N13 | A5 | A6 |

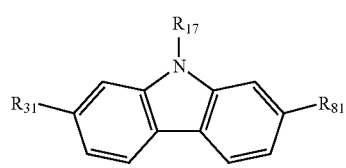
(j)

| Compound No. | $R_{17}$ | $R_{31}$ | $R_{81}$ |
|---|---|---|---|
| j-1 | A1 | N1 | N1 |
| j-2 | A1 | N2 | N2 |
| j-3 | A1 | N3 | N3 |
| j-4 | A1 | N4 | N4 |
| j-5 | A1 | N5 | N5 |
| j-6 | A1 | N6 | N6 |
| j-7 | A1 | N7 | N7 |
| j-8 | A1 | N8 | N8 |
| j-9 | A1 | N9 | N9 |
| j-10 | A1 | N10 | N10 |
| j-11 | A1 | N11 | N11 |
| j-12 | A1 | N12 | N12 |
| j-13 | A1 | N13 | N13 |
| j-14 | A1 | A1 | A1 |
| j-15 | A1 | A2 | A2 |
| j-16 | A1 | A3 | A3 |
| j-17 | A1 | A4 | A4 |
| j-18 | A1 | A5 | A5 |
| j-19 | A1 | A6 | A6 |
| j-20 | A1 | A7 | A7 |
| j-21 | A1 | A8 | A8 |
| j-22 | A1 | A9 | A9 |
| j-23 | A1 | A10 | A10 |
| j-24 | A1 | A11 | A11 |
| j-25 | A1 | N2 | N1 |

(j)

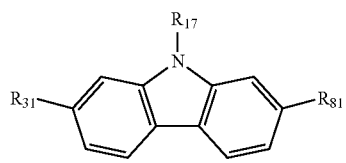

| Compound No. | R17 | R31 | R81 |
|---|---|---|---|
| j-26 | A1 | N2 | N3 |
| j-27 | A1 | N2 | N4 |
| j-28 | A1 | N2 | N5 |
| j-29 | A1 | N2 | N11 |
| j-30 | A1 | N2 | N13 |
| j-31 | A1 | N13 | N1 |
| j-32 | A1 | N13 | N2 |
| j-33 | A1 | N13 | N3 |
| j-34 | A1 | N13 | N4 |
| j-35 | A1 | N13 | N5 |
| j-36 | A1 | N13 | N11 |
| j-37 | A13 | N1 | N1 |
| j-38 | A13 | N2 | N2 |
| j-39 | A13 | N3 | N3 |
| j-40 | A13 | N4 | N4 |
| j-41 | A13 | N5 | N5 |
| j-42 | A13 | N6 | N6 |
| j-43 | A13 | N7 | N7 |
| j-44 | A13 | N8 | N8 |
| j-45 | A13 | N9 | N9 |
| j-46 | A13 | N10 | N10 |
| j-47 | A13 | N11 | N11 |
| j-48 | A13 | N12 | N12 |
| j-49 | A13 | N13 | N13 |
| j-50 | A5 | N13 | N13 |
| j-51 | A12 | N13 | N13 |
| j-52 | A5 | N3 | N3 |

(k)

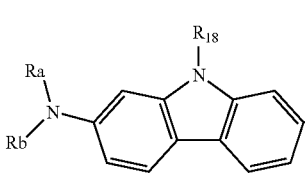

| Compound No. | R18 | Ra | Rb |
|---|---|---|---|
| k-1 | A1 | A1 | A1 |
| k-2 | A1 | A2 | A2 |
| k-3 | A1 | A3 | A3 |
| k-4 | A1 | A4 | A4 |
| k-5 | A1 | A5 | A5 |
| k-6 | A1 | A6 | A6 |
| k-7 | A1 | A7 | A7 |
| k-8 | A1 | A8 | A8 |
| k-9 | A1 | A9 | A9 |
| k-10 | A1 | A10 | A10 |
| k-11 | A1 | A11 | A11 |
| k-12 | A1 | A7 | A1 |
| k-13 | A1 | A7 | A2 |
| k-14 | A1 | A7 | A3 |
| k-15 | A1 | A7 | A4 |
| k-16 | A1 | A7 | A5 |
| k-17 | A1 | A7 | A6 |
| k-18 | A1 | A7 | A8 |
| k-19 | A1 | A7 | A9 |
| k-20 | A1 | A7 | A10 |
| k-21 | A1 | A7 | A11 |
| k-22 | A1 | A8 | A1 |
| k-23 | A1 | A8 | A2 |
| k-24 | A1 | A8 | A3 |
| k-25 | A1 | A8 | A4 |

(k)

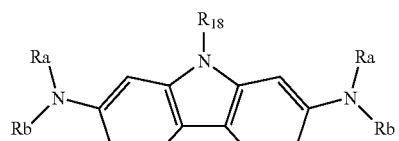

| Compound No. | R18 | Ra | Rb |
|---|---|---|---|
| k-26 | A1 | A8 | A5 |
| k-27 | A1 | A8 | A6 |
| k-28 | A1 | A8 | A7 |
| k-29 | A1 | A8 | A9 |
| k-30 | A1 | A8 | A10 |
| k-31 | A1 | A8 | A11 |
| k-32 | A13 | A1 | A1 |
| k-33 | A13 | A2 | A2 |
| k-34 | A13 | A3 | A3 |
| k-35 | A13 | A4 | A4 |
| k-36 | A13 | A5 | A5 |
| k-37 | A13 | A6 | A6 |
| k-38 | A13 | A7 | A7 |
| k-39 | A13 | A8 | A8 |
| k-40 | A13 | A9 | A9 |
| k-41 | A13 | A10 | A10 |
| k-42 | A13 | A11 | A11 |
| k-50 | A12 | A5 | A6 |

(l)

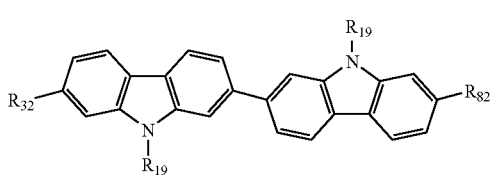

| Compound No. | R19 | R32 | R82 |
|---|---|---|---|
| l-1 | A1 | N1 | N1 |
| l-2 | A1 | N2 | N2 |
| l-3 | A1 | N3 | N3 |
| l-4 | A1 | N4 | N5 |
| l-5 | A1 | N5 | N5 |
| l-6 | A1 | A6 | N6 |
| l-7 | A1 | N7 | N7 |
| l-8 | A1 | N8 | N8 |
| l-9 | A1 | N9 | N9 |
| l-10 | A1 | N10 | N10 |
| l-11 | A1 | N11 | N11 |
| l-12 | A1 | N12 | N12 |
| l-13 | A1 | N13 | N13 |
| l-14 | A1 | Al | Al |
| l-15 | A1 | A2 | A2 |
| l-16 | A1 | A3 | A3 |
| l-17 | A1 | A4 | A4 |
| l-18 | A1 | A5 | A5 |
| l-19 | A1 | A6 | A6 |
| l-20 | A1 | A7 | A7 |
| l-21 | A1 | A8 | A8 |
| l-22 | A1 | A9 | A9 |
| l-23 | A1 | A10 | A10 |
| l-24 | A1 | A11 | A11 |
| l-25 | A1 | N1 | N1 |
| l-26 | A1 | N2 | N3 |
| l-27 | A1 | N2 | N4 |
| l-28 | A1 | N2 | N5 |
| l-29 | A1 | N2 | N11 |
| l-30 | A1 | N2 | N13 |
| l-31 | A1 | N13 | N1 |
| l-32 | A1 | N13 | N2 |
| l-33 | A1 | N13 | N3 |
| l-34 | A1 | N13 | N4 |

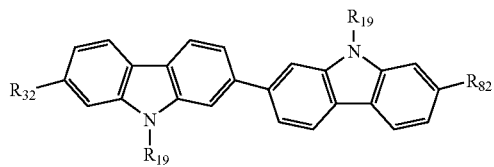

(l)

| Compound No. | $R_{19}$ | $R_{32}$ | $R_{82}$ |
|---|---|---|---|
| l-35 | A1 | N13 | N5 |
| l-36 | A1 | N13 | N11 |
| l-37 | A13 | N1 | N1 |
| l-38 | A13 | N2 | N2 |
| l-39 | A13 | N3 | N3 |
| l-40 | A13 | N4 | N4 |
| l-41 | A13 | N5 | N5 |
| l-42 | A13 | N6 | N6 |
| l-43 | A13 | N7 | N7 |
| l-44 | A13 | N8 | N8 |
| l-45 | A13 | N9 | N9 |
| l-46 | A13 | N10 | N10 |
| l-47 | A13 | N11 | N11 |
| l-48 | A13 | N12 | N12 |
| l-49 | A13 | N13 | N13 |

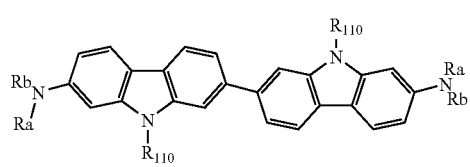

(m)

| Compound No. | $R_{110}$ | Ra | Rb |
|---|---|---|---|
| m-1 | A1 | A1 | A1 |
| m-2 | A1 | A2 | A2 |
| m-3 | A1 | A3 | A3 |
| m-4 | A1 | A4 | A4 |
| m-5 | A1 | A5 | A5 |
| m-6 | A1 | A6 | A6 |
| m-7 | A1 | A7 | A7 |
| m-8 | A1 | A8 | A8 |
| m-9 | A1 | A9 | A9 |
| m-10 | A1 | A10 | A10 |
| m-11 | A1 | A11 | A11 |
| m-12 | A1 | A7 | A1 |
| m-13 | A1 | A7 | A2 |
| m-14 | A1 | A7 | A3 |
| m-15 | A1 | A7 | A4 |
| m-16 | A1 | A7 | A5 |
| m-17 | A1 | A7 | A6 |
| m-18 | A1 | A7 | A8 |
| m-19 | A1 | A7 | A9 |
| m-20 | A1 | A7 | A10 |
| m-21 | A1 | A7 | A11 |
| m-22 | A1 | A8 | A1 |
| m-23 | A1 | A8 | A2 |
| m-24 | A1 | A8 | A3 |
| m-25 | A1 | A8 | A4 |
| m-26 | A1 | A8 | A5 |
| m-27 | A1 | A8 | A6 |
| m-28 | A1 | A8 | A7 |
| m-29 | A1 | A8 | A9 |
| m-30 | A1 | A8 | A10 |
| m-31 | A1 | A8 | A11 |
| m-32 | A13 | A1 | A1 |
| m-33 | A13 | A2 | A2 |
| m-34 | A13 | A3 | A3 |
| m-35 | A13 | A4 | A4 |
| m-36 | A13 | A5 | A5 |
| m-37 | A13 | A6 | A6 |

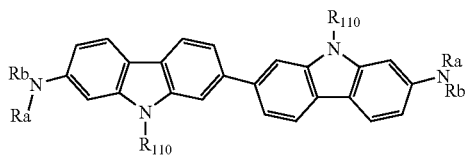

(m)

| Compound No. | $R_{110}$ | Ra | Rb |
|---|---|---|---|
| m-38 | A13 | A7 | A7 |
| m-39 | A13 | A8 | A8 |
| m-40 | A13 | A9 | A9 |
| m-41 | A13 | A10 | A10 |
| m-42 | A13 | A11 | A11 |

The molecular weight of the compound represented by formula (i) is preferably from 500 to 2,000, more preferably from 500 to 1,500. Thanks to the molecular weight of 500 to 2,000, vapor deposition of the material becomes possible and the heat resistance can be more elevated.

The compound represented by formula (i) may be synthesized according to a known method and, for example, can be synthesized by the method described in JP-A-2005-290000. In particular, a method of reacting a halogen. (preferably bromine)-substituted carbazole and an amino compound (e.g., N1 to N13) in the presence of a palladium catalyst (e.g., palladium(II) acetate), a ligand (e.g., trialkylphosphine, triarylphosphine) and a base (e.g., alkali carbonate, alkali alcoholate) by using an aromatic solvent (e.g., toluene, xylene) in a nitrogen flow under the heat-refluxing conditions at 60° C. for 3 to 24 hours is useful. The reaction product can be purified by appropriately using a normal method for collecting the objective substance (e.g., extraction, column chromatography, recrystallization) and further purified by vacuumization flowing of a small amount of inert gas (argon, nitrogen), sublimation or distillation.

The mobility of the compound represented by formula (i) as measured using a TOF method is preferably $1\times10^{-5}$ cm$^2$/Vs or more, more preferably $3\times10^{-5}$ cm$^2$/Vs or more, still more preferably $1\times10^{-4}$ cm$^2$/Vs or more, at an electric field intensity of $3\times10^5$ V/cm. The mobility according to TOF is determined by a general method, but, for example, a device is produced by sandwiching a compound film of about 1 μm in thickness with a transparent electrode on a glass substrate, an electric field of $1\times10^4$ to $2.5\times10^5$ V/cm is applied thereto, ultraviolet pulsed light is irradiated thereon, the generated photocurrent is measured by means of an oscilloscope, and the waveform of the photocurrent is analyzed, whereby the mobility can be obtained. The literature that should be referred to includes *Journal of Applied Physics*, Vol. 103, page 093705 (2008).

The amount used of the compound of formula (i) is, when used as a charge blocking layer, preferably from 10 to 300 nm, more preferably from 30 to 150 nm, still more preferably from 50 to 100 nm, in terms of a single layer. In the case of using the compound as a layer inserted between the photoelectric conversion layer and the charge blocking layer, the amount used is preferably 100 nm or less, more preferably 50 nm or less, still more preferably 20 nm or less, in terms of a single layer.

The charge blocking layer containing the compound of formula (i) may be either an electron blocking layer or a hole blocking layer but is preferably an electron blocking layer. This is because of the following, reasons. In the electron blocking layer, the portion in contact with the electrode needs to have sufficiently small Ea so as to inhibit electron injection from the electrode and in turn, Ip of that portion tends to be relatively small. Also, in the electron blocking layer, Ip of the portion in contact with the photoelectric conversion layer must be designed to be smaller than Ip of the hole transport portion in the photoelectric conversion layer so as to receive a hole into the electron blocking layer from the photoelectric conversion layer without energy barrier, and therefore, in many cases, the material constituting the electron blocking layer must be designed to have a relatively small Ip. In this case, when the material of formula (i) is used and put into contact with a material having large Ea in the photoelectric conversion layer, the source charge can be more reduced, despite the same Ip.

Incidentally, in the case of having a hole blocking layer as in the embodiment shown in FIG. 1B, an electron-accepting material is preferably used as the material for forming the hole blocking layer.

Examples of the electron-accepting material which can be used include an oxadiazole derivative such as 1,3-bis(4-tert-butylphenyl-1,3,4-oxadiazolyl)phenylene (OXD-7); an anthraquinodimethane derivative; a diphenylquinone derivative; bathocuproine, bathophenanthroline and their derivatives; a triazole compound; a tris(8-hydroxyquinolinato)aluminum complex; a bis(4-methyl-8-quinolinato)aluminum complex; a distyrylarylene derivative; and a silole compound. Also, a material having satisfactory electron transportability can be used even if it is not an electron-accepting organic material. A porphyrin-based compound, a styryl-based compound such as DCM (4-dicyanomethylene-2-methyl-6-(4-(dimethylaminostyryl))-4H-pyrane), and 4H-pyrane-based compound can be used.

Specifically, the following compounds are preferred. In specific examples below, Ea indicates the electron affinity (eV) of the material, and Ip indicates the ionization potential (eV) of the material.

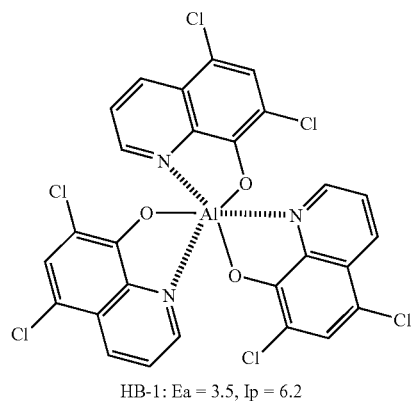

HB-1: Ea = 3.5, Ip = 6.2

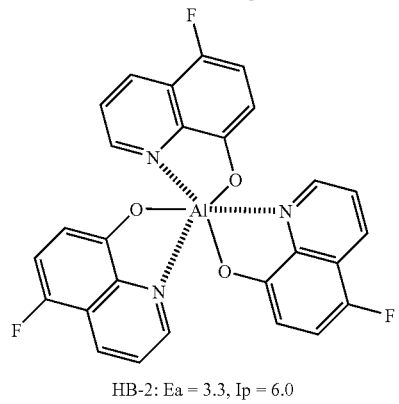

HB-2: Ea = 3.3, Ip = 6.0

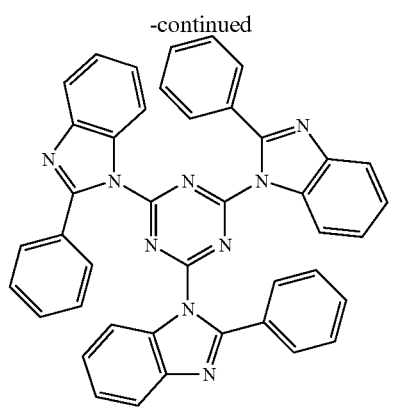

HB-3: Ea = 3.7, Ip = 7.2

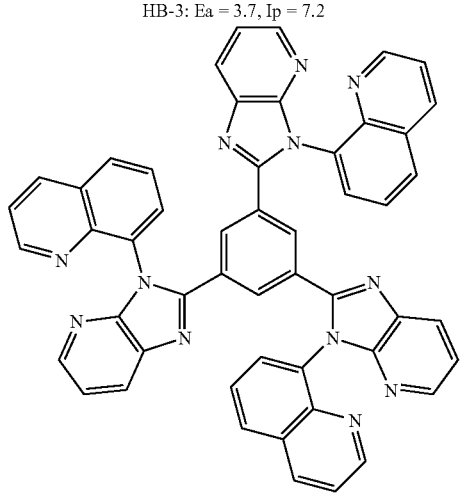

HB-4: Ea = 3.6, Ip = 7.6

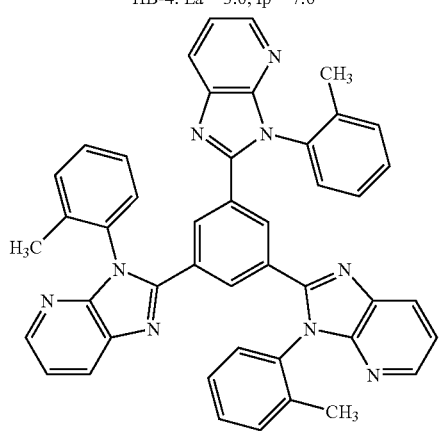

HB-5: Ea = 3.6, Ip = 7.6

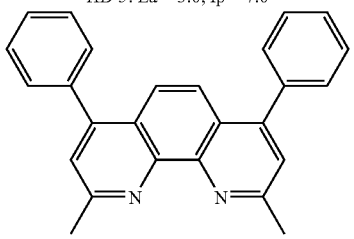

BCP: Ea = 3.2, Ip = 6.7

The charge blocking layer can be formed by vapor deposition. The vapor deposition may be either physical vapor deposition (PVD) or chemical vapor deposition (CVD), but physical vapor deposition such as vacuum deposition is preferred. In the case of depositing film by vacuum deposition, the production conditions such as vacuum degree and deposition temperature can be set according to conventional methods.

The thickness of the charge blocking layer is preferably from 10 to 300 nm, more preferably from 30 to 150 nm, still more preferably from 50 to 100 nm. With a thickness of 10 nm or more, a suitable dark current-reducing effect is obtained, and with a thickness of 300 nm or less, a suitable photoelectric conversion efficiency is obtained.

Incidentally, a plurality of layers may be formed for the charge blocking layer.

(Photoelectric Conversion Layer)

The organic material constituting the photoelectric conversion layer 12 preferably contains at least either one of a p-type organic semiconductor and an n-type organic semiconductor. Also, the effect of the present invention is greatly brought out particularly when the photoelectric conversion layer contains a material having an electron affinity (Ea) of 4.0 eV or more. The material having an electron affinity (Ea) of 4.0 eV or more includes the later-described n-type organic semiconductor.

The p-type organic semiconductor (compound) is a donor-type organic semiconductor (compound) and indicates an organic compound having a property of readily donating an electron, mainly typified by a hole-transporting organic compound. More specifically, this is an organic compound having a smaller ionization potential when two organic materials are used in contact. Accordingly, the donor-type organic compound may be any organic compound as long as it is an organic compound having an electron donating property. Examples of the compound which can be used include a triarylamine compound, a benzidine compound, a pyrazoline compound, a styrylamine compound, a hydrazone compound, a triphenylmethane compound, a carbazole compound, a polysilane compound, a thiophene compound, a phthalocyanine compound, a cyanine compound, a merocyanine compound, an oxonol compound, a polyamine compound, an indole compound, a pyrrole compound, a pyrazole compound, a polyarylene compound, a fused aromatic carbocyclic compound (e.g., naphthalene derivative, anthracene derivative, phenanthrene derivative, tetracene derivative, pyrene derivative, perylene derivative, fluoranthene derivative), and a metal complex having a nitrogen-containing heterocyclic compound as a ligand. The donor-type organic semiconductor is not limited to these compounds and, as described above, any organic compound having an ionization potential smaller than that of the organic compound used as an n-type (acceptor) compound may be used as the donor-type organic semiconductor.

Above all, a triarylamine compound is preferred.

Also, a compound represented by the following formula (I) is preferred, and a triarylamine compound represented by the following formula (I) is more preferred.

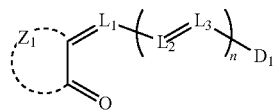

Formula (I)

In formula (I), $Z_1$ represents an atomic group necessary for forming a 5- or 6-membered ring, each of $L_1$, $L_2$ and $L_3$ represents an unsubstituted methine group or a substituted methine group, $D_1$ represents an atomic group, and n represents an integer of 0 or more.

$Z_1$ represents an atomic group necessary for forming a 5- or 6-membered ring. The ring formed is preferably a ring usually used as an acidic nucleus in merocyanine dyes, and specific examples thereof include the followings:

(a) 1,3-dicarbonyl nucleus: such as 1,3-indanedione nucleus, 1,3-cyclohexanedione, 5,5-dimethyl-1,3-cyclohexanedione and 1,3-dioxane-4,6-dione, (b) pyrazolinone nucleus: such as 1-phenyl-2-pyrazolin-5-one, 3-methyl-1-phenyl-2-pyrazolin-5-one and 1-(2-benzothiazoyl)-3-methyl-2-pyrazolin-5-one, (c) isoxazolinone nucleus: such as 3-phenyl-2-isoxazolin-5-one and 3-methyl-2-isoxazolin-5-one, (d) oxyindole nucleus: such as 1-alkyl-2,3-dihydro-2-oxyindole, (e) 2,4,6-triketohexahydropyrimidine nucleus: such as barbituric acid, 2-thiobarbituric acid and their derivatives, examples of the derivative include a 1-alkyl form such as 1-methyl and 1-ethyl, a 1,3-dialkyl form such as 1,3-dimethyl, 1,3-diethyl and 1,3-dibutyl, a 1,3-diaryl form such as 1,3-diphenyl, 1,3-di(p-chlorophenyl) and 1,3-di(p-ethoxycarbonylphenyl), a 1-alkyl-1-aryl form such as 1-ethyl-3-phenyl, and a 1,3-diheterocyclic substitution form such as 1,3-di(2-pyridyl), (f) 2-thio-2,4-thiazolidinedione nucleus: such as rhodanine and its derivatives, examples of the derivative include a 3-alkylrhodanine such as 3-methylrhodanine, 3-ethylrhodanine and 3-allylrhodanine, a 3-arylrhodanine such as 3-phenylrhodanine, and a 3-heterocyclic ring-substituted rhodanine such as 3-(2-pyridyl)rhodanine, (g) 2-thio-2,4-oxazolidinedione (2-thio-2,4-(3H,5H)-oxazoledione) nucleus: such as 3-ethyl-2-thio-2,4-oxazolidinedione, (h) thianaphthenone nucleus: such as 3(2H)-thianaphthenone-1,1-dioxide, (i) 2-thio-2,5-thiazolidinedione nucleus: such as 3-ethyl-2-thio-2,5-thiazolidinedione, (j) 2,4-thiazolidinedione nucleus: such as 2,4-thiazolidinedione, 3-ethyl-2,4-thiazolidinedione and 3-phenyl-2,4-thiazolidinedione, (k) thiazolin-4-one nucleus: such as 4-thiazolinone and 2-ethyl-4-thiazolinone, (l) 2,4-imidazolidinedione (hydantoin) nucleus: such as 2,4-imidazolidinedione and 3-ethyl-2,4-imidazolidinedione, (m) 2-thio-2,4-imidazolidinedione (2-thiohydantoin) nucleus: such as 2-thio-2,4-imidazolidinedione and 3-ethyl-2-thio-2,4-imidazolidinedione, (n) imidazolin-5-one nucleus: such as 2-propylmercapto-2-imidazolin-5-one, (o) 3,5-pyrazolidinedione nucleus: such as 1,2-diphenyl-3,5-pyrazolidinedione and 1,2-dimethyl-3,5-pyrazolidinedione, (p) benzothiophen-3-one nucleus: such as benzothiophen-3-one, oxobenzothiophen-3-one and dioxobenzothiophen-3-one, and (q) indanone nucleus: such as 1-indanone, 3-phenyl-1-indanone, 3-methyl-1-indanone, 3,3-diphenyl-1-indanone and 3,3-dimethyl-1-indanone.

The ring formed by $Z_1$ is preferably a 1,3-dicarbonyl nucleus, a pyrazolinone nucleus, a 2,4,6-triketohexahydropyrimidine nucleus (including a thioketone form, e.g., barbituric acid nucleus, 2-thiobarbituric acid nucleus), a 2-thio-2,4-thiazolidinedione nucleus, a 2-thio-2,4-oxazolidinedione nucleus, a 2-thio-2,5-thiazolidinedione nucleus, a 2,4-thiazolidinedione nucleus, a 2,4-imidazolidinedione nucleus, a 2-thio-2,4-imidazolidinedione nucleus, a 2-imidazolin-5-one nucleus, a 3,5-pyrazolidinedione nucleus, a benzothiophen-3-one nucleus or an indanone nucleus, more preferably a 1,3-dicarbonyl nucleus, a 2,4,6-triketohexahydropyrimidine nucleus (including a thioketone form, e.g., barbituric acid nucleus, 2-thiobarbituric acid nucleus), a 3,5-pyrazolidinedione nucleus, a benzothiophen-3-one nucleus or an indanone nucleus, still more preferably a 1,3-dicarbonyl nucleus or a 2,4,6-triketohexahydropyrimidine nucleus (including a thioketone form, e.g., barbituric acid nucleus, 2-thiobarbituric acid nucleus), yet still more preferably a 1,3-indanedione nucleus, a barbituric acid nucleus, a 2-thiobarbituric acid nucleus or a derivative thereof.

The ring formed by $Z_1$ is preferably a ring represented by the following formula:

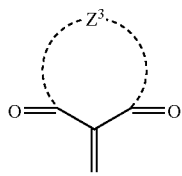

$Z^3$ represents an atomic group necessary for forming a 5- or 6-membered ring. $Z^3$ can be selected from the above-described rings formed by $Z_1$ and is preferably a 1,3-dicarbonyl nucleus or a 2,4,6-triketohexahydropyrimidine nucleus (including a thioketone form), more preferably a 1,3-indanedione nucleus, a barbituric acid nucleus, a 2-thiobarbituric acid nucleus or a derivative thereof.

It has been found that by controlling the interaction between acceptor parts, high hole transportability can be brought out when depositing film by vapor co-deposition with $C_{60}$. The interaction can be controlled by the structure of the acceptor part and introduction of a substituent working out to a steric hindrance. In the barbituric acid nucleus and 2-thiobarbituric acid nucleus, both two hydrogens at two N-positions are preferably substituted for by a substituent, whereby the intermolecular interaction can be controlled. Examples of the substituent include the later-described substituent W, and the substituent is preferably an alkyl group, more preferably a methyl group, an ethyl group, a propyl group or a butyl group.

In the case where the ring formed by $Z_1$ is a 1,3-indanedione nucleus, a group represented by formula (IV) or a group represented by formula (V) is preferred.

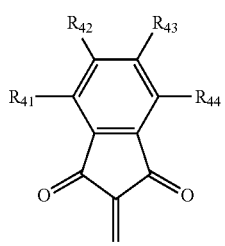

Formula (IV)

In formula (IV), each of $R_{41}$ to $R_{44}$ independently represents a hydrogen atom or a substituent;

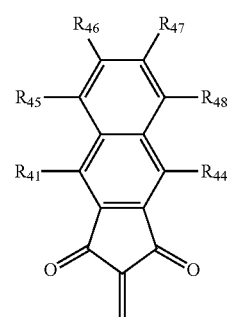

Formula (V)

In formula (V), each of $R_{41}$, $R_{44}$ and $R_{45}$ to $R_{48}$ independently represents a hydrogen atom or a substituent.

In the case of a group represented by formula (N), each of $R_{41}$ to $R_{44}$ independently represents a hydrogen atom or a substituent. As to the substituent, for example, those described as the substituent W may be applied. Adjacent members out of $R_{41}$ to $R_{44}$ may combine to form a ring, and it is preferred that $R_{42}$ and $R_{43}$ combine together to form a ring (for example, a benzene ring, a pyridine ring or a pyrazine ring). Preferably, all of $R_{41}$ to $R_{44}$ are a hydrogen atom.

The group represented by formula (IV) is preferably a group represented by formula (V). In the case of a group represented by formula (V), each of $R_{41}$, $R_{44}$ and $R_{45}$ to $R_{48}$ independently represents a hydrogen atom or a substituent. As to the substituent, for example, those described as the substituent W may be applied. It is preferred that all of $R_{41}$, $R_{44}$ and $R_{45}$ to $R_{48}$ are a hydrogen atom.

In the case where the ring formed by $Z_1$ is a 2,4,6-triketohexahydropyrimidine nucleus (including a thioketone form), a group represented by formula (VI) is preferred.

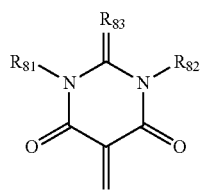

Formula (VI)

In formula (VI), each of $R_{81}$ and $R_{82}$ independently represents a hydrogen atom or a substituent, and $R_{83}$ represents an oxygen atom, a sulfur atom or a substituent.

In the case of a group represented by formula (VI), each of $R_{81}$ and $R_{82}$ independently represents a hydrogen atom or a substituent. As to the substituent, for example, those described as the substituent W may be applied. Each of $R_{81}$ and $R_{82}$ is independently, preferably an alkyl group, an aryl group or a heterocyclic group (e.g., 2-pyridyl), more preferably an alkyl group having a carbon number of 1 to 6 (e.g., methyl, ethyl, n-propyl, tert-butyl).

$R_{83}$ represents an oxygen atom, a sulfur atom or a substituent, but $R_{83}$ preferably represents an oxygen atom or a sulfur atom. The substituent is preferably a substituent with the bonding part being a nitrogen atom or a carbon atom. In the case of a nitrogen atom, the substituent is preferably an alkyl group (having a carbon number of 1 to 12) or an aryl group (having a carbon number of 6 to 12), and specific examples thereof include a methylamino group, an ethylamino group, a butylamino group, a hexylamino group, a phenylamino group and a naphthylamino group. In the case of a carbon atom, it may be sufficient if at least one electron-withdrawing group is further substituted. The electron-withdrawing group includes a carbonyl group, a cyano group, a sulfoxide group, a sulfonyl group and a phosphoryl group and preferably further has a substituent. Examples of this substituent include the substituent W. The substituent as $R_{83}$ is preferably what forms a 5- or 6-membered ring containing the carbon atom, and specific examples thereof include those having the following structures.

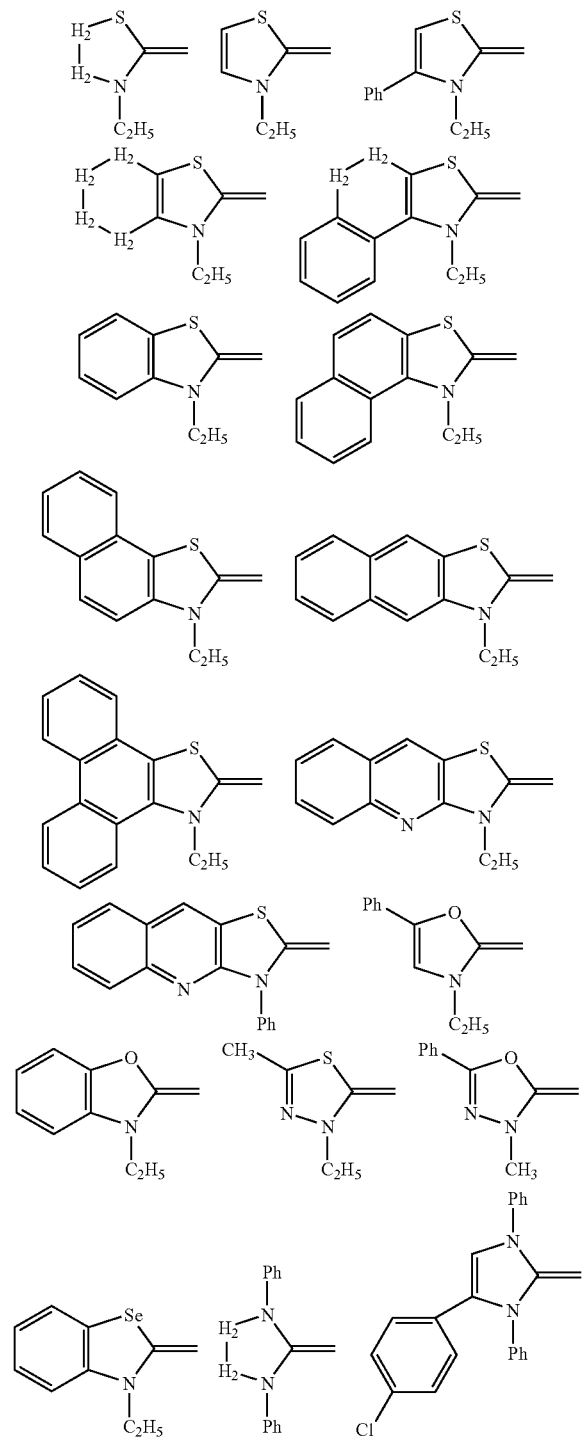

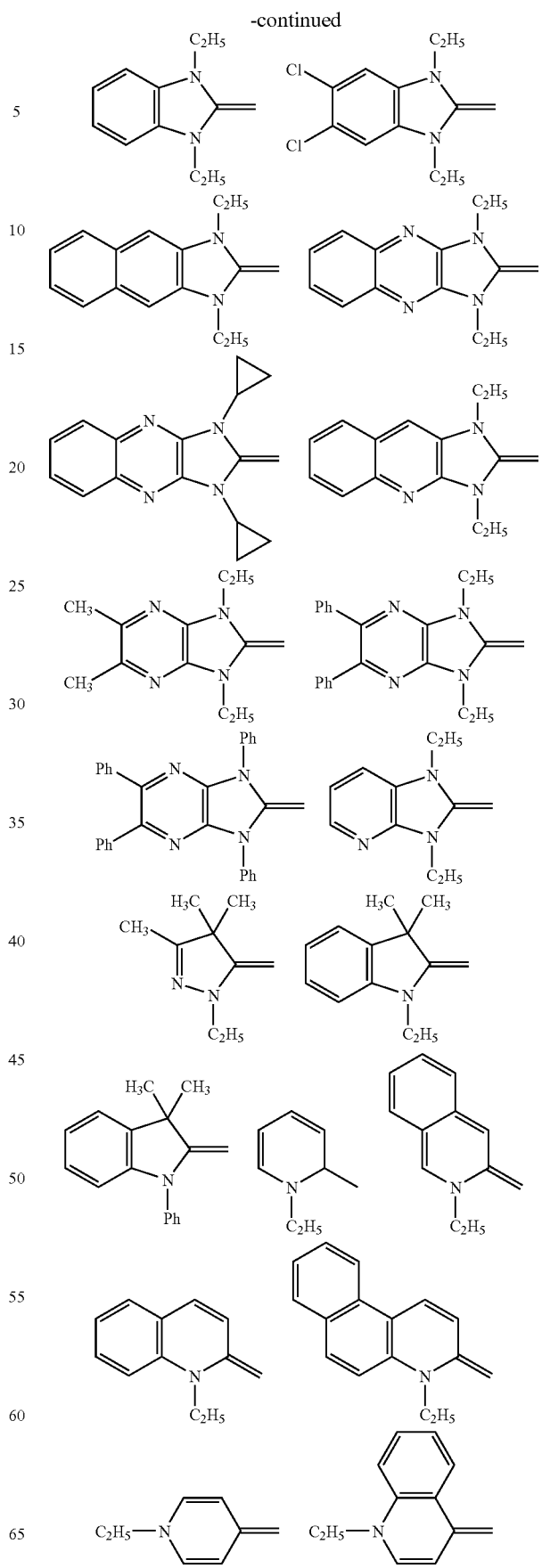

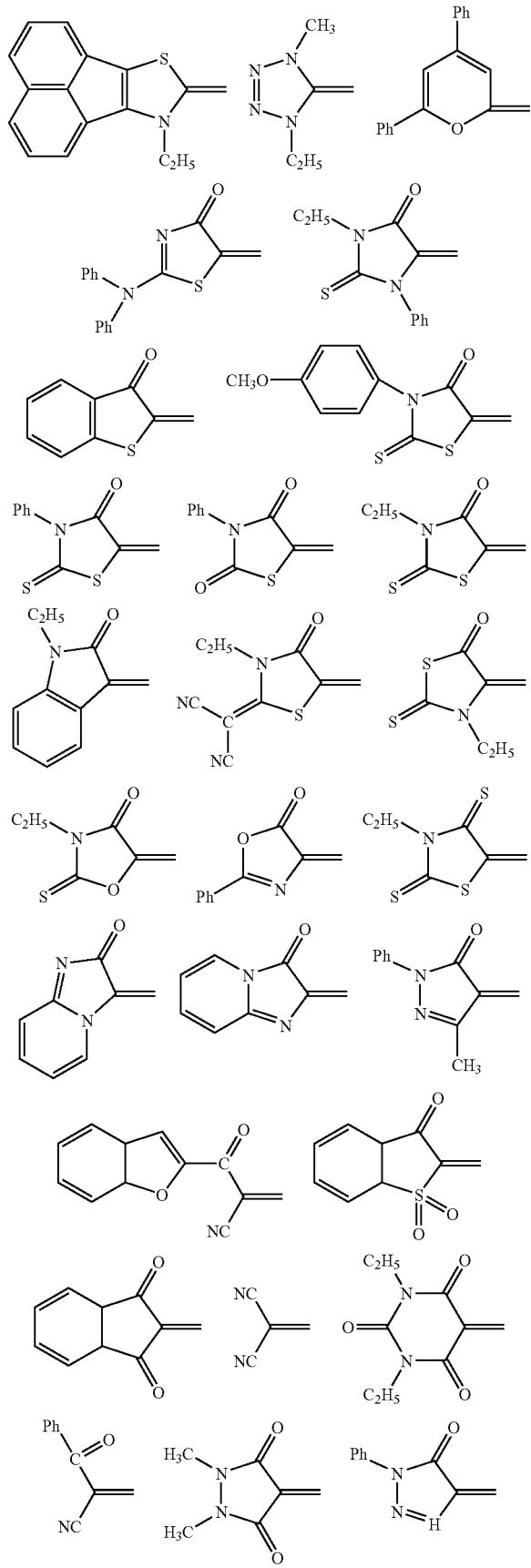
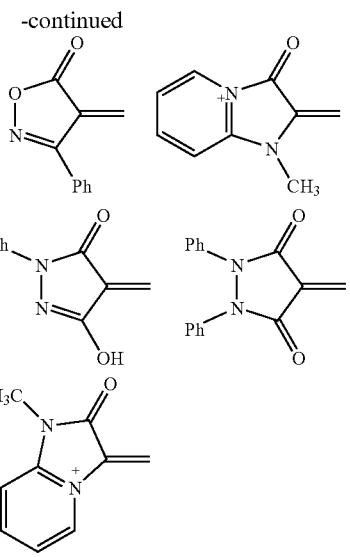

In the groups above, Ph indicates a phenyl group.

Each of $L_1$, $L_2$ and $L_3$ independently represents an unsubstituted methine group or a substituted methine group. Substituted methine groups may combine together to form a ring (for example, a 6-membered ring such as benzene ring). Examples of the substituent of the substituted methine group include the substituent W, and it is preferred that all of $L_1$, $L_2$ and $L_3$ are an unsubstituted methine group.

n represents an integer of 0 or more, preferably represents an integer of 0 to 3, and is more preferably 0. When n becomes large, the absorption wavelength region is allowed to reside on a long wavelength side, but the thermal decomposition temperature becomes low. From the standpoint of having appropriate absorption in the visible region and suppressing thermal decomposition at the vapor deposition of film, n is preferably 0.

$D_1$ represents an atomic group. $D_1$ is preferably a group containing —$NR^a(R^b)$, and it is more preferred that $D_1$ represents a —$NR^a(R^b)$-substituted aryl group (preferably a phenyl or naphthyl group which may be substituted). Each of $R^a$ and $R^b$ independently represents a hydrogen atom or a substituent, and examples of the substituent represented by $R^a$ and $R^b$ include the substituent W, but the substituent is preferably an aliphatic hydrocarbon group (preferably an alkyl or alkenyl group which may be substituted), an aryl group (preferably a phenyl group which may be substituted) or a heterocyclic group. The heterocyclic group is preferably a 5-membered ring such as furan, thiophene, pyrrole and oxadiazole.

In the case where each of $R^a$ and $R^b$ is a substituent (preferably an alkyl group or an alkenyl group), the substituent may form a ring (preferably a 6-membered ring) by combining with a hydrogen atom or a substituent in the aromatic ring (preferably benzene ring) structure of the —$NR^a(R^b)$-substituted aryl group. In this case, $D_1$ is preferably represented by formula (VIII), (IX) or (X) described later.

The substituents $R^a$ and $R^b$ may combine together to form a ring (preferably a 5- or 6-membered ring, more preferably a 6-membered ring), or each of $R^a$ and $R^b$ may combine with a substituent in L (that indicates any one of $L_1$, $L_2$ and $L_3$) to form a ring (preferably a 5- or 6-membered ring, more preferably a 6-membered ring).

$D_1$ is preferably an aryl group (preferably a phenyl group) substituted with an amino group at the para-position. In this case, $D_1$ is preferably represented by the following formula (II). The amino group may be substituted. Examples of the substituent of the amino group include the substituent W, and an aliphatic hydrocarbon group (preferably an alkyl group which may be substituted) is preferred. The amino group is preferably an amino group substituted with two aryl groups, a so-called diaryl group-substituted amino group. In this case, $D_1$ is preferably represented by the following formula (III). The substituent (preferably an alkyl or alkenyl group which may be substituted) of the amino group may combine with a hydrogen atom or a substituent in the aromatic ring (preferably benzene ring) structure of the aryl group to form a ring (preferably a 6-membered ring).

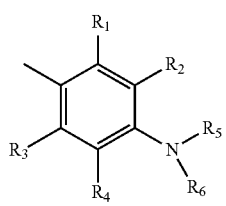

Formula (II)

In formula (II), wherein each of $R_1$ to $R_6$ independently represents a hydrogen atom or a substituent, and $R_1$ and $R_2$, $R_3$ and $R_4$, $R_5$ and $R_6$, $R_2$ and $R_5$, or $R_4$ and $R_6$ may combine together to form a ring.

Formula (III)

In formula (III), each of $R_{11}$ to $R_{14}$, $R_{20}$ to $R_{24}$ and $R_{30}$ to $R_{34}$ independently represents a hydrogen atom or a substituent, and respective members out of $R_{11}$ to $R_{14}$, $R_{20}$ to $R_{24}$, and $R_{30}$ to $R_{34}$ may combine together to form a ring.

In the case where each of $R^a$ and $R^b$ is an aliphatic hydrocarbon group, an aryl group or a heterocyclic group, the substituent is preferably an alkyl group, an alkenyl group, an aryl group, an alkoxy group, an aryloxy group, an acyl group, an alkoxycarbonyl group, an aryloxycarbonyl group, an acylamino group, a sulfonylamino group, a sulfonyl group, a silyl group or an aromatic heterocyclic group, more preferably an alkyl group, an alkenyl group, an aryl group, an alkoxy group, an aryloxy group, a silyl group or an aromatic heterocyclic group, still more preferably an alkyl group, an aryl group, an alkoxy group, an aryloxy group, a silyl group or an aromatic heterocyclic group. As for specific examples, those described as the substituent W may be applied.

Each of $R^a$ and $R^b$ is preferably an alkyl group, an aryl group or an aromatic heterocyclic group. Each of $R^a$ and $R^b$ is more preferably an alkyl group, an alkylene group forming a ring by combining with L, or an aryl group, still more preferably an alkyl group having a carbon number of 1 to 8, an alkylene group forming a 5- or 6-membered ring by combining with L, or a substituted or unsubstituted phenyl group, yet still more preferably an alkyl group having a carbon number of 1 to 8, or a substituted or unsubstituted phenyl group.

It is also preferred that $D_1$ is represented by the following formula (VII).

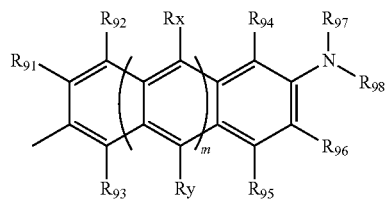

Formula (VII)

In formula (VII), each of $R_{91}$ to $R_{98}$ independently represents a hydrogen atom or a substituent; m represents an integer of 0 or more, and m is preferably 0 or 1; each of Rx and Ry independently represents a hydrogen atom or a substituent and when m is an integer of 2 or more, Rx's or Ry's bonded to respective 6-membered rings may be different substituents; $R_{91}$ and $R_{92}$, $R_{92}$ and Rx, Rx and $R_{94}$, $R_{94}$ and $R_{97}$, $R_{93}$ and Ry, Ry and $R_{95}$, $R_{95}$ and $R_{96}$, or $R_{97}$ and $R_{98}$ may independently combine together to form a ring; and the bonding part to $L_3$ (when n is 0, to $L_1$) may be the position of $R_{91}$, $R_{92}$ or $R_{93}$ and in this case, the substituent or hydrogen atom corresponding to $R_{91}$, $R_{92}$ or $R_{93}$ may be bonded to the site denoted as the bonding part to $L_3$ in formula (VII) and adjacent R's may combine together to form a ring. The expression "adjacent R's may combine together to form a ring" as used herein indicates that, for example, in the case where $R_{91}$ is the bonding part to $L_3$ (when n is 0, to $L_1$), assuming that $R_{90}$ is bonded to the bonding part of formula (VII), $R_{90}$ and $R_{93}$ may combine to form a ring; in the case where $R_{92}$ is the bonding part to $L_3$ (when n is 0, to $L_1$), assuming that $R_{90}$ is bonded to the bonding part of formula (VII), $R_{90}$ and $R_{91}$, or $R_{90}$ and $R_{93}$ may combine together to form a ring; and in the case where $R_{93}$ is the bonding part to $L_3$ (when n is 0, to $L_1$), assuming that $R_{90}$ is bonded to the bonding part of formula (VII), $R_{90}$ and $R_{91}$, or $R_{91}$ and $R_{92}$ may combine together to form a ring.

The ring above is preferably a benzene ring.

Examples of the substituent of $R_{91}$ to $R_{98}$, Rx and Ry include the substituent W.

All of $R_{91}$ to $R_{96}$ are preferably a hydrogen atom, and both Rx and Ry are preferably a hydrogen atom. It is preferred that $R_{91}$ to $R_{96}$ are a hydrogen atom and at the same time, Rx and Ry are a hydrogen atom.

Each of $R_{97}$ and $R_{98}$ is independently, preferably a phenyl group which may be substituted. Examples of the substituent include the substituent W, with an unsubstituted phenyl group being preferred.

m represents an integer of 0 or more and is preferably 0 or 1.

It is also preferred that $D_1$ is a group represented by formula (VIII), (IX) or (X).

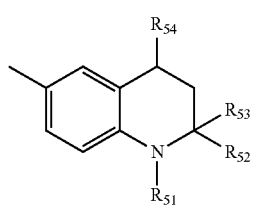

Formula (VIII)

In formula (VIII), each of $R_{51}$ to $R_{54}$ independently represents hydrogen or a substituent. Examples of the substituent include the substituent W. $R_{52}$ and $R_{53}$, or $R_{51}$ and $R_{52}$ may combine together to form a ring.

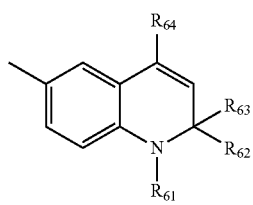

Formula (IX)

In formula (IX), each of $R_{61}$ to $R_{64}$ independently represents hydrogen or a substituent. Examples of the substituent include the substituent W. $R_{62}$ and $R_{63}$, or $R_{61}$ and $R_{62}$ may combine together to form a ring.

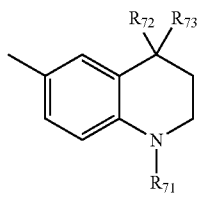

Formula (X)

In formula (X), each of $R_{71}$ to $R_{74}$ independently represents hydrogen or a substituent. Examples of the substituent include the substituent W. $R_{72}$ and $R_{73}$ may combine together to form a ring.

$D_1$ is more preferably a group represented by formula (II) or (III).

In formula (II), each of $R_1$ to $R_6$ independently represents a hydrogen atom or a substituent, and $R_1$ and $R_2$, $R_3$ and $R_4$, $R_5$ and $R_6$, $R_2$ and $R_5$, or $R_4$ and $R_6$ may combine together to form a ring.

Examples of the substituent in $R_1$ to $R_4$ include the substituent W. It is preferred that $R_1$ to $R_4$ are a hydrogen atom or that $R_2$ and $R_5$, or $R_4$ and $R_6$ form a 5-membered ring, and more preferably, all of $R_1$ to $R_4$ are a hydrogen atom.

Examples of the substituent in $R_5$ and $R_6$ include the substituent W. Among the substituents, a substituted or unsubstituted aryl group is preferred. The substituent of the substituted aryl is preferably an alkyl group (e.g., methyl, ethyl) or an aryl group (e.g., phenyl, naphthylene, phenanthryl, anthryl). Each of $R_5$ and $R_6$ is preferably a phenyl group, an alkyl-substituted phenyl group, a phenyl-substituted phenyl group, a naphthylene group, a phenanthryl group, an anthryl group, or a fluorenyl group (preferably 9,9'-dimethyl-2-fluorenyl group).

In formula (III), each of $R_1$, to $R_{14}$, $R_{20}$ to $R_{24}$ and $R_{30}$ to $R_{34}$ independently represents a hydrogen atom or a substituent. Also, respective members out of $R_{11}$ to $R_{14}$, $R_{20}$ to $R_{24}$ and $R_{30}$ to $R_{34}$ may combine together to form a ring. Examples of the ring formation include a case where $R_{11}$ and $R_{12}$, or $R_{13}$ and $R_{14}$ combine to form a benzene ring, a case where two adjacent members out of $R_{20}$ to $R_{24}$ ($R_{24}$ and $R_{23}$, $R_{23}$ and $R_{20}$, $R_{20}$ and $R_{21}$, or $R_{21}$ and $R_{22}$) combine to form a benzene ring, a case where two adjacent members out of $R_{30}$ to $R_{34}$ ($R_{34}$ and $R_{33}$, $R_{33}$ and $R_{30}$, $R_{30}$ and $R_{31}$, or $R_{31}$ and $R_{32}$) combine to form a ring, and a case where $R_{22}$ and $R_{34}$ combine to form a 5-membered ring together with the N atom.

Examples of the substituent represented by $R_{11}$ to $R_{14}$, $R_{20}$ to $R_{24}$ and $R_{30}$ to $R_{34}$ include the substituent W. The substituent is preferably an alkyl group (e.g., methyl, ethyl) or an aryl group (e.g., phenyl naphtyl), and such a group may further substituted with a substituent W (preferably an aryl group). Above all, a case where $R_{20}$ and $R_{30}$ are a substituent is preferred, and a case where at the same time, the others $R_{11}$ to $R_{14}$, $R_{21}$ to $R_{24}$ and $R_{31}$ to $R_{34}$ are a hydrogen atom is more preferred.

The compound represented by formula (I) is a compound described in JP-A-2000-297068, and the compounds not described in this patent publication can also be produced according to the synthesis methods described therein.

Specific examples of the compound represented by formula (I) are set forth below, but the present invention is not limited thereto.

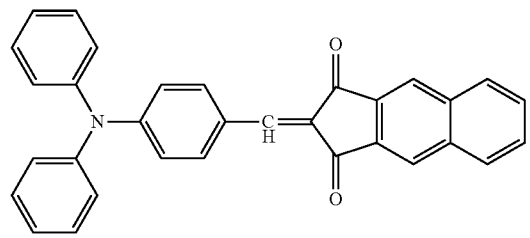

(1)

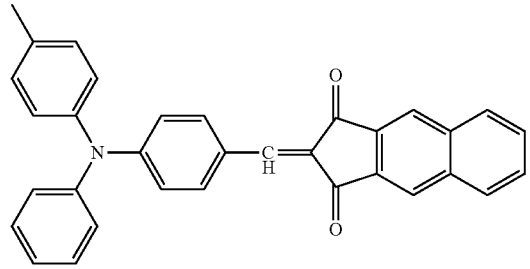

(2)

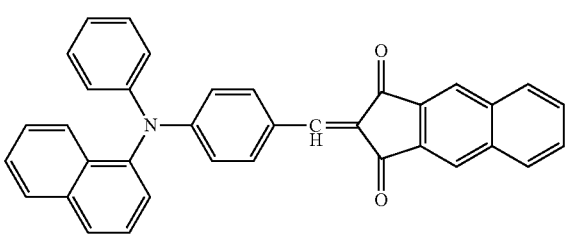

(3)

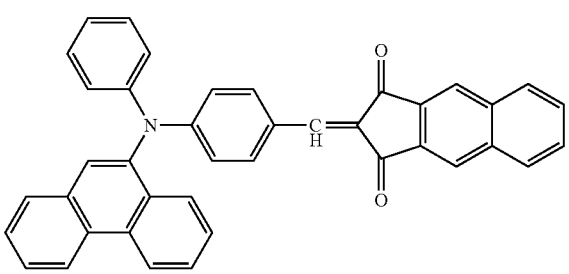

(4)

-continued
(5)
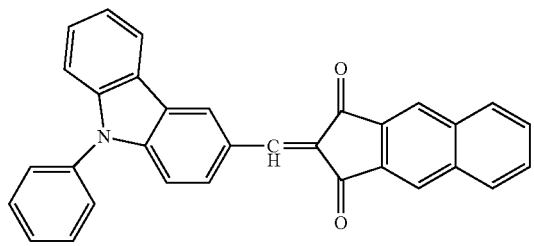
(6)
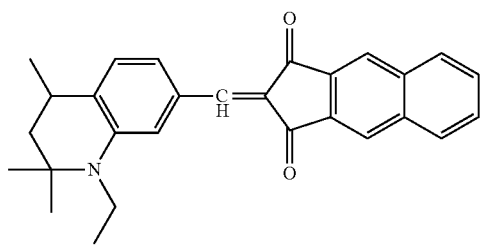
(7)
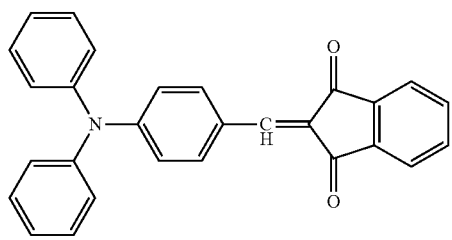
(8)
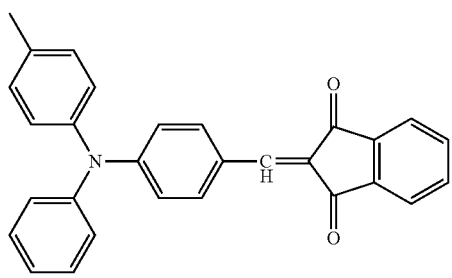
(9)
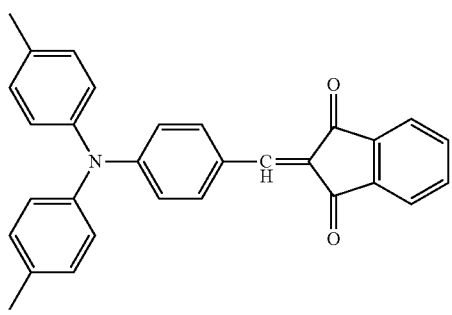
(10)
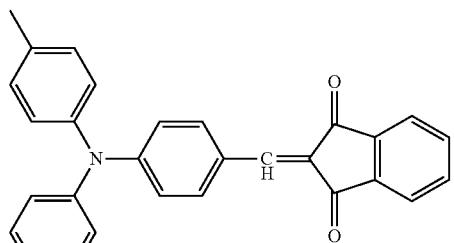
(11)
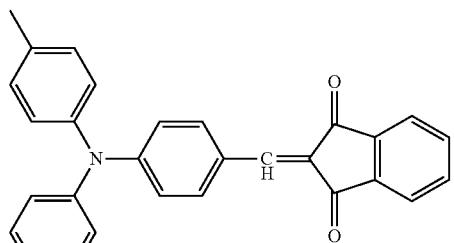
(12)
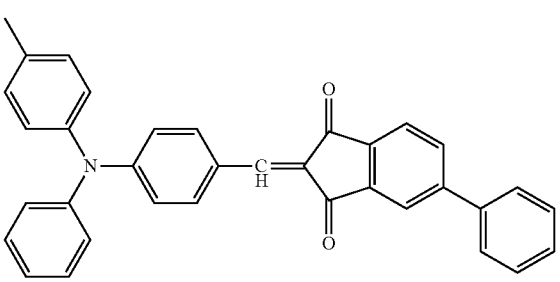
(13)
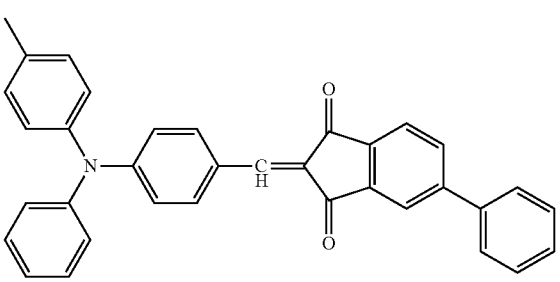
(14)
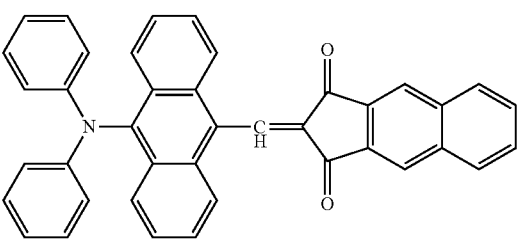

45
-continued
(15)
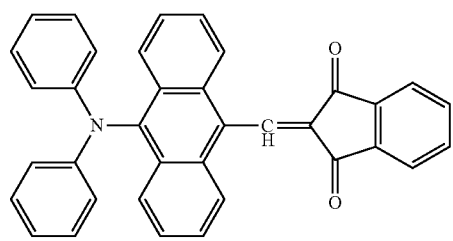
(16)
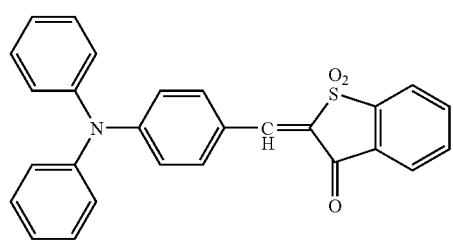
(17)
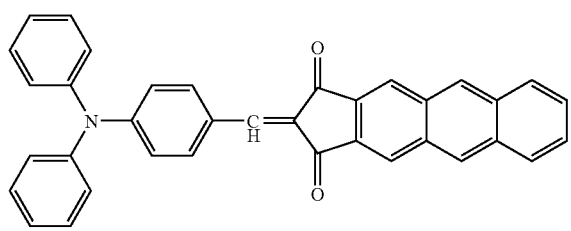
(18)
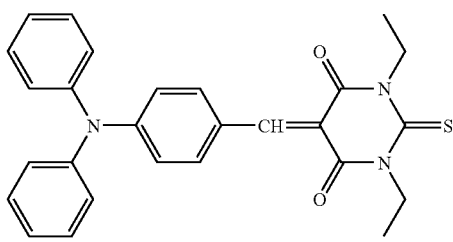
(19)
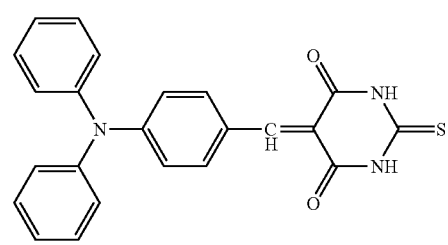
(20)
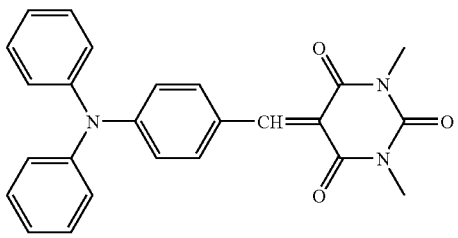
46
-continued
(21)
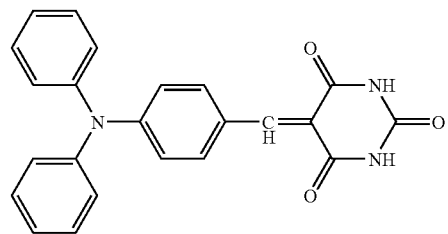
(22)
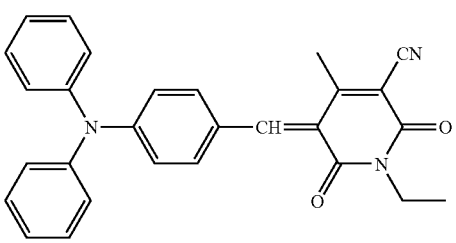
(23)
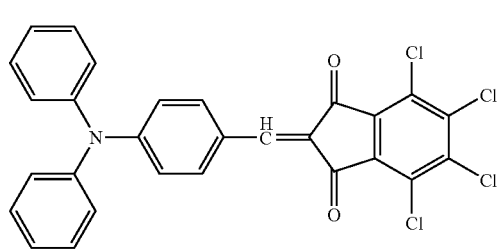
(24)
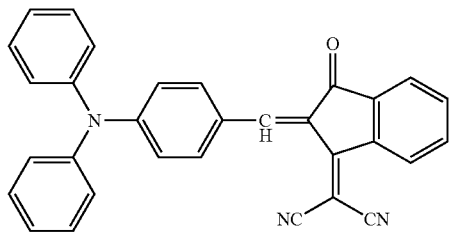
(25)
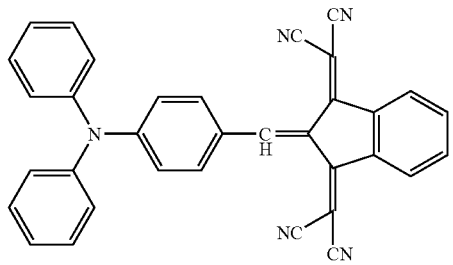
(26)
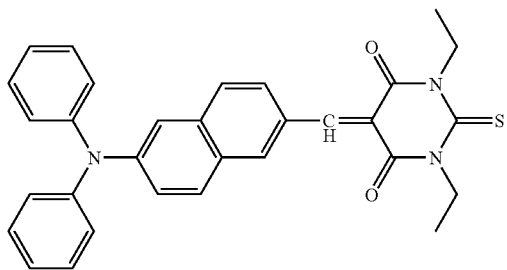

(27)
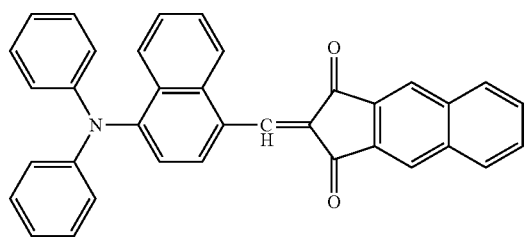
(28)
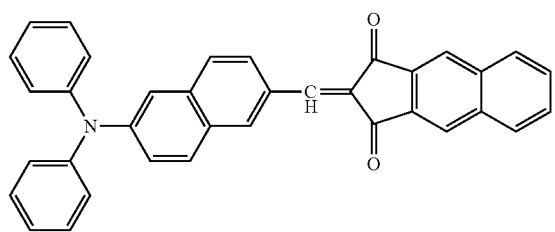
(29)
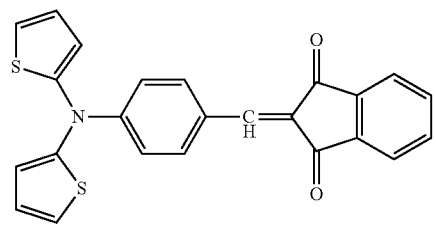
(30)
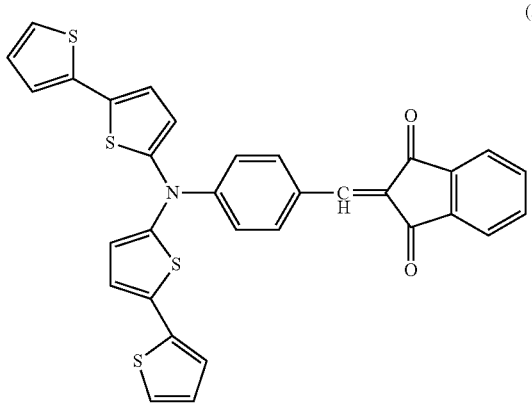
(31)
(32)
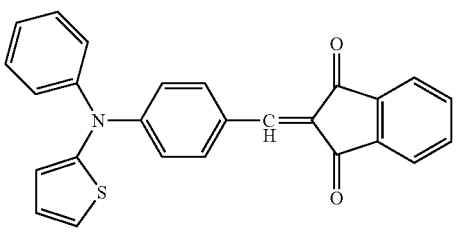
(33)
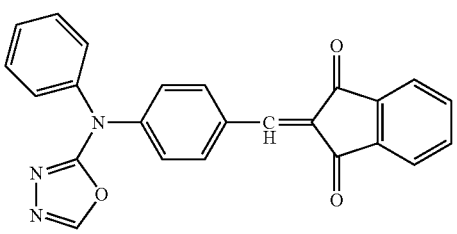
(34)
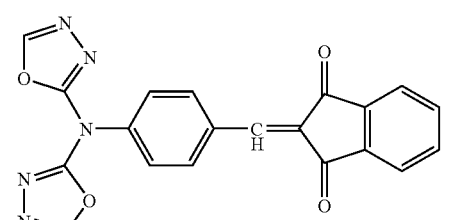
(35)
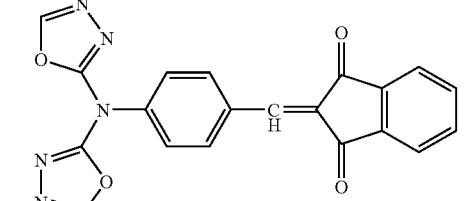
(36)
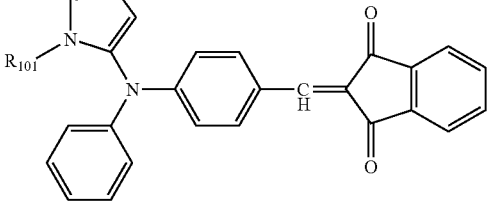
(37)
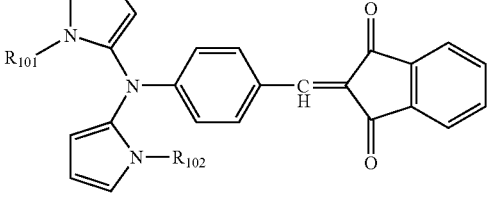
(38)
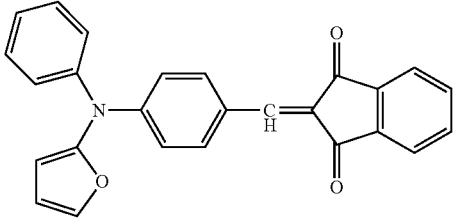
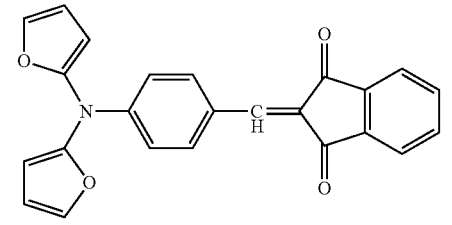

-continued
(39)
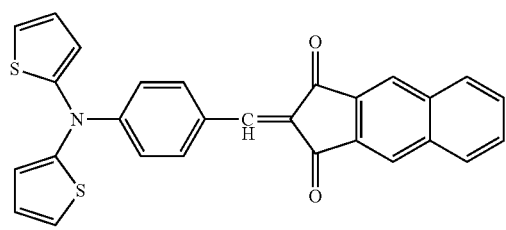
(40)
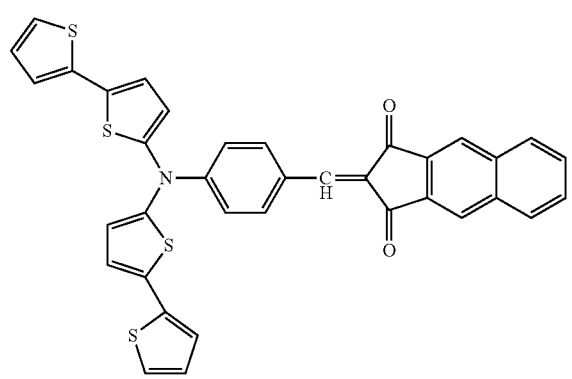
(41)
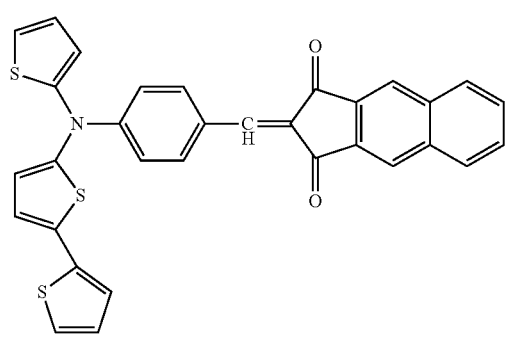
(42)
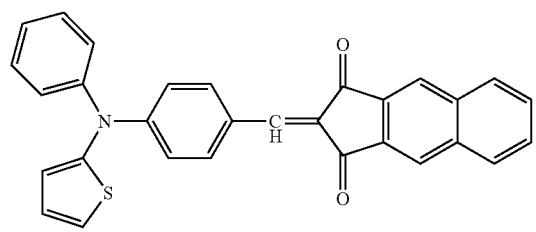
(43)
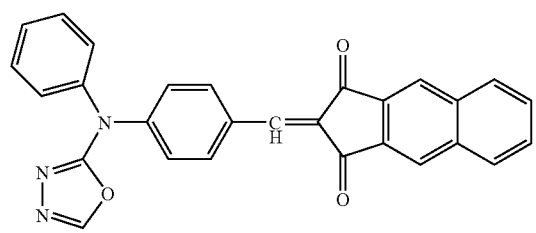
-continued
(44)
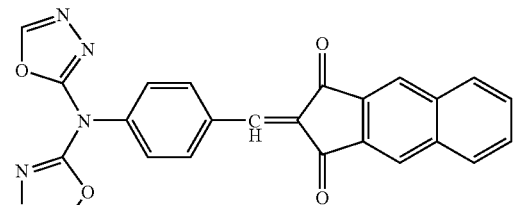
(45)
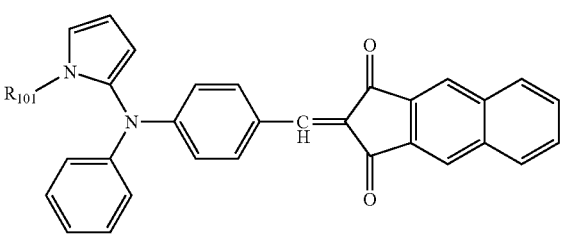
(46)
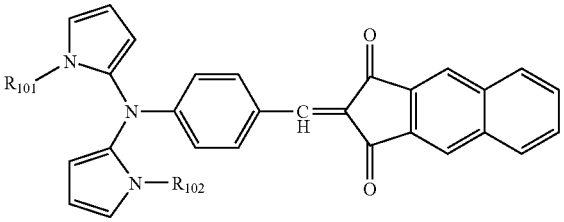
(47)
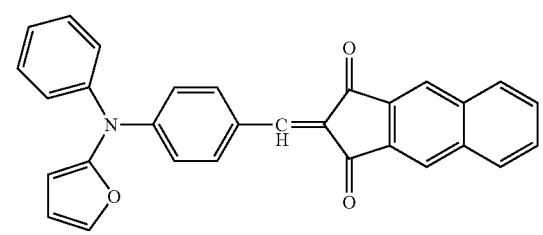
(48)
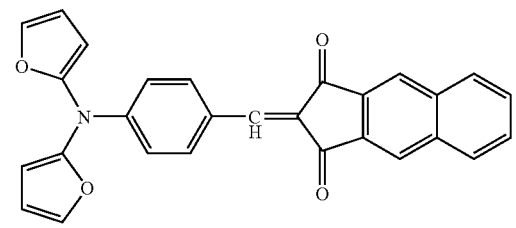
(49)
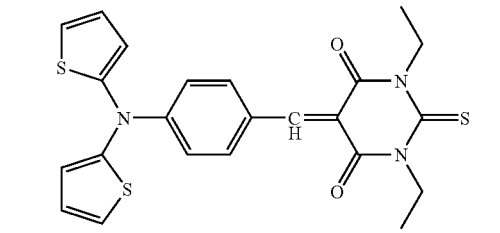

-continued
(50)
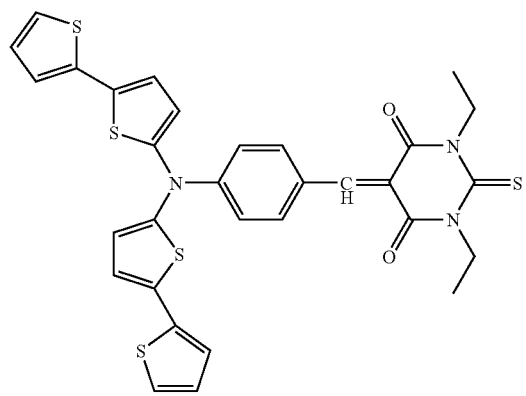
(51)
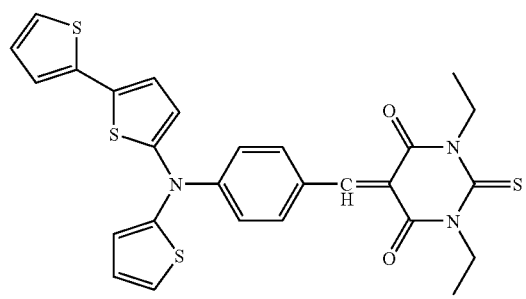
(52)
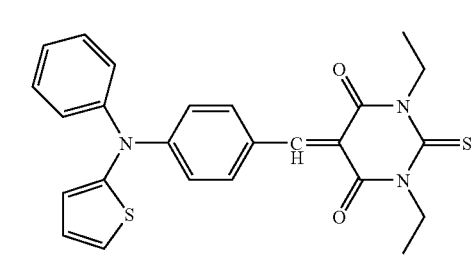
(53)
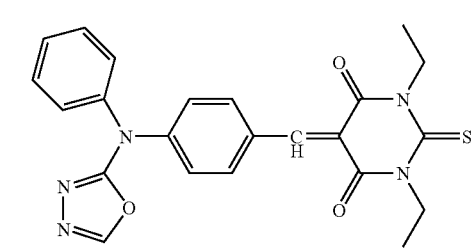
(54)
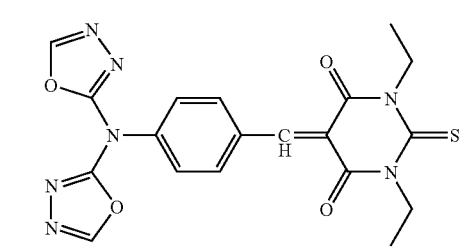
-continued
(55)
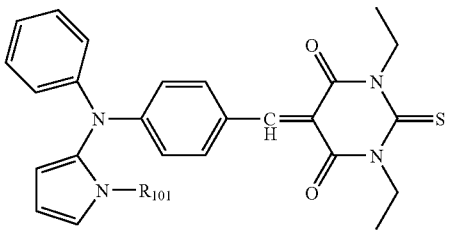
(56)
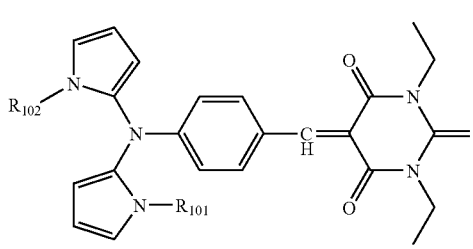
(57)
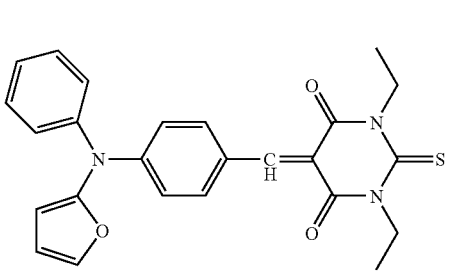
(58)
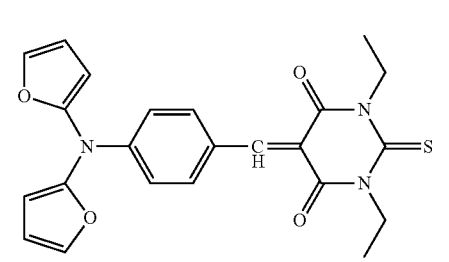
(59)
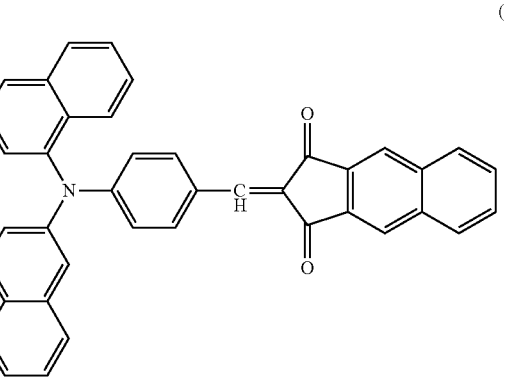

(60)
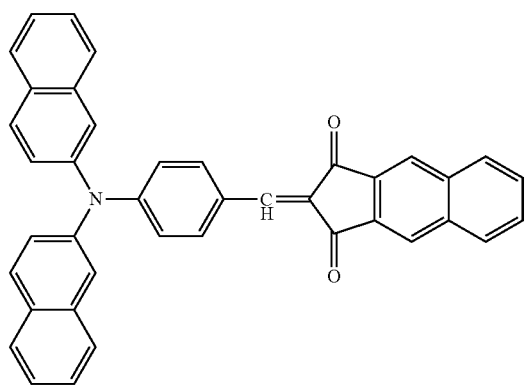
(61)
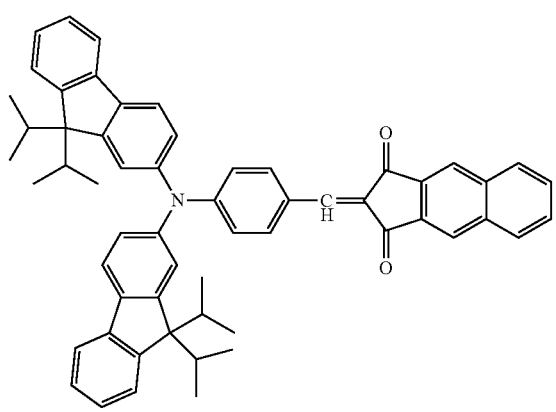
(62)
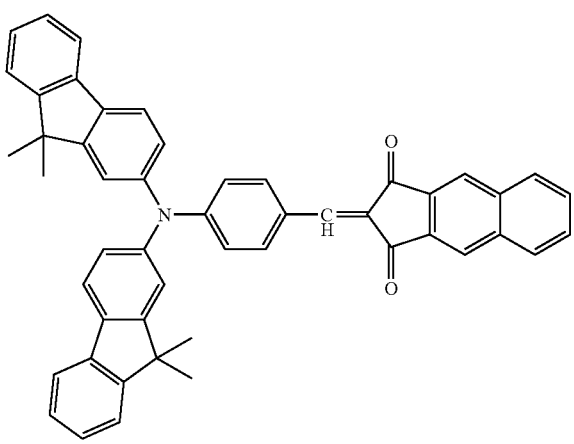
(63)
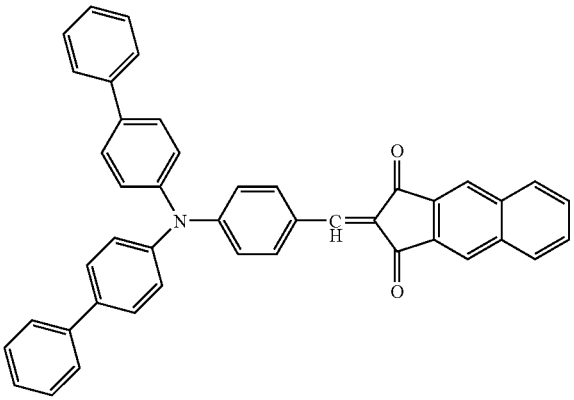
(64)
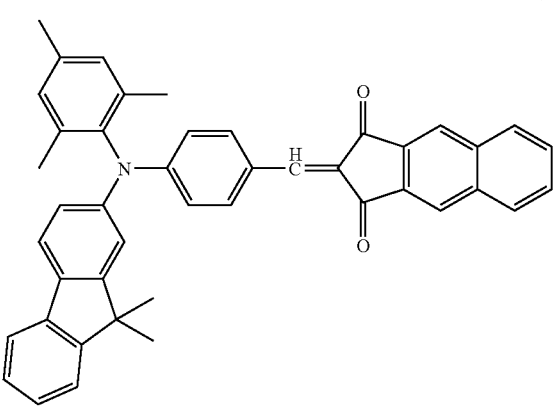
(65)
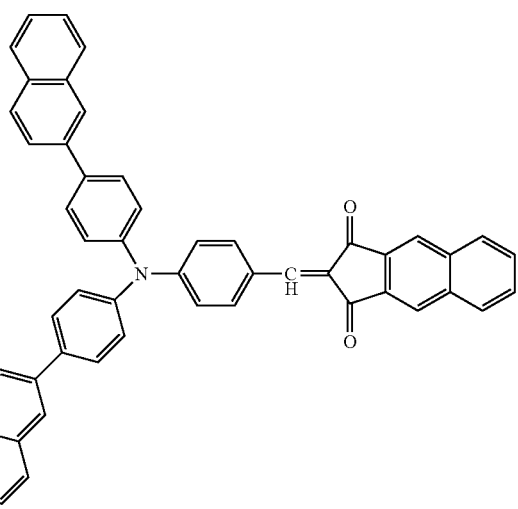

(66)
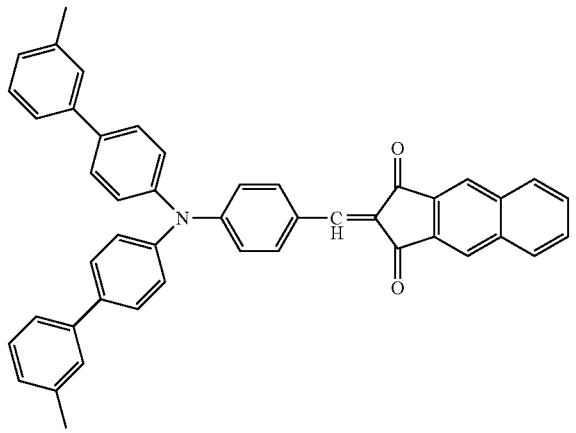

(67)
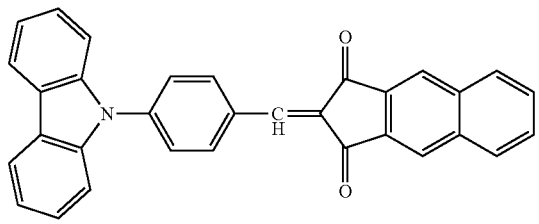

(68)
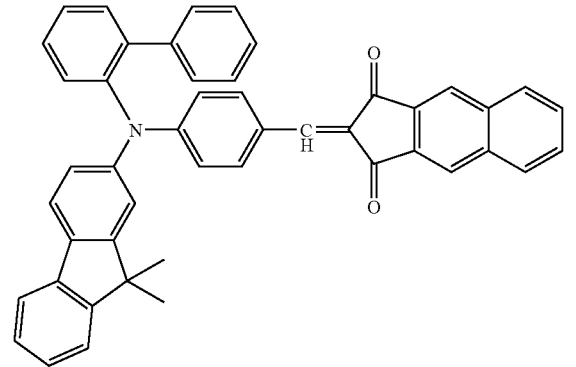

(69)
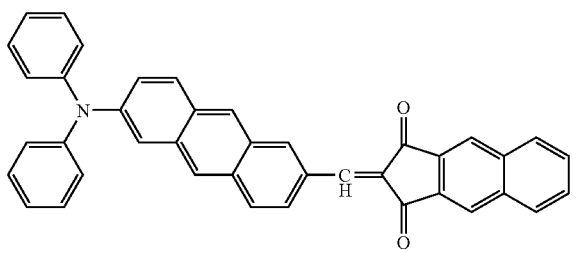

In the compounds illustrated above, each of $R_{101}$ and $R_{102}$ independently represents a hydrogen atom or a substituent. Examples of the substituent include the substituent W, and the substituent is preferably an alkyl group or an aryl group.

The n-type organic semiconductor (compound) is an acceptor-type organic semiconductor (compound) and indicates an organic compound having a property of readily accepting an electron, mainly typified by an electron-transporting organic compound. More specifically, this is an organic compound having a larger electron affinity when two organic compounds are used in contact.

Accordingly, for the acceptor-type organic compound, any organic compound can be used as long as it is an organic compound having an electron accepting property. Examples thereof include a fused aromatic carbocyclic compound (naphthalene, anthracene, fullerene, phenanthrene, tetracene, pyrene, perylene, fluoranthene, and derivatives thereof), a 5- to 7-membered heterocyclic compound containing a nitrogen atom, an oxygen atom or a sulfur atom (e.g., pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyralidine, pyrrolopyridine, thiadiazolopyridine, dibenzazepine, tribenzazepine), a polyarylene compound, a fluorene compound, a cyclopentadiene compound, a silyl compound, and a metal complex having a nitrogen-containing heterocyclic compound as a ligand. The acceptor-type organic semiconductor is not limited to these compounds and, as described above, any organic compound having an electron affinity larger than that of the organic compound used as the donor-type organic compound may be used as the acceptor-type organic semiconductor.

As for the n-type organic semiconductor, a fullerene or a fullerene derivative is preferably used.

The fullerene indicates fullerene $C_{60}$, fullerene $C_{70}$, fullerene $C_{76}$, fullerene $C_{78}$, fullerene $C_{80}$, fullerene $C_{82}$, fullerene $C_{84}$, fullerene $C_{90}$, fullerene $C_{96}$, fullerene $C_{240}$, fullerene $C_{540}$, a mixed fullerene or a fullerene nanotube, and the fullerene derivative indicates a compound obtained by adding a substituent to such a fullerene. The substituent is preferably an alkyl group, an aryl group or a heterocyclic group.

The following compounds are preferred as the fullerene derivative.

(1)
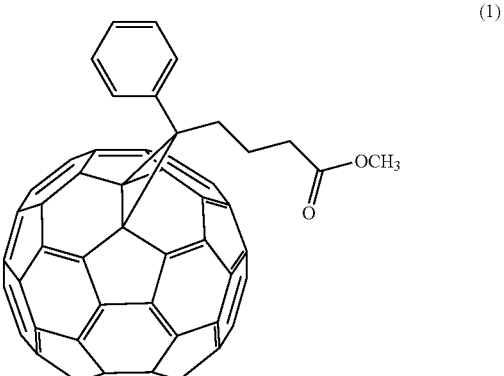

(2)
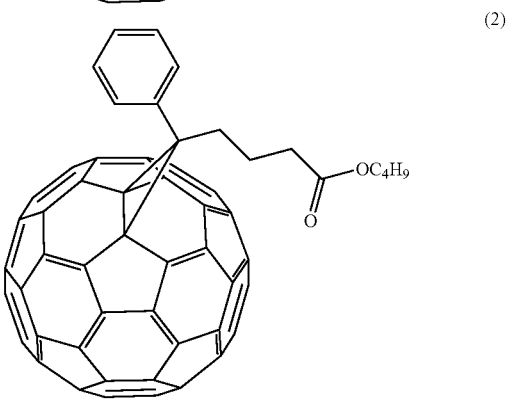

57
-continued
(3)
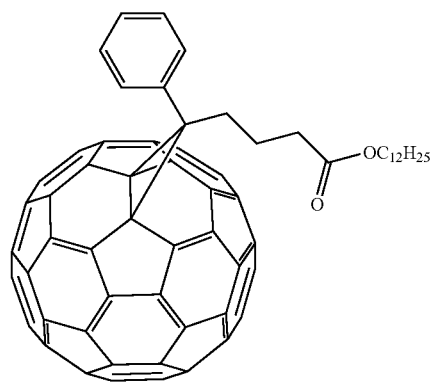
(4)
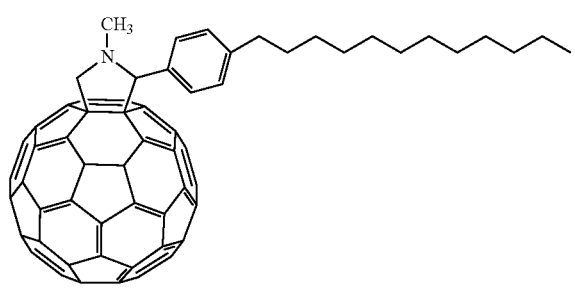
(5)
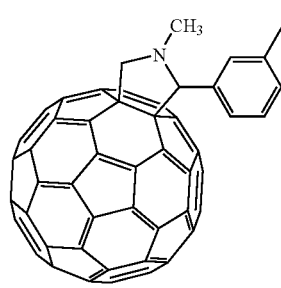
58
-continued
(6)
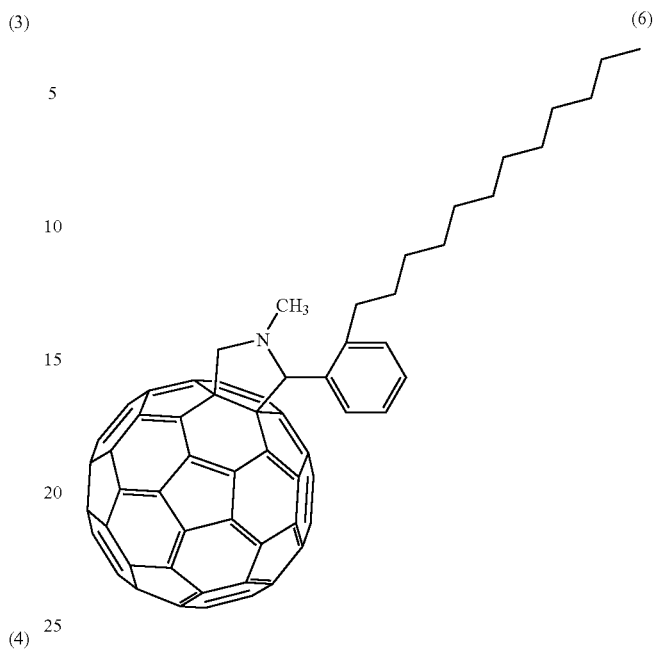
(7)
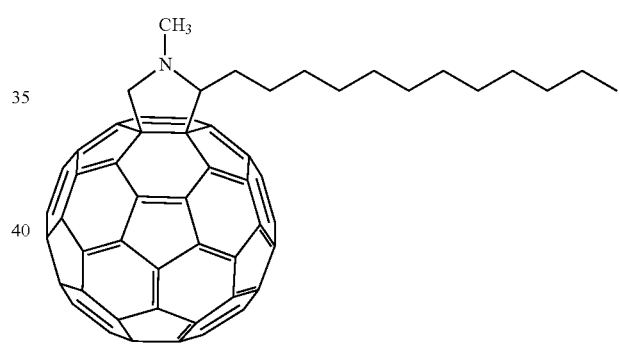
(8)
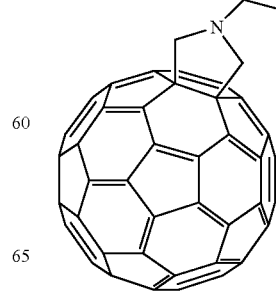

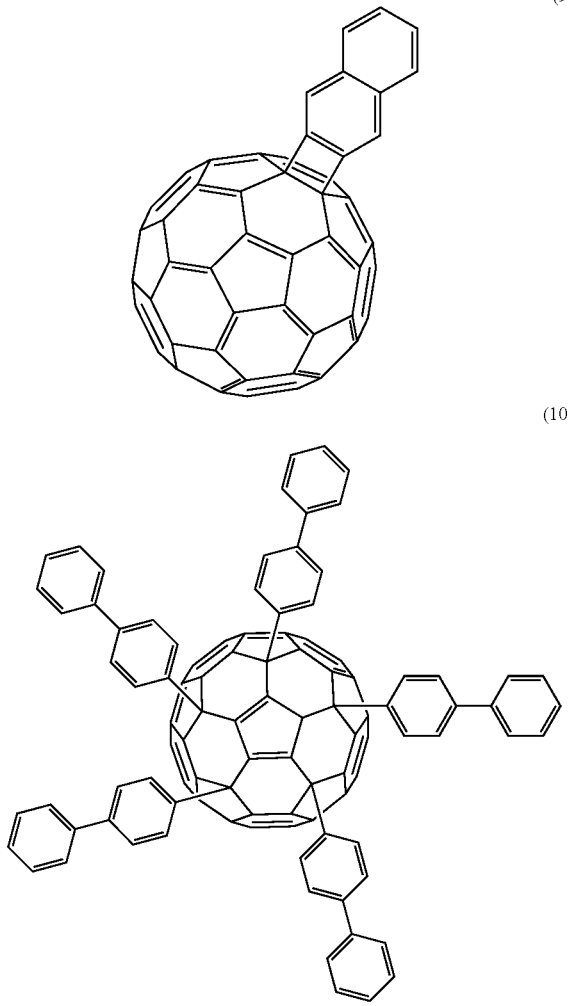

(9)

(10)

As for the fullerene and fullerene derivative, the compounds described, for example, in *Kikan Kagaku Sosetsu (Scientific Review Quarterly)*, No. 43, edited by The Chemical Society of Japan (1999), JP-A-10-167994, JP-A-11-255508, JP-A-11-255509, JP-A-2002-241323 and JP-A-2003-196881 may also be used.

The content of the fullerene or fullerene derivative in a mixed layer with a p-type material is preferably 50% or more (by mol), more preferably 200% or more (by mol), still more preferably 300% or more (by mol), based on the amount of other materials forming the mixed film.

[Imaging Device]

Configuration examples of an imaging device equipped with the photoelectric conversion device are described below. In the following configuration examples, the members and the like having the same configuration/action as the members described above are indicated by the same or like symbols or numerical references in the figure, and their description is simplified or omitted.

First Configuration Example of Imaging Device

Figure 2:
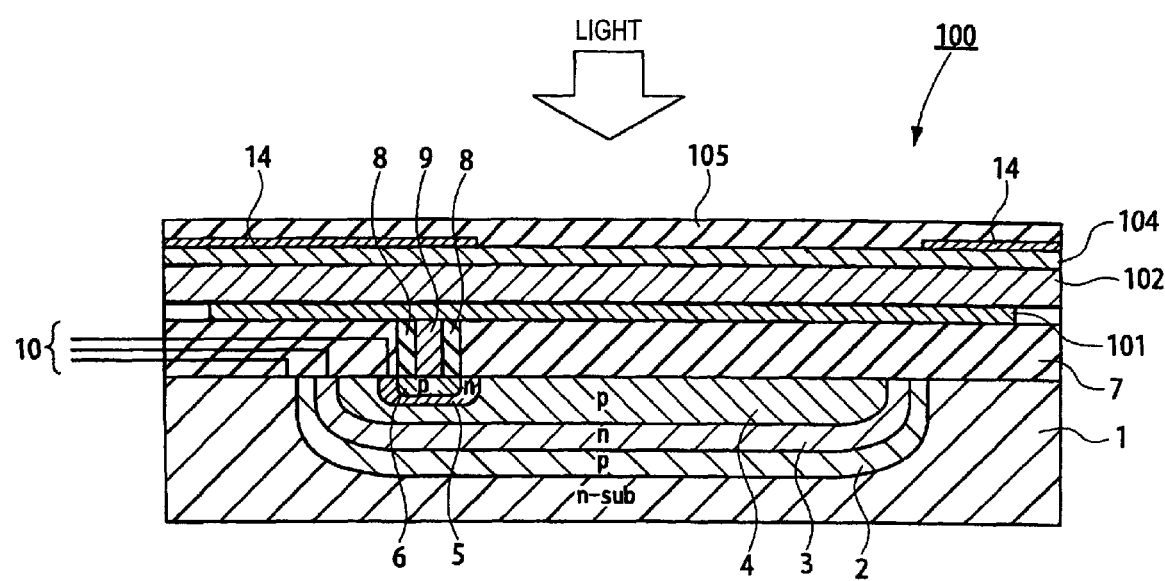
FIG. 2 is a schematic cross-sectional view of one pixel portion of an imaging device.

FIG. 2 is a cross-sectional schematic view of one pixel portion of an imaging device.

In the imaging device 100, a large number of pixels, each constituting one pixel are disposed in an array manner on the same plane, and one-pixel data of the image data can be produced by the signal obtained from the one pixel.

One pixel of the imaging device shown in FIG. 2 is composed of an n-type silicon substrate 1, a transparent insulating film 7 formed on the n-type silicon substrate 1, and a photoelectric conversion device consisting of a lower electrode 101 formed on the insulating film 7, a photoelectric conversion layer 102 formed on the lower electrode 101 and a transparent electrode material-containing upper electrode 104 formed on the photoelectric conversion layer 102. A light-shielding film 14 having provided therein an opening is formed on the photoelectric conversion device, and a transparent insulating film 105 is formed on the upper electrode 104. Here, it is also preferred that the light-shielding part 104 is of the type formed in the insulating film 7.

Inside of the n-type silicon substrate 1, a p-type impurity region (hereinafter simply referred to as "p region") 4, an n-type impurity region (hereinafter simply referred to as "n region") 3, and a p region 2 are formed in order of increasing the depth. In the p region 4, a high-concentration p region 6 is formed in the surface part of the portion light-shielded by the light-shielding film 14, and the p region 6 is surrounded by an n region 5.

The depth of the pn junction plane between the p region 4 and the n region 3 from the surface of the n-type silicon substrate 1 is set to a depth at which blue light is absorbed (about 0.2 µm). Therefore, the p region 4 and the n region 3 form a photodiode (B photodiode) of absorbing blue light and accordingly accumulating electric charges.

The depth of the pn junction plane between the p region 2 and the n-type silicon substrate 1 from the surface of the n-type silicon substrate 1 is set to a depth at which red light is absorbed (about 2 µm). Therefore, the p region 2 and the n-type silicon substrate 1 form a photodiode (R photodiode) of absorbing red light and accordingly accumulating electric charges.

The p region 6 is electrically connected to the lower electrode 101 via a connection part 9 formed in the opening bored through the insulating film 7. A hole trapped by the lower electrode 101 recombines with an electron in the p region 6 and therefore, the number of electrons accumulated in the p region 6 on resetting decreases according to the number of holes trapped. The connection part 9 is electrically insulated by an insulating film 8 from portions except for the lower electrode 101 and the p region 6.

The electrons accumulated in the p region 2 are converted into signals according to the electric charge amount by an MOS circuit (not shown) composed of a p-channel MOS transistor formed inside of the n-type silicon substrate 1, the electrons accumulated in the p region 4 are converted into signals according to the electric charge amount by an MOS circuit (not shown) composed of a p-channel MOS transistor formed inside of the n region 3, the electrons accumulated in the p region 6 are converted into signals according to the electric charge amount by an MOS circuit (not shown) composed of a p-channel MOS transistor formed inside of the n region 5, and these signals are output to the outside of the imaging device 100. Each MOS circuit is connected to a signal read-out pad (not shown) by a wiring 10. Incidentally, when an extractor electrode is provided in the p region 2 and p region 4 and a predetermined reset potential is applied, each region is depleted and the capacitance of each pn junction part becomes an infinitely small value, whereby the capacitance produced in the junction plane can be made extremely small.

Thanks to such a configuration, G light can be photoelectrically converted by the photoelectric conversion layer 102, and B light and R light can be photoelectrically converted by the B photodiode and the R photodiode, respectively, in the n-type silicon substrate 1. Also, since G light is first absorbed in the upper part, excellent color separation is achieved between B-G and between G-R. This is a greatly excellent point in comparison with an imaging device of the type where three PDs are stacked inside of a silicon substrate and all of BGR lights are separated inside of the silicon substrate. Incidentally, the imaging device may be of the type where electrons are trapped in the lower electrode 101 by reversing the assignment of p type and n type to the substrate 1 and the regions 2 to 6. The imaging device may also be of the type where regions 2 and 3 are omitted, a color filter is formed on or below the insulating film 105 so as to perform color separation of BGR by the color filter, light coming under each pixel is photoelectrically converted in the photoelectrically conversion layer 102, and lights of BGR are detected by respective pixels. In this case, the lower electrode 101 preferably passes none of BGR lights, and, for example, Al, Mo or TiN is preferably used.

Second Configuration Example of Imaging Device

Figure 3:
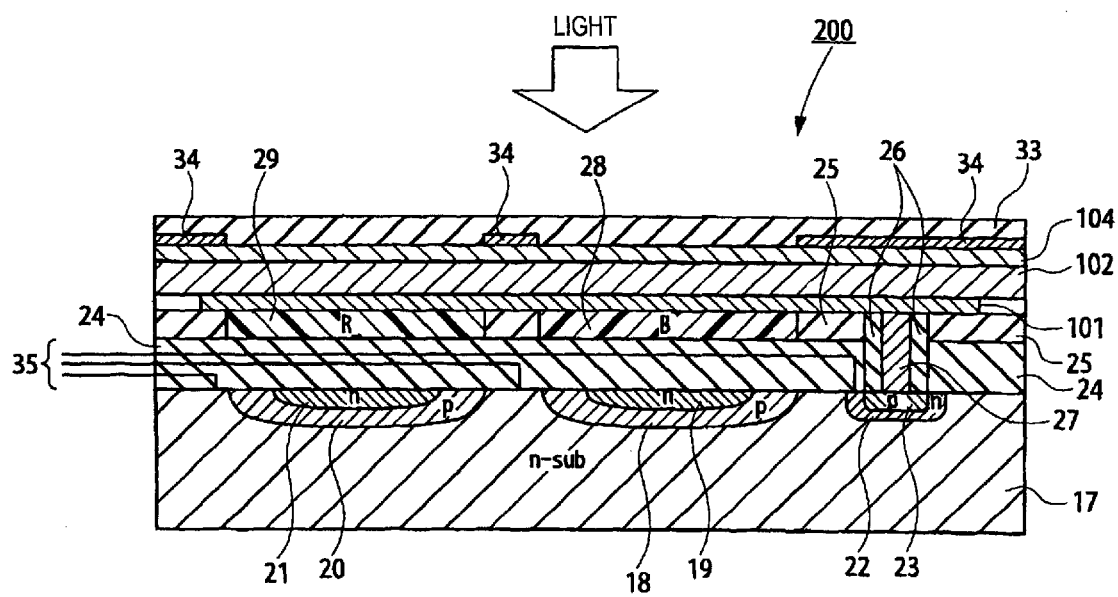
FIG. 3 is a schematic cross-sectional view of one pixel portion of an imaging device in another configuration example.

In this embodiment, instead of a configuration where two photodiodes are stacked inside of a silicon substrate 1 as in the imaging device of FIG. 3, two diodes are arrayed in the direction perpendicular to the incident direction of incident light so that lights of two colors can be detected in the inside of the p-type silicon substrate.

FIG. 3 is a cross-sectional schematic view of one pixel portion of an imaging device of this configuration example.

Here, similarly to the imaging device example of FIG. 2, the imaging device may be fabricated in type where electrons are trapped in the lower electrode 101 by reversing the assignment of p type and n type to respective regions in FIG. 3.

One pixel of the imaging device 200 shown in FIG. 3 is composed of an n-type silicon substrate 17 and a photoelectric conversion device consisting of a lower electrode 101 formed above the n-type silicon substrate 17, a photoelectric conversion layer 102 formed on the lower electrode 101, and an upper electrode 104 formed on the photoelectric conversion layer 102. A light-shielding film 34 having provided therein an opening is formed on the photoelectric conversion device, and a transparent insulating film 33 is formed on the upper electrode 104. Here, it is also preferred that the light-shielding part 34 is of the type formed in the insulating film 24.

On the surface of the n-type silicon substrate 17 below the opening of the light-shielding film 34, a photodiode consisting of an n region 19 and a p region 18 and a photodiode consisting of an n region 21 and a p region 20 are formed to lie in juxtaposition on the surface of the n-type silicon substrate 17. An arbitrary plane direction on the n-type silicon substrate 17 surface becomes the direction perpendicular to the incident direction of incident light.

Above the photodiode consisting of an n region 19 and a p region 18, a color filter 28 capable of transmitting B light is formed via a transparent insulating film 24, and the lower electrode 101 is formed thereon. Above the photodiode consisting of an n region 21 and a p region 20, a color filter 29 capable of transmitting R light is formed via the transparent insulating film 24, and the lower electrode 101 is formed thereon. The peripheries of color filters 28 and 29 are covered with a transparent insulating film 25.

The photodiode consisting of an n region 19 and a p region 18 functions as an in-substrate photoelectric conversion part that absorbs B light transmitted through the color filter 28, accordingly generates electrons and accumulates the generated electrons in the p region 18. The photodiode consisting of an n region 21 and a p region 20 functions as an in-substrate photoelectric conversion part that absorbs R light transmitted through the color filter 29, accordingly generates electrons and accumulates the generated holes in the p region 20.

In the portion light-shielded by the light-shielding film 34 on the n-type silicon substrate 17 surface, a p region 23 is formed, and the periphery of the p region 23 is surrounded by an n region 22.

The p region 23 is electrically connected to the lower electrode 101 via a connection part 27 formed in the opening bored through the insulating films 24 and 25. A hole trapped by the lower electrode 101 recombines with an electron in the p region 23 and therefore, the number of electrons accumulated in the p region 23 on resetting decreases according to the number of holes trapped. The connection part 27 is electrically insulated by an insulating film 26 from portions except for the lower electrode 101 and the p region 23.

The electrons accumulated in the p region 18 are converted into signals according to the electric charge amount by an MOS circuit (not shown) composed of a p-channel MOS transistor formed inside of the n-type silicon substrate 17, the electrons accumulated in the p region 20 are converted into signals according to the electric charge amount by an MOS circuit (not shown) composed of a p-channel MOS transistor formed inside of the n-type silicon substrate 17, the electrons accumulated in the p region 23 are converted into signals according to the electric charge amount by an MOS circuit (not shown) composed of an n-channel MOS transistor formed inside of the n region 22, and these signals are output to the outside of the imaging device 200. Each MOS circuit is connected to a signal read-out pad (not shown) by a wiring 35.

In this connection, instead of MOS circuits, the signal read-out part may be composed of CCD and an amplifier, that is, may be a signal read-out part where electrons accumulated in the p region 18, p region 20 and p region 23 are read out into CCD formed inside of the n-type silicon substrate 17 and then transferred to an amplifier by the CCD and signals according to the electrons transferred are output from the amplifier.

In this way, the signal read-out part includes a CCD structure and a CMOS structure, but in view of power consumption, high-speed read-out, pixel addition, partial read-out and the like, CMOS is preferred.

Incidentally, in the imaging device of FIG. 3, color separation of R light and B light is performed by color filters 28 and 29, but instead of providing color filters 28 and 29, the depth of the pn junction plane between the p region 20 and the n region 21 and the depth of the pn junction plane between the p region 18 and the n region 19 each may be adjusted to absorb R light and B light by respective photodiodes.

An inorganic photoelectric conversion part composed of an inorganic material that absorbs light transmitted through the photoelectric conversion layer 102, accordingly generates electric charges and accumulates the electric charges, may also be formed between the n-type silicon substrate 17 and the lower electrode 101 (for example, between the insulating film 24 and the n-type silicon substrate 17). In this case, an MOS circuit for reading out signals according to the electric charges accumulated in a charge accumulation region of the inorganic photoelectric conversion part may be provided inside of the n-type silicon substrate 17, and a wiring 35 may be connected also to this MOS circuit.

Also, there may take a configuration where one photodiode is provided inside of the n-type silicone substrate 17 and a plurality of photoelectric conversion parts are stacked above the n-type silicon substrate 17; a configuration where a plurality of photodiodes are provided inside of the n-type silicon substrate 17 and a plurality of photoelectric conversion parts are stacked above the n-type silicon substrate 17; or when a color image need not be formed, a configuration where one photodiode is provided inside of the n-type silicon substrate 17 and only one photoelectric conversion part is stacked.

Third Configuration Example of Imaging Device

The imaging device of this embodiment is configured such that a photodiode is not provided inside of the silicon substrate and a plurality of (here, three) photoelectric conversion devices are stacked above the silicon substrate.

Figure 4:
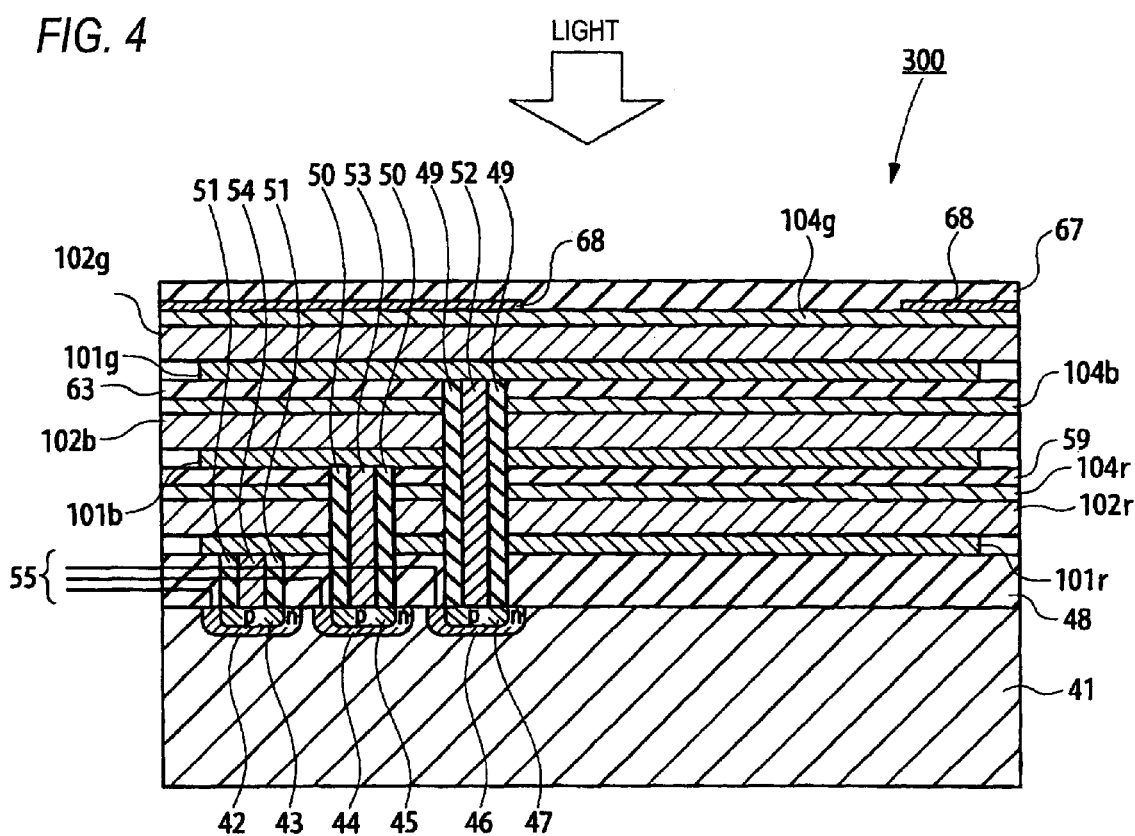
FIG. 4 is a schematic cross-sectional view of one pixel portion of an imaging device in another configuration example.

FIG. 4 is a cross-sectional schematic view of one pixel portion of the imaging device of this embodiment. Here, similarly to the imaging device examples of FIGS. 2 and 3, the imaging device may be fabricated in type where electrons are trapped in the lower electrodes 101r, 101g and 101b by reversing the assignment of p type and n type to respective regions 42 to 47 in FIG. 4.

The imaging device 300 shown in FIG. 4 has a configuration where an R photoelectric conversion device, a B photoelectric conversion device, and a G photoelectric conversion device are stacked in order above a silicon substrate 41.

The R photoelectric conversion device is composed of, above the silicon substrate 41, a lower electrode 101r, a photoelectric conversion layer 102r formed on the lower electrode 101r, and an upper electrode 104r formed on the photoelectric conversion layer 102r.

The B photoelectric conversion device is composed of a lower electrode 101b stacked on the upper electrode 104r of the R photoelectric conversion device, a photoelectric conversion layer 102b formed on the lower electrode 101b, and an upper electrode 104b formed on the photoelectric conversion layer 102b.

The G photoelectric conversion device is composed of a lower electrode 101g stacked on the upper electrode 104b of the B photoelectric conversion device, a photoelectric conversion layer 102g formed on the lower electrode 101g, and an upper electrode 104g formed on the photoelectric conversion layer 102g. The imaging device of this configuration example has a configuration where the R photoelectric conversion device, the B photoelectric conversion device and the G photoelectric conversion device are stacked in this order.

A transparent insulating film 59 is formed between the upper electrode 104r of the R photoelectric conversion device and the lower electrode 101b of the B photoelectric conversion device, and a transparent insulating film 63 is formed between the upper electrode 104b of the B photoelectric conversion device and the lower electrode 101g of the G photoelectric conversion device. A light-shielding film 68 is formed in the region excluding an opening on the upper electrode 104g of the G photoelectric conversion device, and a transparent insulating film 67 is formed to cover the upper electrode 104g and the light-shielding film 68.

The lower electrode, the photoelectric conversion layer and the upper electrode contained in each of the R, G and B photoelectric conversion devices can have the same configuration as that in the photoelectric conversion device described above. However, the photoelectric conversion layer 102g contains an organic material capable of absorbing green light and accordingly generating electrons and holes, the photoelectric conversion layer 102b contains an organic material capable of absorbing blue light and accordingly generating electrons and holes, and the photoelectric conversion layer 102r contains an organic material capable of absorbing red light and accordingly generating electrons and holes.

In the portion light-shielded by the light-shielding film 68 on the silicon substrate 41 surface, p regions 43, 45 and 47 are formed, and the peripheries of these regions are surrounded by n regions 42, 44 and 46, respectively.

The p region 43 is electrically connected to the lower electrode 101r via a connection part 54 formed in an opening bored through an insulating film 48. A hole trapped by the lower electrode 101r recombines with an electron in the p region 43 and therefore, the number of electrons accumulated in the p region 43 on resetting decreases according to the number of holes trapped. The connection part 54 is electrically insulated by an insulating film 51 from portions except for the lower electrode 101r and the p region 43.

The p region 45 is electrically connected to the lower electrode 101b via a connection part 53 formed in an opening bored through the insulating film 48, the R photoelectric conversion device and the insulating film 59. A hole trapped by the lower electrode 101b recombines with an electron in the p region 45 and therefore, the number of electrons accumulated in the p region 45 on resetting decreases according to the number of holes trapped. The connection part 53 is electrically insulated by an insulating film 50 from portions except for the lower electrode 101b and the p region 45.

The p region 47 is electrically connected to the lower electrode 101g via a connection part 52 formed in an opening bored through the insulating film 48, the R photoelectric conversion device, the insulating film 59, the B photoelectric conversion device and the insulating film 63. A hole trapped by the lower electrode 101g recombines with an electron in the p region 47 and therefore, the number of electrons accumulated in the p region 47 on resetting decreases according to the number of holes trapped. The connection part 52 is electrically insulated by an insulating film 49 from portions except for the lower electrode 101g and the p region 47.

The electrons accumulated in the p region 43 are converted into signals according to the electric charge amount by an MOS circuit (not shown) composed of a p-channel MOS transistor formed inside of the n region 42, the electrons accumulated in the p region 45 are converted into signals according to the electric charge amount by an MOS circuit (not shown) composed of a p-channel MOS transistor formed inside of the n region 44, the electrons accumulated in the p region 47 are converted into signals according to the electric charge amount by an MOS circuit (not shown) composed of a p-channel MOS transistor formed inside of the n region 46, and these signals are output to the outside of the imaging device 300. Each MOS circuit is connected to a signal read-out pad (not shown) by a wiring 55. Incidentally, instead of MOS circuits, the signal read-out part may be composed of CCD and an amplifier, that is, may be a signal read-out part where electrons accumulated in the p regions 43, 45 and 47 are read out into CCD formed inside of the silicon substrate 41 and then transferred to an amplifier by the CCD and signals according to the electrons transferred are output from the amplifier.

In the description above, the photoelectric conversion layer capable of absorbing B light means a layer which can absorb at least light at a wavelength of 400 to 500 nm and in which the absorption factor at a peak wavelength in the wavelength region above is preferably 50% or more. The photoelectric conversion layer capable of absorbing G light means a layer which can absorb at least light at a wavelength of 500 to 600 nm and in which the absorption factor at a peak wavelength in the wavelength region above is preferably 50% or more. The photoelectric conversion layer capable of absorbing R light means a layer which can absorb at least light at a wavelength of 600 to 700 nm and in which the absorption factor at a peak wavelength in the wavelength region above is preferably 50% or more.

[Substituent W]

The substituent W is described below.

Examples of the substituent W include a halogen atom, an alkyl group (including a cycloalkyl group, a bicycloalkyl group and a tricycloalkyl group), an alkenyl group (including a cycloalkenyl group and a bicycloalkenyl group), an alkynyl group, an aryl group, a heterocyclic group (may also be called a hetero ring group), a cyano group, a hydroxy group, a nitro group, a carboxy group, an alkoxy group, an aryloxy group, a silyloxy group, a heterocyclic oxy group, an acyloxy group, a carbamoyloxy group, an alkoxycarbonyloxy group, an aryloxycarbonyl group, an amino group (including an anilino group), an ammonio group, an acylamino group, an aminocarbonylamino group, an alkoxycarbonylamino group, an aryloxycarbonylamino group, a sulfamoylamino group, an alkylsulfonylamino group, an arylsulfonylamino group, a mercapto group, an alkylthio group, an arylthio group, a heterocyclic thio group, a sulfamoyl group, a sulfo group, an alkylsulfinyl group, an arylsulfinyl group, an alkylsulfonyl group, an arylsulfonyl group, an acyl group, an aryloxycarbonyl group, an alkoxycarbonyl group, a carbamoyl group, an arylazo group, a heterocyclic azo group, an imido group, a phosphino group, a phosphinyl group, a phosphinyloxy group, a phosphinylamino group, a phosphono group, a silyl group, a hydrazino group, a ureido group, a boronic acid group (—B(OH)$_2$), a phosphato group (—OPO(OH)$_2$), a sulfato group (—OSO$_3$H) and other known substituents.

More specifically, W represents, for example, the following (1) to (48):

(1) a halogen atom,
such as fluorine atom, chlorine atom, bromine atom and iodine atom;

(2) an alkyl group,
specifically a linear, branched or cyclic, substituted or unsubstituted alkyl group, the alkyl group including, for example, (2-a) to (2-e):

(2-a) an alkyl group,
preferably an alkyl group having a carbon number of 1 to 30 (e.g., methyl, ethyl, n-propyl, isopropyl, tert-butyl, n-octyl, eicosyl, 2-chloroethyl, 2-cyanoethyl, 2-ethylhexyl), (2-b) a cycloalkyl group,
preferably a substituted or unsubstituted cycloalkyl group having a carbon number of 3 to 30 (e.g., cyclohexyl, cyclopentyl, 4-n-dodecylcyclohexyl), (2-c) a bicycloalkyl group,
preferably a substituted or unsubstituted bicycloalkyl group having a carbon number of 5 to 30 (e.g., bicyclo[1,2,2]heptan-2-yl, bicyclo[2,2,2]octan-3-yl), (2-d) a tricycloalkyl group,
preferably a substituted or unsubstituted tricycloalkyl group having a carbon number of 7 to 30 (e.g., 1-adamantyl), and (2-e) a polycyclic cycloalkyl group having a large number of ring structures, here, the alkyl group in the substituent described below (for example, the alkyl group in an alkylthio group) means an alkyl group having such a concept but further includes an alkenyl group and an alkynyl group;

(3) an alkenyl group,
specifically a linear, branched or cyclic, substituted or unsubstituted alkenyl group, the alkenyl group including (3-a) to (3-c):

(3-a) an alkenyl group,
preferably a substituted or unsubstituted alkenyl group having a carbon number of 2 to 30 (e.g., vinyl, allyl, prenyl, geranyl, oleyl), (3-b) a cycloalkenyl group,
preferably a substituted or unsubstituted cycloalkenyl group having a carbon number of 3 to 30 (e.g., 2-cyclopenten-1-yl, 2-cyclohexen-1-yl), and (3-c) a bicycloalkenyl group,
specifically a substituted or unsubstituted bicycloalkenyl group, preferably a substituted or unsubstituted bicycloalkenyl group having a carbon number of 5 to 30 (e.g., bicyclo[2,2,1]hept-2-en-1-yl, bicyclo[2,2,2]oct-2-en-4-yl)];

(4) an alkynyl group,
preferably a substituted or unsubstituted alkynyl group having a carbon number of 2 to 30 (e.g., ethynyl, propargyl, trimethylsilylethynyl);

(5) an aryl group,
preferably a substituted or unsubstituted aryl group having a carbon number of 6 to 30 (e.g., phenyl, p-tolyl, naphthyl, m-chlorophenyl, o-hexadecanoylaminophenyl, ferrocenyl);

(6) a heterocyclic group,
preferably a monovalent group obtained by removing one hydrogen atom from a 5- or 6-membered substituted or unsubstituted, aromatic or non-aromatic heterocyclic compound, more preferably a 5- or 6-membered aromatic heterocyclic group having a carbon number of 2 to 50 (e.g., 2-furyl, 2-thienyl, 2-pyrimidinyl, 2-benzothiazolyl, 2-carbazolyl, 3-carbazolyl, 9-carbazolyl; the heterocyclic group may also be a cationic heterocyclic group such as 1-methyl-2-pyridinio and 1-methyl-2-quinolinio);

(7) a cyano group;

(8) a hydroxy group;

(9) a nitro group;

(10) a carboxyl group;

(11) an alkoxy group,
preferably a substituted or unsubstituted alkoxy group having a carbon number of 1 to 30 (e.g., methoxy, ethoxy, isopropoxy, tert-butoxy, n-octyloxy, 2-methoxyethoxy);

(12) an aryloxy group,
preferably a substituted or unsubstituted aryloxy group having a carbon number of 6 to 30 (e.g., phenoxy, 2-methylphenoxy, 4-tert-butylphenoxy, 3-nitrophenoxy, 2-tetradecanoylaminophenoxy);

(13) a silyloxy group,
preferably a silyloxy group having a carbon number of 3 to 20 (e.g., trimethylsilyloxy, tert-butyldimethylsilyloxy);

(14) a heterocyclic oxy group,
preferably a substituted or unsubstituted heterocyclic oxy group having a carbon number of 2 to 30 (e.g., 1-phenyltetrazol-5-oxy, 2-tetrahydropyranyloxy);

(15) an acyloxy group,
preferably a formyloxy group, a substituted or unsubstituted alkylcarbonyloxy group having a carbon number of 2 to 30, or a substituted or unsubstituted arylcarbonyloxy group having a carbon number of 6 to 30 (e.g., formyloxy, acetyloxy, pivaloyloxy, stearoyloxy, benzoyloxy, p-methoxyphenylcarbonyloxy);

(16) a carbamoyloxy group,
preferably a substituted or unsubstituted carbamoyloxy group having a carbon number of 1 to 30 (e.g., N,N-dimethylcarbamoyloxy, N,N-diethylcarbamoyloxy, morpholinocarbonyloxy, N,N-di-n-octylaminocarbonyloxy, N-n-octylcarbamoyloxy);

(17) an alkoxycarbonyloxy group,
preferably a substituted or unsubstituted alkoxycarbonyloxy group having a carbon number of 2 to 30 (e.g., methoxycarbonyloxy, ethoxycarbonyloxy, tert-butoxycarbonyloxy, n-octylcarbonyloxy);

(18) an aryloxycarbonyloxy group,
preferably a substituted or unsubstituted aryloxycarbonyloxy group having a carbon number of 7 to 30 (e.g., phenoxycarbonyloxy, p-methoxyphenoxycarbonyloxy, p-n-hexadecyloxyphenoxycarbonyloxy);

(19) an amino group,
preferably an amino group, a substituted or unsubstituted alkylamino group having a carbon number of 1 to 30, or a substituted or unsubstituted anilino group having a carbon number of 6 to 30, such as amino, methylamino, dimethylamino, anilino, N-methyl-anilino and diphenylamino;

(20) an ammonio group,
preferably an ammonio group or an ammonio group substituted with a substituted or unsubstituted alkyl, aryl or heterocyclic group having a carbon number of 1 to 30 (e.g., trimethylammonio, triethylammonio, diphenylmethylammonio);

(21) an acylamino group,
preferably a formylamino group, a substituted or unsubstituted alkylcarbonylamino group having a carbon number of 1 to 30, or a substituted or unsubstituted arylcarbonylamino group having a carbon number of 6 to 30, such as formylamino, acetylamino, pivaloylamino, lauroylamino, benzoylamino and 3,4,5-tri-n-octyloxyphenylcarbonylamino;

(22) an aminocarbonylamino group,
preferably a substituted or unsubstituted aminocarbonylamino group having a carbon number of 1 to 30 (e.g., carbamoylamino, N,N-dimethylaminocarbonylamino, N,N-diethylaminocarbonylamino, morpholinocarbonylamino);

(23) an alkoxycarbonylamino group,
preferably a substituted or unsubstituted alkoxycarbonylamino group having a carbon number of 2 to 30 (e.g., methoxycarbonylamino, ethoxycarbonylamino, tert-butoxycarbonylamino, n-octadecyloxycarbonylamino, N-methylmethoxycarbonylamino);

(24) an aryloxycarbonylamino group,
preferably a substituted or unsubstituted aryloxycarbonylamino group having a carbon number of 7 to 30 (e.g., phenoxycarbonylamino, p-chlorophenoxycarbonylamino, m-n-octyloxyphenoxycarbonylamino);

(25) a sulfamoylamino group,
preferably a substituted or unsubstituted sulfamoylamino group having a carbon number of 0 to 30 (e.g., sulfamoylamino, N,N-dimethylaminosulfonylamino, N-n-octylaminosulfonylamino);

(26) an alkyl- or aryl-sulfonylamino group,
preferably a substituted or unsubstituted alkylsulfonylamino group having a carbon number of 1 to 30, or a substituted or unsubstituted arylsulfonylamino group having a carbon number of 6 to 30, such as methylsulfonylamino, butylsulfonylamino, phenylsulfonylamino, 2,3,5-trichlorophenylsulfonylamino and p-methylphenylsulfonylamino;

(27) a mercapto group;

(28) an alkylthio group,
preferably a substituted or unsubstituted alkylthio group having a carbon number of 1 to 30 (e.g., methylthio, ethylthio, n-hexadecylthio);

(29) an arylthio group,
preferably a substituted or unsubstituted arylthio group having a carbon number of 6 to 30 (e.g., phenylthio, p-chlorophenylthio, m-methoxyphenylthio);

(30) a heterocyclic thio group,
preferably a substituted or unsubstituted heterocyclic thio group having a carbon number of 2 to 30 (e.g., 2-benzothiazolylthio, 1-phenyltetrazol-5-ylthio);

(31) a sulfamoyl group,
preferably a substituted or unsubstituted sulfamoyl group having a carbon number of 0 to 30 (e.g., N-ethylsulfamoyl, N-(3-dodecyloxypropyl)sulfamoyl, N,N-dimethylsulfamoyl, N-acetylsulfamoyl, N-benzoylsulfamoyl, N—(N'-phenylcarbamoyl)sulfamoyl);

(32) a sulfo group;

(33) an alkyl- or aryl-sulfinyl group,
preferably a substituted or unsubstituted alkylsulfinyl group having a carbon number of 1 to 30, or a substituted or unsubstituted arylsulfinyl group having a carbon number of 6 to 30, such as methylsulfinyl, ethylsulfinyl, phenylsulfinyl and p-methylphenylsulfinyl;

(34) an alkyl- or aryl-sulfonyl group,
preferably a substituted or unsubstituted alkylsulfonyl group having a carbon number of 1 to 30, or a substituted or unsubstituted arylsulfonyl group having a carbon number of 6 to 30, such as methylsulfonyl, ethylsulfonyl, phenylsulfonyl and p-methylphenylsulfonyl;

(35) an acyl group,
preferably a formyl group, a substituted or unsubstituted alkylcarbonyl group having a carbon number of 2 to 30, a substituted or unsubstituted arylcarbonyl group having a carbon number of 7 to 30, or a substituted or unsubstituted heterocyclic carbonyl group having a carbon number of 4 to 30 and being bonded to a carbonyl group through a carbon atom, such as acetyl, pivaloyl, 2-chloroacetyl, stearoyl, benzoyl, p-n-octyloxyphenylcarbonyl, 2-pyridylcarbonyl and 2-furylcarbonyl;

(36) an aryloxycarbonyl group,
preferably a substituted or unsubstituted aryloxycarbonyl group having a carbon number of 7 to 30 (e.g., phenoxycarbonyl, o-chlorophenoxycarbonyl, m-nitrophenoxycarbonyl, p-tert-butylphenoxycarbonyl);

(37) an alkoxycarbonyl group,
preferably a substituted or unsubstituted alkoxycarbonyl group having a carbon number of 2 to 30 (e.g., methoxycarbonyl, ethoxycarbonyl, tert-butoxycarbonyl, n-octadecyloxycarbonyl);

(38) a carbamoyl group,
preferably a substituted or unsubstituted carbamoyl group having a carbon number of 1 to 30 (e.g., carbamoyl, N-methylcarbamoyl, N,N-dimethylcarbamoyl, N,N-di-n-octylcarbamoyl, N-(methylsulfonyl)carbamoyl);

(39) an aryl or heterocyclic azo group,
preferably a substituted or unsubstituted arylazo group having a carbon number of 6 to 30, or a substituted or unsubstituted heterocyclic azo group having a carbon number of 3 to 30, such as phenylazo, p-chlorophenylazo and 5-ethylthio-1,3,4-thiadiazol-2-ylazo;

(40) an imido group,
preferably N-succinimido or N-phthalimido;

(41) a phosphino group,
preferably a substituted or unsubstituted phosphino group having a carbon number of 2 to 30 (e.g., dimethylphosphino, diphenylphosphino, methylphenoxyphosphino);

(42) a phosphinyl group,
preferably a substituted or unsubstituted phosphinyl group having a carbon number of 2 to 30 (e.g., phosphinyl, dioctyloxyphosphinyl, diethoxyphosphinyl);

(43) a phosphinyloxy group,
preferably a substituted or unsubstituted phosphinyloxy group having a carbon number of 2 to 30 (e.g., diphenoxyphosphinyloxy, dioctyloxyphosphinyloxy);

(44) a phosphinylamino group,
preferably a substituted or unsubstituted phosphinylamino group having a carbon number of 2 to 30 (e.g., dimethoxyphosphinylamino, di methylaminophosphinylamino);
(45) a phospho group;
(46) a silyl group,
preferably a substituted or unsubstituted silyl group having a carbon number of 3 to 30 (e.g., trimethylsilyl, triethylsilyl, triisopropylsilyl, tert-butyldimethylsilyl, phenyldimethylsilyl);
(47) a hydrazino group,
preferably a substituted or unsubstituted hydrazino group having a carbon number of 0 to 30 (e.g., trimethylhydrazino); and
(48) a ureido group,
preferably a substituted or unsubstituted ureido group having a carbon number of 0 to 30 (e.g., N,N-dimethylureido).

Among these substituents W, those having a hydrogen atom may be deprived of the hydrogen atom and further substituted with the above-described group. Examples of such a substituent include a —CONHSO$_2$— group (sulfonylcarbamoyl group or carbonylsulfamoyl group), a —CONHCO— group (carbonylcarbamoyl group) and an —SO$_2$NHSO$_2$— group (sulfonylsulfamoyl group). Specific examples thereof include an alkylcarbonylaminosulfonyl group (e.g., acetylaminosulfonyl), an arylcarbonylaminosulfonyl group (e.g., benzoylaminosulfonyl), an alkylsulfonylaminocarbonyl group (e.g., methyl sulfonylaminocarbonyl) and an arylsulfonylaminocarbonyl group (e.g., p-methylphenylsulfonylaminocarbonyl).

[Ring R]

The ring R includes an aromatic or non-aromatic hydrocarbon or heterocyclic ring or a polycyclic condensed ring formed by further combining these rings. Examples thereof include a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolidine ring, a quinoline ring, a phthalazine ring, a naphthylidine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiine ring, a phenothiazine ring and a phenazine ring.

EXAMPLES

Synthesis Example 1

Benz[f]indane-1,3-dione was synthesized according to *J. Med. Chem.*, Vol. 16, paragraphs 1334 to 1339 (1973), and 2 g of this sample and 3.1 g of 4-(N,N-diphenylamino)benzaldehyde were heated with stirring in 20 ml of ethanol under reflux for 6 hours. After cooling to room temperature, the obtained crystal was separated by filtration, washed and recrystallized from chloroform-acetonitrile to obtain 4.3 g of Compound (1).

Synthesis Example 2

9H-Tribenz[b,d,f]azepine was synthesized according to *J. Org. Chem.*, Vol. 56, paragraphs 3906 to 3908 (1991), and 3.2 g of this sample, 2 g of 2,6-dibromoanthracene, 1.4 g of tert-butoxysodium, 50 ml of xylene and 250 mg of bis(tri-tert-butylphosphine)palladium(0) were refluxed for 5 hours under nitrogen. After cooling to room temperature, 150 ml of methanol was added, and the obtained crystal was filtered, washed with acetonitrile and dispersed in 30 ml of toluene and 50 ml of water, and the dispersion was stirred for 1 hour, filtered and washed sequentially with acetonitrile and with toluene to obtain 4.2 g of Compound (6).

Synthesis Example 3

3,6-Di-tert-butylcarbazole was synthesized according to *ORGANIC LETTERS*, Vol. 9, paragraphs 797 to 800 (2007), and 3.3 g of this sample, 0.2 g of palladium acetate, 9 g of cesium carbonate, 1 g of tri-tert-butylphosphine, 50 ml of xylene and 5 g of 3,6-dibromo-9-phenylcarbazole were refluxed for 5 hours under nitrogen. After cooling to room temperature, 100 ml of water was added, and extraction with 100 ml of toluene was performed. The concentrated residue was purified by silica gel column chromatography using a toluene-hexane mixed solvent, and the solution was concentrated. Thereafter, 50 ml of methanol was added to the residue, and the obtained crystal was filtered and washed with acetonitrile to obtain 6 g of Compound (2).

Synthesis Example 4

2,7-Dibromocarbazole was synthesized according to *Journal of Organic Chemistry*, Vol. 70, paragraphs 5014 to 5019 (2005), and 3.5 g of this sample, 6 ml of iodobenzene, 0.8 g of copper powder, 3 g of potassium carbonate, 20 ml of 1,2-dichlorobenzene and 1.4 g of 18-crown-6-ether were stirred under heating and refluxing for 6 hours in a nitrogen atmosphere. After cooling to room temperature, the reaction solution was purified by silica gel column chromatography using a toluene-hexane mixed solvent to obtain 1.8 g of 2,7-dibromo-9-phenylcarbazole, and this sample was reacted with 3,6-di-tert-butylcarbazole in the same manner as in Synthesis Example 3 to obtain Compound (10).

Synthesis Example 5

Compound (4) was synthesized in the same manner except that 2,7-dibromocarbazole in Synthesis Example 3 was replaced by bis(9,9'-dimethylfluore-2-yl)amine.

Synthesis Example 6

Compound (13) and Compound (14) were synthesized in the same manner except that iodobenzene in Synthesis Example 4 was replaced by 2-bromonaphthalene or 2-bromoanthracene.

Synthesis Example 7

Compounds (5), (7) to (9), (11) and (12) were synthesized by combining the above-described methods or known methods and appropriately changing the raw materials and reagents.

All of the compounds synthesized above were subjected to sublimation purification using a sublimation purification apparatus TRS-1 (ULVAC-RIKO, Inc.) before use.

Example 1

In the embodiment of FIG. 2, amorphous ITO was deposited on a CMOS substrate by sputtering to a thickness of 30 nm and patterned by photolithography so that one pixel could be present for each photodiode (PD) on the CMOS substrate, whereby a pixel electrode 101 was formed. Subsequently, Compound (2) was deposited thereon by vacuum heating deposition to a thickness of 100 nm to form an electron blocking layer. Thereafter, a layer formed by co-depositing Compound (1) and fullerene (C60) to a thickness of 100 nm and 300 nm, respectively, in terms of a single layer was deposited thereon by vacuum heating deposition in a state of the CMOS substrate temperature being controlled to 25° C. to form a photoelectric conversion layer. Here, the vacuum deposition of the photoelectric conversion layer was performed at a vacuum degree of $4\times10^{-4}$ Pa or less.

Furthermore, amorphous ITO was deposited thereon as an upper electrode by sputtering to a thickness of 10 nm to form a transparent electrode. In this way, a solid-state imaging device having a photoelectric conversion device was fabricated.

Incidentally, the Ip of Compound (1) was determined by separately depositing the compound to a thickness of 100 nm as a single material layer and measuring the obtained sample by means of AC-2 manufactured by Riken Keiki Co., Ltd. and found to be 5.5 eV. As for the Ea of fullerene, Ip was determined in the same manner, and a band gap determined from the light absorption long-wave end of the film was subtracted from the Ip, whereby Ea was determined to be 4.2 eV.

Examples 2 to 12 and Comparative Examples 1 to 4

Solid-state imaging devices were fabricated in the same manner as in Example 1 except that Compound (2) used for the electron blocking layer was changed as shown in Table 1.

[Evaluation]

With respect to devices obtained, the dark current value (relative value when the dark current value of Example 1 is taken as 1) at the voltage application of $5\times10^4$ V/cm is shown in Table 1. Incidentally, the Ip of each material (compounds (2) to (5), (7)-(14)) was determined by depositing each material as a single layer film and measuring it by means of AC-2 manufactured by Riken Keiki Co., Ltd., and the Ea was determined by subtracting the energy corresponding to the energy gap from the Ip. Here, an energy-equivalent value of the wavelength at the long-wave end of spectral absorption spectrum of the single layer film above was used as the energy corresponding to the energy gap.

Furthermore, in order to examine the heat resistance in each device, the fabricated device was left standing on a hot plate at 170° C. for 20 minutes and after cooling to room temperature, the dark current value was measured in the same manner as above. In the Table, a relative value to the dark current value of each device before heating is shown. In Comparative Example 1, it was confirmed that the device became milky white and the photoelectric conversion film in the device was crystallized.

TABLE 1

| | Electron Blocking Material | | | Dark Current Value at Voltage Application of $5 \times 10^4$ V/cm (relative value) | Dark Current Value after Heating (relative value to that before heating) |
|---|---|---|---|---|---|
| | Compound Species | Ip (eV) | Ea (eV) | | |
| Example 1 | Compound (2) | 5.5 | 2.3 | 1 | 0.9 |
| Example 2 | Compound (3) | 4.9 | 2.1 | 18 | 1.1 |
| Example 3 | Compound (4) | 5.1 | 2.1 | 2.9 | 1.6 |
| Example 4 | Compound (5) | 5.1 | 2.2 | 4.7 | 1.1 |
| Example 5 | Compound (7) | 5.5 | 2.3 | 1.1 | 1.5 |
| Example 6 | Compound (8) | 4.9 | 2.1 | 18 | 0.9 |
| Example 7 | Compound (9) | 5.1 | 2.1 | 2.7 | 0.8 |
| Example 8 | Compound (10) | 5.3 | 2.0 | 1.5 | 0.8 |
| Example 9 | Compound (11) | 5.4 | 2.2 | 1.9 | 0.8 |
| Example 10 | Compound (12) | 5.4 | 2.2 | 1.7 | 1.1 |
| Example 11 | Compound (13) | 5.4 | 2.1 | 1.2 | 1.1 |
| Example 12 | Compound (14) | 5.5 | 2.2 | 0.7 | 0.8 |
| Comparative Example 1 | TPD | 5.5 | 2.3 | 4.3 | 170 |
| Comparative Example 2 | Compound (6) | 4.9 | 2.4 | 110 | 5 |
| Comparative Example 3 | mMTDATA | 5.1 | 1.9 | 78 | 26 |
| Comparative Example 4 | TPT1 | 5.2 | 2.2 | 5.3 | 11 |

Compounds used in Examples are shown below.

Compound (1)

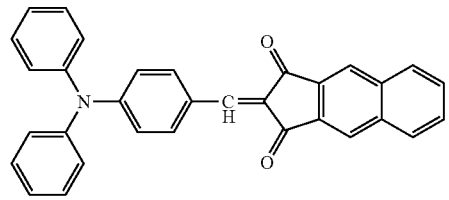

Compound (2)

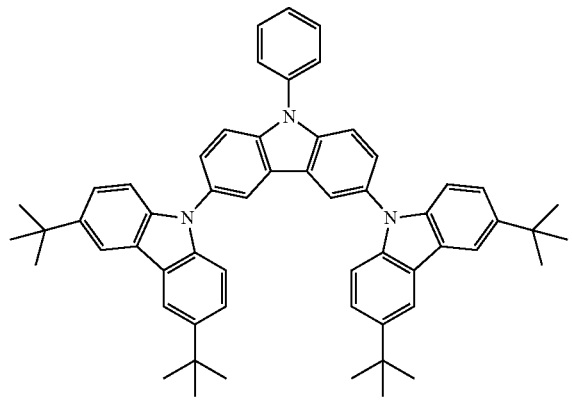

-continued
Compound (3)
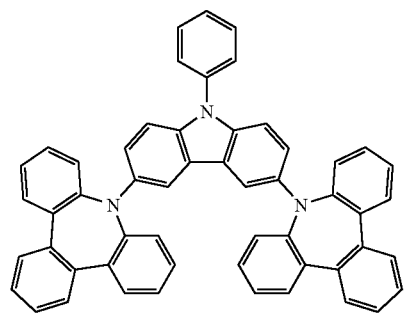
Compound (4)
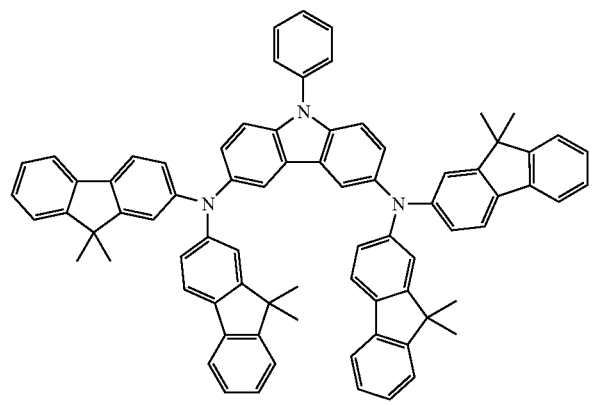
Compound (5)
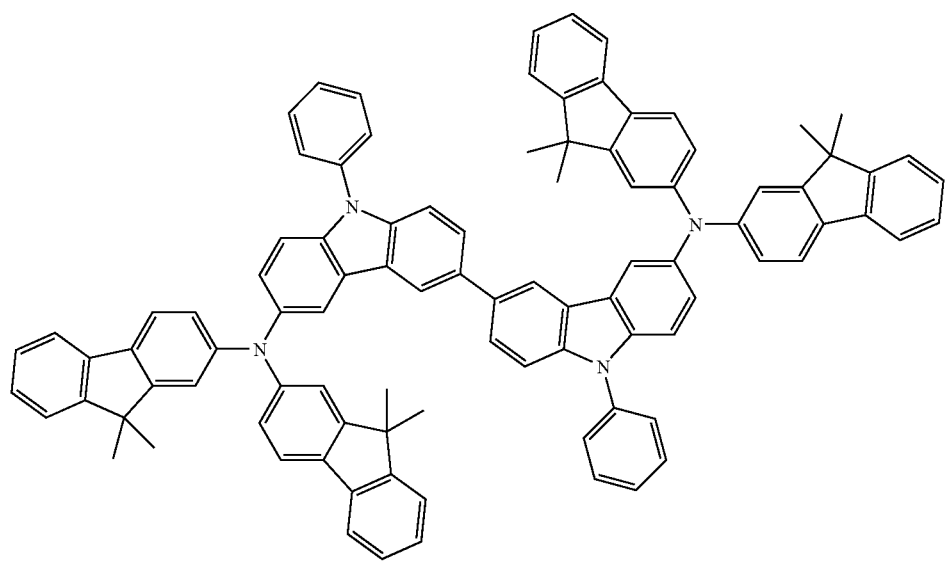
Compound (6)
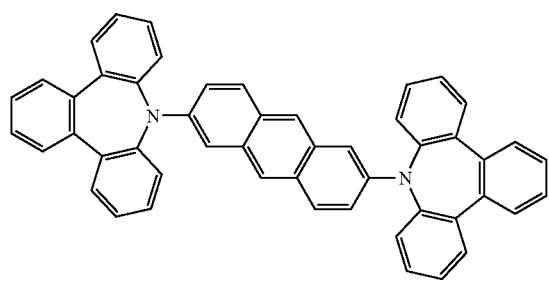
Compound (7)
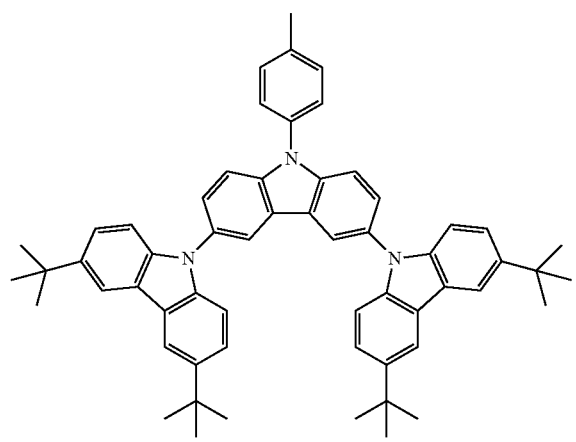

-continued
Compound (8)
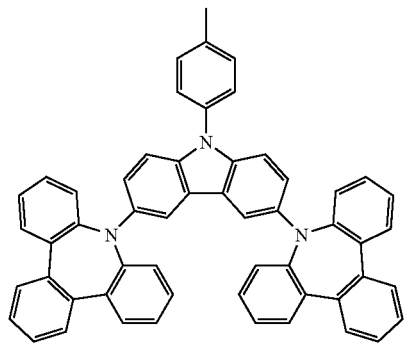
Compound (9)
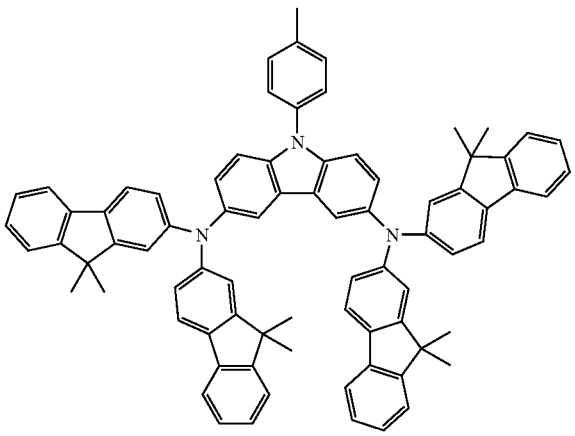
Compound (10)
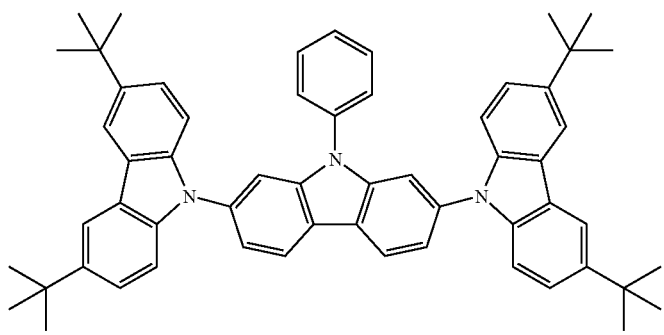
Compound (11)
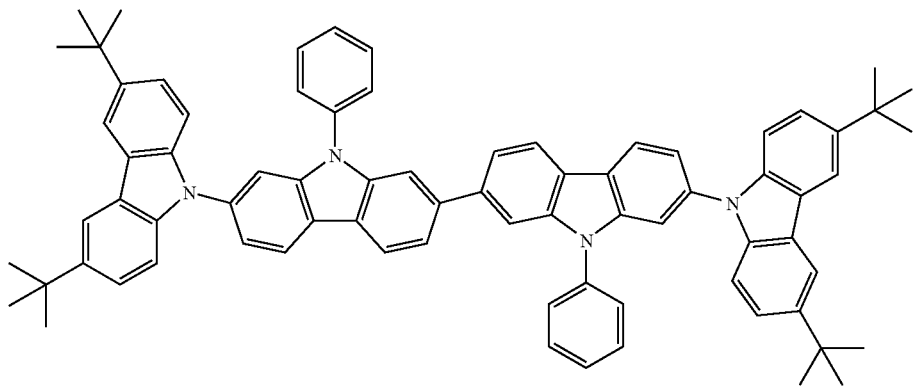
Compound (12)
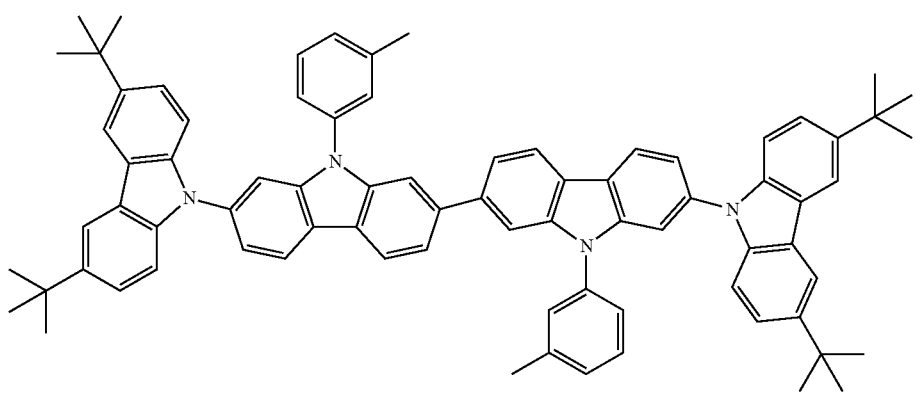

-continued
Compound (13)
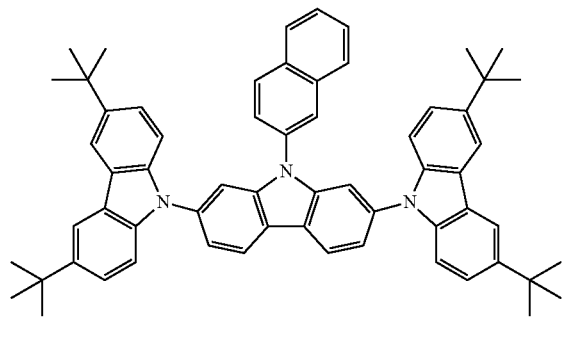
Compound (14)
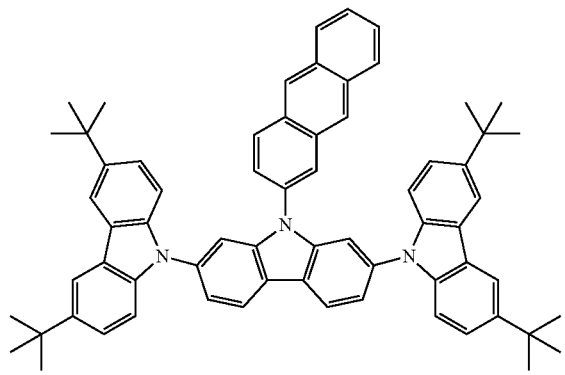
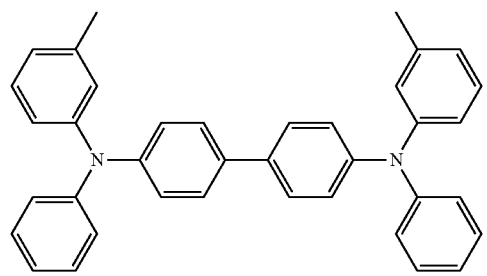
TPD
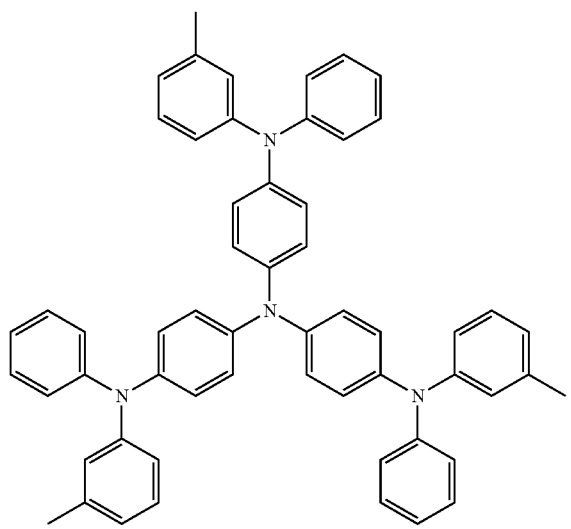
mMTDATA
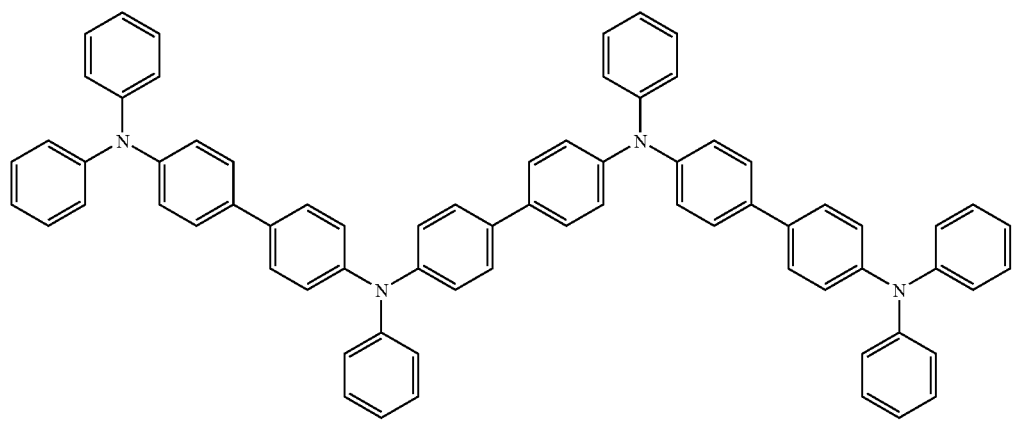
TPT1

With an electric field intensity of about $5 \times 10^4$ V/cm, the electric charge generated in the inside is considered to be the main cause of dark current. In Examples 1 to 12 and Comparative Examples 1 to 4, the photoelectric conversion efficiency (external quantum efficiency) brought out was tens of % and was mostly from 1.2 to 0.7 in terms of the relative value, revealing that the photoelectric conversion efficiency was equivalent.

As shown in the Table above, it is seen that in the devices of Examples, the dark current is very low in comparison to Comparative Examples with the same Ip.

Accordingly, as apparent from these Examples, a lower dark current value can be obtained by using the compound represented by formula (i) when the Ip is the same, and an equivalent dark current value can be realized even by a material with a smaller Ip. Furthermore, it is understood that a device with little increase in the dark current after heating, revealing high heat resistance, is obtained by using carbazoles of the present invention.

Incidentally, the mobility of Compound (2) and Compound (4) was determined by using a TOF method and found to be $1.4 \times 10^{-5}$ cm$^2$/Vs and $2.0 \times 10^{-4}$ cm$^2$/Vs, respectively, at an electric field intensity of $3 \times 10^5$ V/cm.

The entire disclosure of Japanese Patent Application No. 2009-134017 filed on Jun. 3, 2009, Japanese Patent Application No. 2010-017477 filed on Jan. 28, 2010 and Japanese Patent Application No. 2010-127391 filed on Jun. 3, 2010, from which the benefit of foreign priority has been claimed in the present application, is incorporated herein by reference, as if fully set forth.

What is claimed is:

1. A photoelectric conversion device comprising a transparent electrically conductive film, a photoelectric conversion film, and an electrically conductive film, wherein said photoelectric conversion film contains a compound represented by the following formula (i):

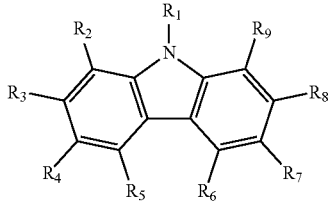

Formula (i)

wherein $R_1$ represents an alkyl group, an aryl group or a heterocyclic group, each of $R_2$ to $R_9$ independently represents a hydrogen atom or a substituent, provided that each of at least two out of $R_3$, $R_4$, $R_7$ and $R_8$ independently represents an aryl group, a heterocyclic group or —N(Ra)(Rb), each of Ra and Rb independently represents a hydrogen atom or a substituent, and at least either Ra or Rb represents an aryl group or a heterocyclic group, wherein in formula (i), each of $R_3$ and $R_8$ is independently a carbazolyl group substituted with an alkyl group having a carbon number of 1 to 12 and said alkyl group may be bonded through a heterocyclic group as the linking group.

2. The photoelectric conversion device as claimed in claim 1, wherein said photoelectric conversion film further contains a material having an electron affinity (Ea) of 4.0 eV or more and in said photoelectric conversion film, said compound represented by formula (i) is put into contact with said material having an electron affinity (Ea) of 4.0 eV or more.

3. The photoelectric conversion device as claimed in claim 1, wherein said compound represented by formula (i) does not contain a condensed ring structure composed of 5 or more rings.

4. The photoelectric conversion device as claimed in claim 1, wherein in formula (i), $R_1$ is an aryl group.

5. The photoelectric conversion device as claimed in claim 1, wherein in formula (i), each of at least two out of $R_3$, $R_4$, $R_7$ and $R_8$ is independently —N(Ra)(Rb), an azepinyl group or a carbazolyl group and at least either Ra or Rb is a fluorenyl group.

6. The photoelectric conversion device as claimed in claim 1, wherein in formula (i), each of at least two out of $R_3$, $R_4$, $R_7$ and $R_8$ is independently —N(Ra)(Rb) and at least either Ra or Rb is a fluorenyl group.

7. The photoelectric conversion device as claimed in claim 1, wherein in formula (i), each of $R_2$, $R_5$, $R_6$ and $R_9$ is a hydrogen atom.

8. The photoelectric conversion device as claimed in claim 1, wherein in formula (i), each of $R_4$ and $R_7$ is a hydrogen atom.

9. The photoelectric conversion device as claimed in claim 1, wherein the ionization potential (Ip) of said compound represented by formula (i) is less than 5.7 eV.

10. The photoelectric conversion device as claimed in claim 1, wherein the ionization potential (Ip) of said compound represented by formula (i) is 4.9 eV or more.

11. The photoelectric conversion device as claimed in claim 1, wherein the molecular weight of said compound represented by formula (i) is from 500 to 2,000.

12. The photoelectric conversion device as claimed in claim 1, wherein the mobility of said compound represented by formula (i) as measured by a Time of Flight (TOF) method is $1 \times 10^{-5}$ cm$^2$/Vs or more.

13. The photoelectric conversion device as claimed in claim 1, wherein said photoelectric conversion film contains a photoelectric conversion layer and an electron blocking layer and said electron blocking layer contains said compound represented by formula (i).

14. The photoelectric conversion device as claimed in claim 1, wherein said electrically conductive film, said photoelectric conversion film and said transparent electrically conductive film are stacked in this order.

15. An imaging device comprising the photoelectric conversion device claimed in claim 1.

16. The photoelectric conversion device as claimed in claim 2, wherein said material having an electron affinity (Ea) of 4.0 eV or more is a fullerene or a fullerene derivative.

* * * * *